United States Patent
Tomizawa et al.

(10) Patent No.: US 9,577,050 B2
(45) Date of Patent: Feb. 21, 2017

(54) SEMICONDUCTOR LAMINATE, SEMICONDUCTOR DEVICE, AND PRODUCTION METHOD THEREOF

(75) Inventors: Yuka Tomizawa, Hino (JP); Yoshinori Ikeda, Hino (JP); Tetsuya Imamura, Hino (JP)

(73) Assignee: TEIJIN LIMITED, Osaka (JP)

( * ) Notice: Subject to any disclaimer, the term of this patent is extended or adjusted under 35 U.S.C. 154(b) by 0 days.

(21) Appl. No.: 13/824,558

(22) PCT Filed: Dec. 9, 2011

(86) PCT No.: PCT/JP2011/078599
§ 371 (c)(1),
(2), (4) Date: May 10, 2013

(87) PCT Pub. No.: WO2012/077797
PCT Pub. Date: Jun. 14, 2012

(65) Prior Publication Data
US 2013/0228902 A1 Sep. 5, 2013

(30) Foreign Application Priority Data

| Dec. 10, 2010 | (JP) | 2010-275860 |
| Feb. 4, 2011 | (JP) | 2011-023252 |

(Continued)

(51) Int. Cl.
*H01L 21/44* (2006.01)
*H01L 29/36* (2006.01)
(Continued)

(52) U.S. Cl.
CPC ........... *H01L 29/36* (2013.01); *C01B 33/02* (2013.01); *H01L 21/0245* (2013.01);
(Continued)

(58) Field of Classification Search
CPC ............. H01L 25/042–25/047; H01L 27/1421; H01L 27/3227; H01L 31/02008; H01L 31/02021; H01L 31/02167–31/02168; H01L 31/0284; H01L 31/042; H01L 31/0516; H01L 31/0522; H01L 31/0527; H01L 31/0682–31/076
See application file for complete search history.

(56) References Cited

U.S. PATENT DOCUMENTS

| 5,608,232 A | 3/1997 | Yamazaki et al. |
| 5,609,694 A | 3/1997 | Asai |

(Continued)

FOREIGN PATENT DOCUMENTS

| CN | 1098554 A | 2/1995 |
| JP | 2-163935 A | 6/1990 |

(Continued)

OTHER PUBLICATIONS

Z. Yuan, et al., "Wettability and reactivity of molten silicon with various substrates", Appl. Phys. A, 2004, pp. 617-622, vol. 78.
(Continued)

*Primary Examiner* — Cuong B Nguyen
(74) *Attorney, Agent, or Firm* — Sughrue Mion, PLLC

(57) ABSTRACT

Provided is a method for manufacturing a semiconductor device. Also provided are: a semiconductor device which can be obtained by the method; and a dispersion that can be used in the method. A method for manufacturing a semiconductor device (500a) of the present invention comprises the steps (a)-(c) described below and is characterized in that the crystal orientation of a first dopant implanted layer (52) is the same as the crystal orientation of a semiconductor layer or a base (10) that is formed of a semiconductor element. (a) A dispersion which contains doped particles is applied to a specific part of a layer or a base. (b) An unsintered dopant implanted layer is obtained by drying the (Continued)

applied dispersion. (c) The specific part of the layer or the base is doped with a p-type or n-type dopant by irradiating the unsintered dopant implanted layer with light, and the unsintered dopant implanted layer is sintered, thereby obtaining a dopant implanted layer that is integrated with the layer or the base.

18 Claims, 58 Drawing Sheets

(30) Foreign Application Priority Data

| | | |
|---|---|---|
| May 2, 2011 | (JP) | 2011-103188 |
| May 27, 2011 | (JP) | 2011-119599 |
| Nov. 16, 2011 | (JP) | 2011-250773 |
| Nov. 16, 2011 | (JP) | 2011-251098 |
| Dec. 8, 2011 | (JP) | 2011-269017 |
| Dec. 8, 2011 | (JP) | 2011-269079 |

(51) Int. Cl.

| | |
|---|---|
| *C01B 33/02* | (2006.01) |
| *H01L 21/02* | (2006.01) |
| *H01L 21/225* | (2006.01) |
| *H01L 31/068* | (2012.01) |
| *H01L 29/04* | (2006.01) |
| *H01L 31/18* | (2006.01) |
| *H01L 29/66* | (2006.01) |

(52) U.S. Cl.
CPC .. *H01L 21/02532* (2013.01); *H01L 21/02573* (2013.01); *H01L 21/02576* (2013.01); *H01L 21/02579* (2013.01); *H01L 21/02601* (2013.01); *H01L 21/02628* (2013.01); *H01L 21/02686* (2013.01); *H01L 21/2254* (2013.01); *H01L 29/045* (2013.01); *H01L 29/66757* (2013.01); *H01L 29/66765* (2013.01); *H01L 31/068* (2013.01); *H01L 31/0682* (2013.01); *H01L 31/186* (2013.01); *Y02E 10/547* (2013.01); *Y02P 70/521* (2015.11)

(56) References Cited

U.S. PATENT DOCUMENTS

| | | | |
|---|---|---|---|
| 7,704,866 | B2 | 4/2010 | Vanheusden et al. |
| 2003/0034486 | A1 | 2/2003 | Korgel |
| 2003/0226820 | A1 | 12/2003 | Khang |
| 2005/0145163 | A1 | 7/2005 | Matsuki et al. |
| 2006/0211181 | A1 | 9/2006 | Chung |
| 2007/0178675 | A1 | 8/2007 | Straboni |
| 2007/0232036 | A1 | 10/2007 | Hashimoto et al. |
| 2008/0171425 | A1 | 7/2008 | Poplavskyy et al. |
| 2009/0263590 | A1 | 10/2009 | Kaino et al. |
| 2009/0269913 | A1* | 10/2009 | Terry et al. ............ 438/558 |
| 2009/0308440 | A1* | 12/2009 | Adibi et al. ............ 136/255 |
| 2010/0073452 | A1 | 3/2010 | Nakagawa |
| 2010/0216299 | A1 | 8/2010 | Poplavskyy et al. |
| 2011/0203632 | A1* | 8/2011 | Sen et al. ............ 136/244 |
| 2012/0024371 | A1 | 2/2012 | Funakoshi |

FOREIGN PATENT DOCUMENTS

| | | | |
|---|---|---|---|
| JP | 5-136048 | A | 6/1993 |
| JP | 7-135332 | A | 5/1995 |
| JP | 7-297429 | A | 11/1995 |
| JP | 2002-93706 | A | 3/2002 |
| JP | 2002-270511 | A | 9/2002 |
| JP | 2004-6487 | A | 1/2004 |
| JP | 2004-15052 | A | 1/2004 |
| JP | 2004-087546 | A | 3/2004 |
| JP | 2004-186320 | A | 7/2004 |
| JP | 2004-204094 | A | 7/2004 |
| JP | 2005-347725 | A | 12/2005 |
| JP | 2006-261681 | A | 9/2006 |
| JP | 2006-523021 | A | 10/2006 |
| JP | 2007-300073 | A | 11/2007 |
| JP | 2007-329351 | A | 12/2007 |
| JP | 2008-255143 | A | 10/2008 |
| JP | 2009-521805 | A | 6/2009 |
| JP | 2009-147192 | A | 7/2009 |
| JP | 2009-246025 | A | 10/2009 |
| JP | 2009-246250 | A | 10/2009 |
| JP | 2009-263143 | A | 11/2009 |
| JP | 2010-506001 | A | 2/2010 |
| JP | 2010513666 | | 4/2010 |
| JP | 2010-514585 | A | 5/2010 |
| JP | 2010-519731 | A | 6/2010 |
| JP | 2010-186900 | A | 8/2010 |
| JP | 2010-262979 | A | 11/2010 |
| JP | 2010-278370 | A | 12/2010 |
| JP | 2011-192908 | A | 9/2011 |
| WO | 2007/081510 | A2 | 7/2007 |
| WO | 2008/045327 | A2 | 4/2008 |
| WO | 2008/085806 | A1 | 7/2008 |
| WO | 2008085298 | A1 | 7/2008 |
| WO | 2008/103293 | A1 | 8/2008 |
| WO | 2008/137811 | A2 | 11/2008 |
| WO | 2009/122660 | A | 10/2009 |
| WO | 2010/050936 | A1 | 5/2010 |

OTHER PUBLICATIONS

M. T. Duffy, et al., "Development and Evaluation of Refractory CVD Coatings as Contact Materials for Molten Silicon", Journal of Crystal Growth, Sep. 1980, pp. 347-365, vol. 50, Issue 1.
Michel W. Barsoum, et al., "The Effect of Oxygen Partial Pressure on the Wetting of WiC, AlN, and Si3N4 by Si and a Method for Calculating the Surface Energies Involved", 1981, pp. 457-466.
Communication dated May 8, 2014, issued by the European Patent Office in corresponding Application No. 13187578.3.
Homer Antoniadis, "Silicon Ink High Efficiency Solar Cells"; Photovoltaic Specialists Conference (PVSC), 34th IEEE, No. 34, p. 650-654; Jun. 7, 2009.

* cited by examiner

Fig.9
(a)
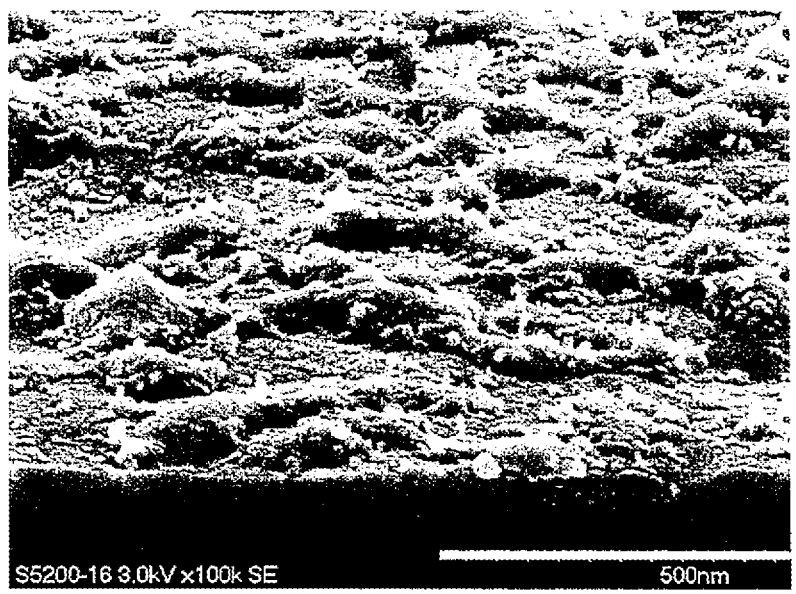
(b)
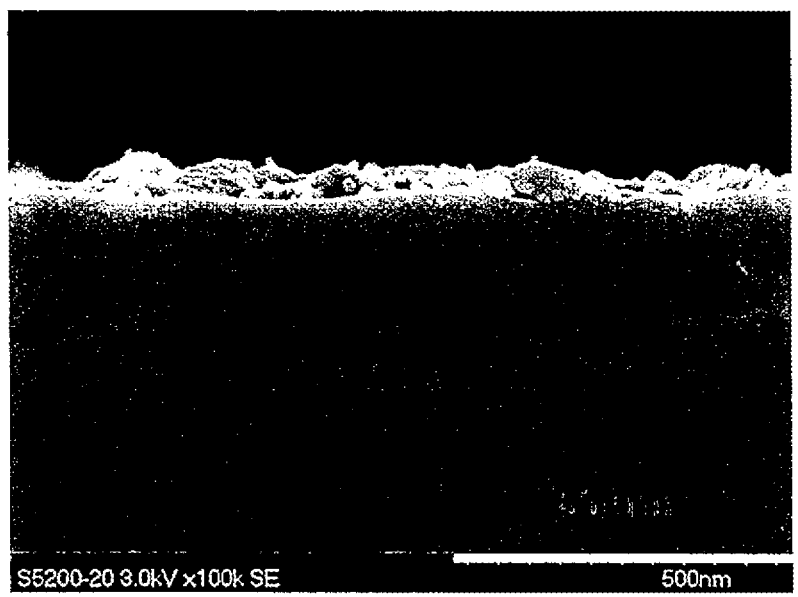

Fig.24
(a)
(b)
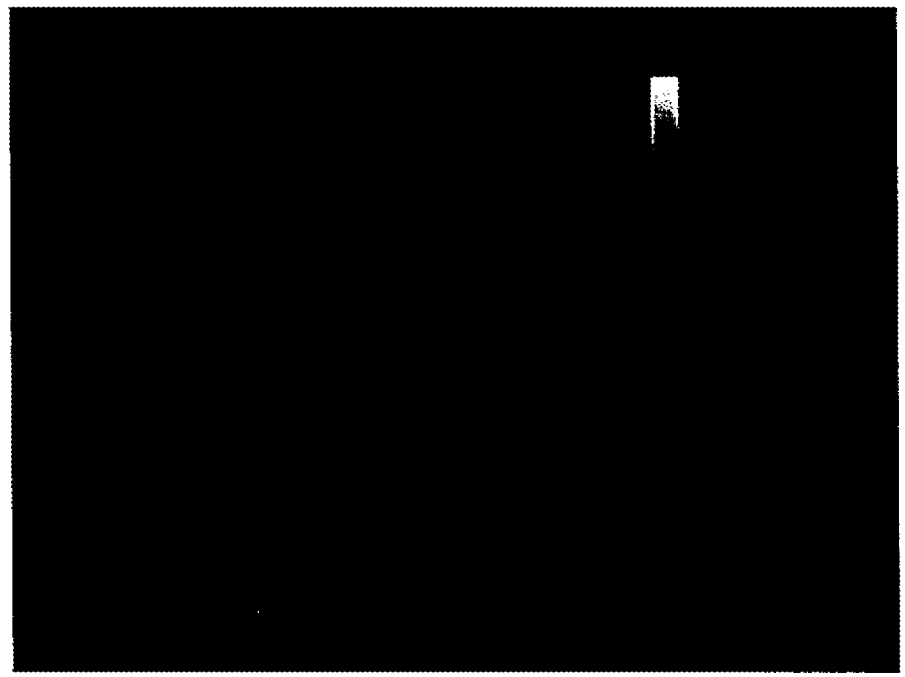

Fig.27
(a)
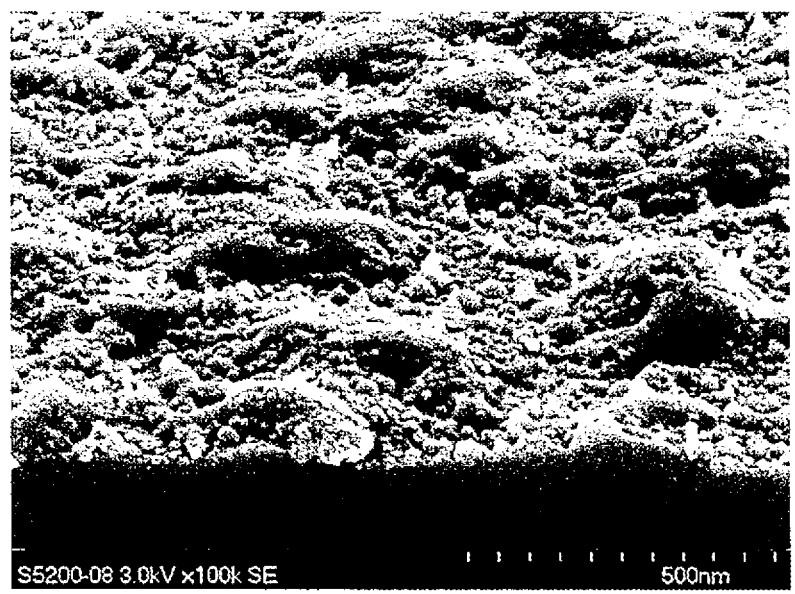
(b)
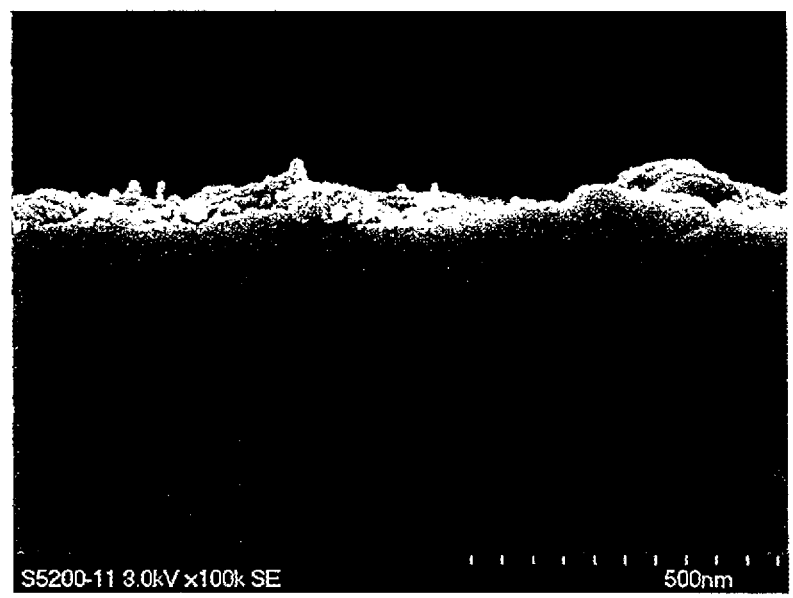

Fig.29
(a)
(b)
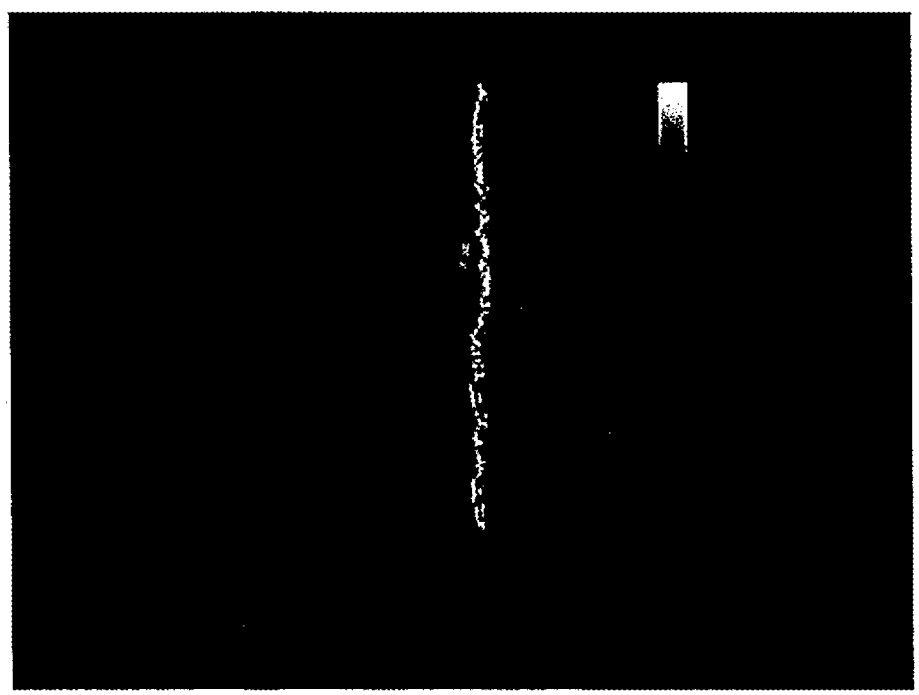

Fig.32
(a)
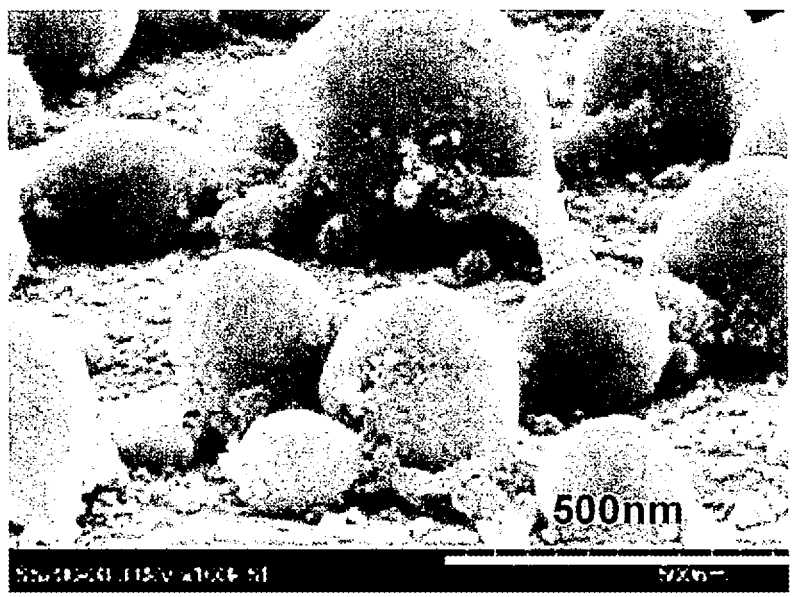
(b)
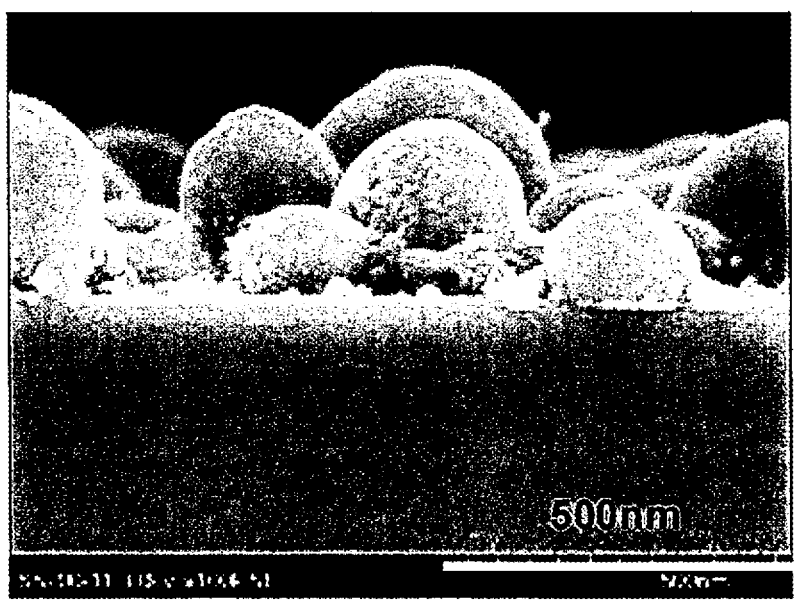

Fig.36
(a)
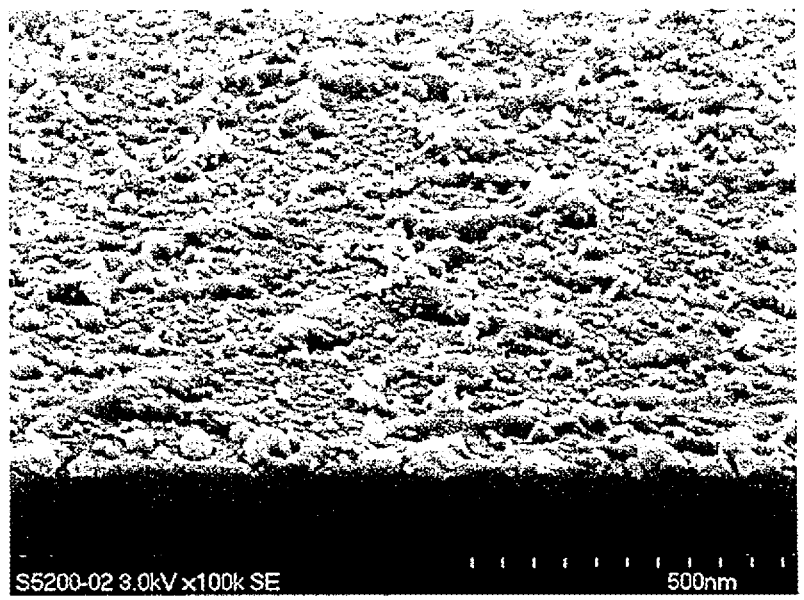
(b)
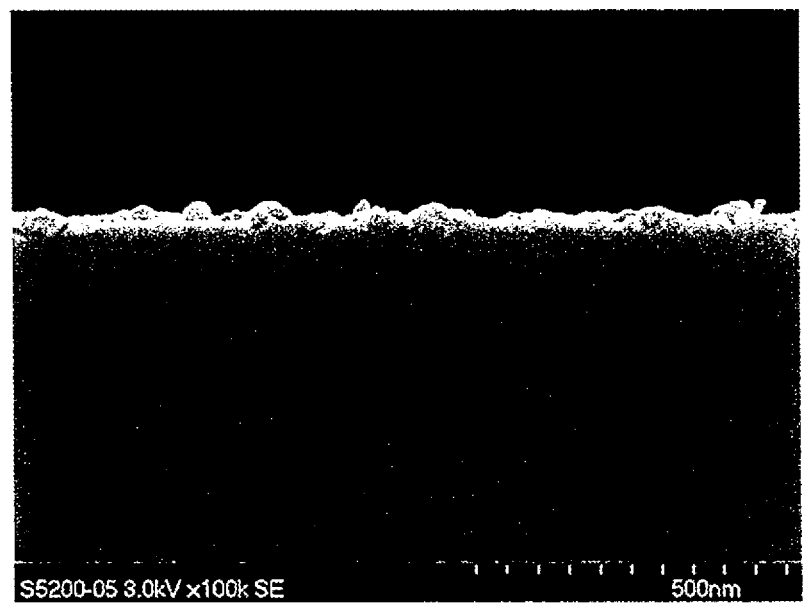

Fig.52
(a) 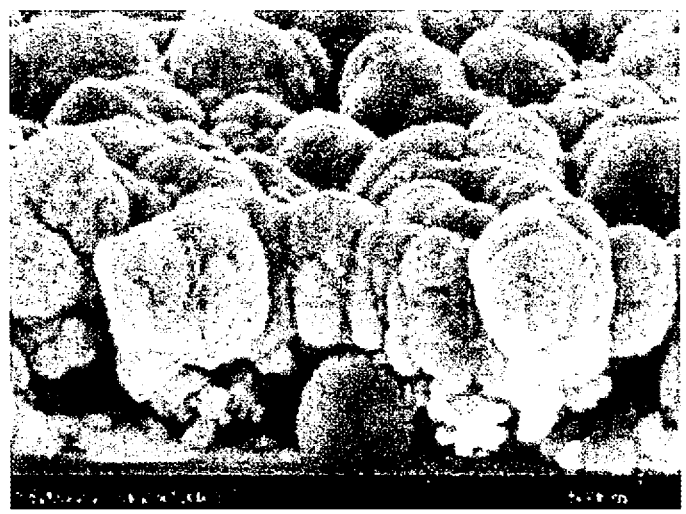
(b) 

Fig.55
(a)
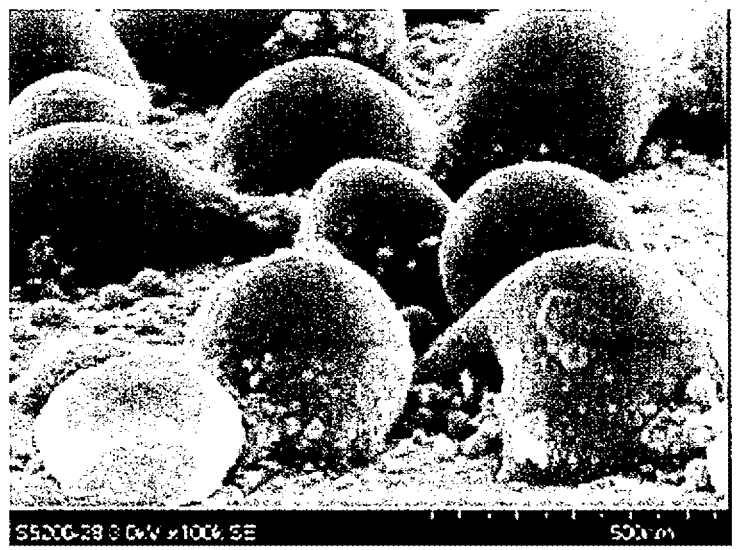
(b)
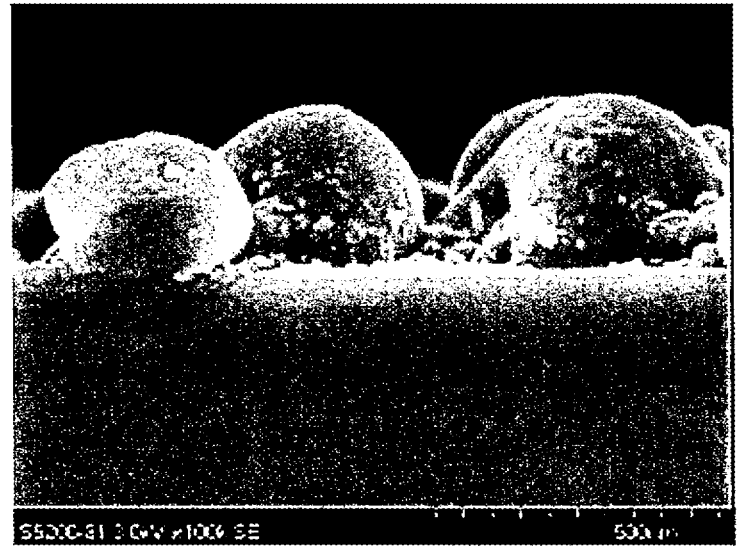

Fig.58
(a)
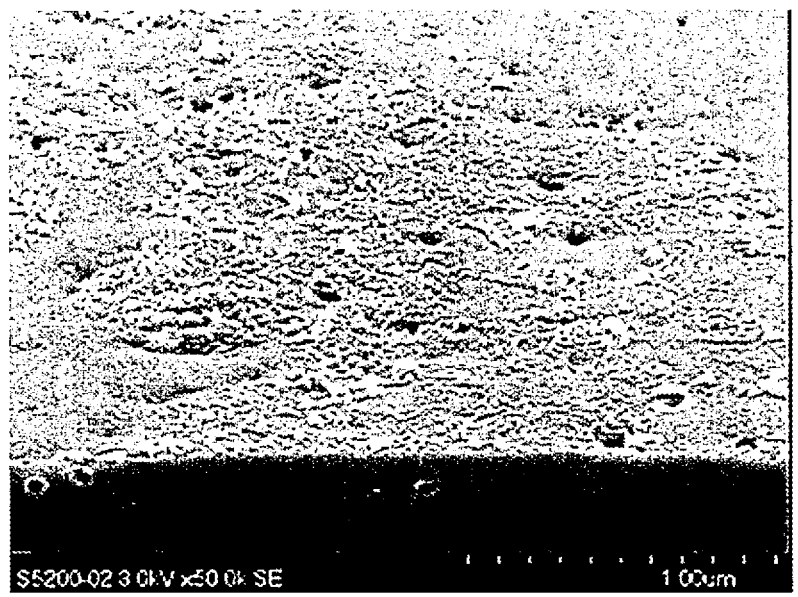
(b)
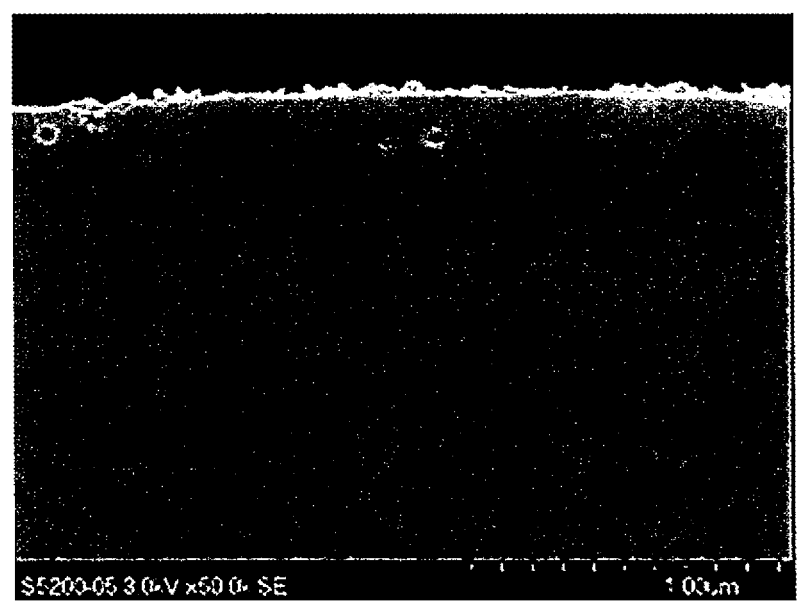

Fig.59
(a)
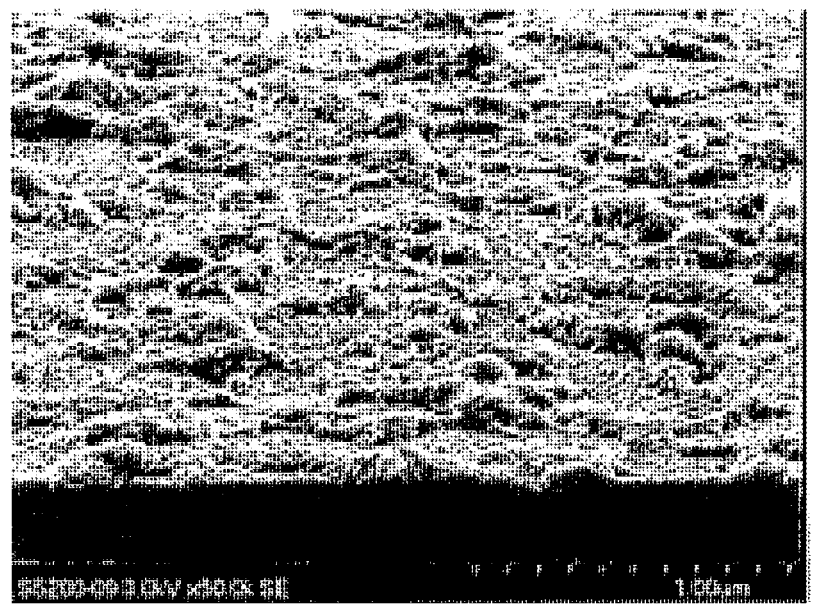
(b)
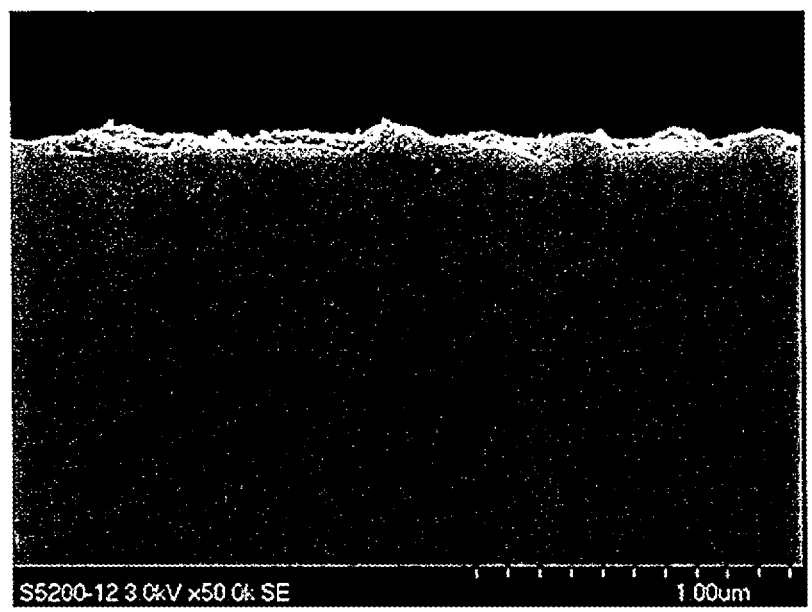

Fig.62
(a)
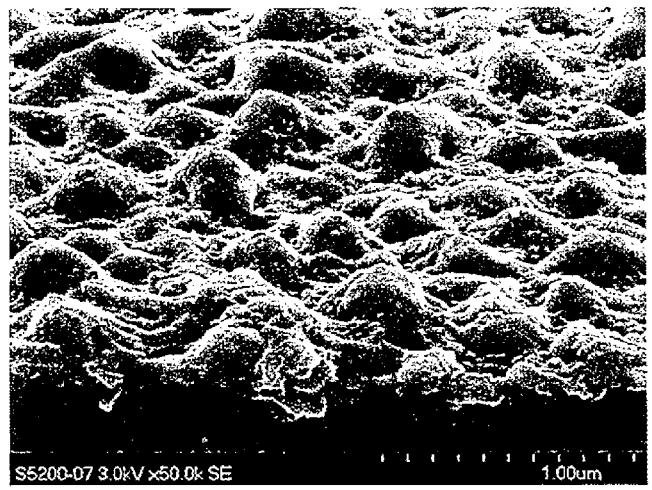
(b)
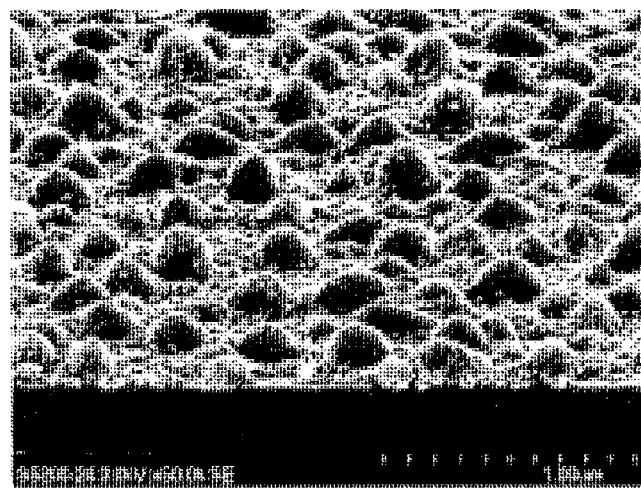
(c)
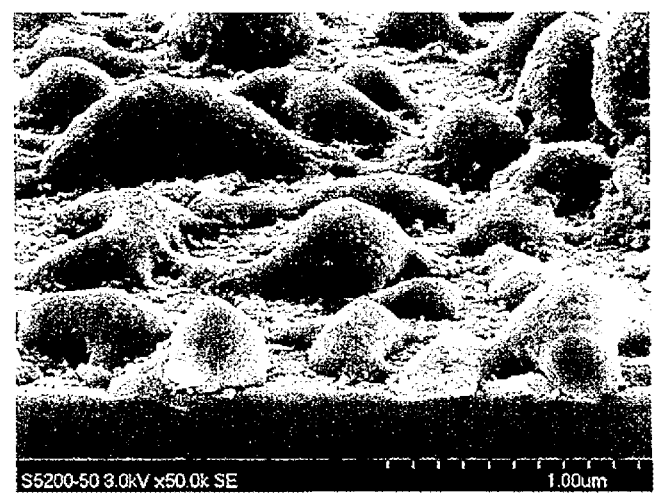

PRESENT INVENTION

PRIOR ART

SEMICONDUCTOR LAMINATE, SEMICONDUCTOR DEVICE, AND PRODUCTION METHOD THEREOF

CROSS REFERENCE TO RELATED APPLICATIONS

This application is a National Stage of International Application No. PCT/JP2011/078599 filed Dec. 9, 2011 (claiming priority based on Japanese Patent Application Nos. 2010-275860, filed Dec. 10, 2010, 2011-023252 filed Feb. 4, 2011, 2011-103188 filed May 2, 2011, 2011-119599 filed May 27, 2011, 2011-250773 filed Nov. 16, 2011, 2011-251098 filed Nov. 16, 2011, 2011-269079 filed Dec. 8, 2011 and 2011-269017 filed Dec. 8, 2011), the contents of which are incorporated herein by reference in their entirety.

TECHNICAL FIELD

The present invention relates to a semiconductor laminate, a semiconductor device and a production method thereof.

BACKGROUND ART

Background Art of First Present Invention

In the production of certain types of semiconductor devices, a dopant such as phosphorous or boron is injected into a selected region of a semiconductor layer or substrate to form a doped layer in the selected region.

In the production of certain types of solar cells in particular, a dopant is injected into a selected region of a semiconductor layer or substrate to form a doped layer in the selected region.

Examples of solar cells in which this type of doped layer is formed in a relatively narrow region include selective emitter-type solar cells and back contact-type solar cells. In addition, examples of solar cells in which this type of doped layer is formed in a relatively large region include solar cells having a Back Surface electric Field (BSF) layer and/or Front Surface electric Field (FSF) layer.

<Selective Emitter-Type Solar Cells Having a Back Surface Electric Field Layer>

An example of a selective emitter-type solar cell having a back surface electric field layer is indicated in Patent Document 1.

More specifically, as shown in FIG. 7, a selective emitter-type solar cell (500) having a back surface electric field layer has a semiconductor substrate (10) having an n-type semiconductor layer (12,12a) and p-type semiconductor layer (14,14a), light receiving side electrodes (22) and a protective layer (24) are arranged on a light receiving side surface of the semiconductor substrate (10), and back side electrodes (32) and a protective layer (34) are arranged on a back side surface of the semiconductor substrate (10).

In addition, this solar cell has a selective emitter layer (12a) obtained by selectively highly doping those locations of the n-type semiconductor layer (12,12a) that contact the electrodes (22), and a back surface electric field layer (14a) obtained by highly doping the back side of the p-type semiconductor layer (14,14a).

As a result of this solar cell having the selective emitter layer (12a), the benefits of having a high concentration of dopant at those locations that contact electrodes can be obtained while preventing problems occurring due to a high concentration of dopant on the light receiving side. In other words, the problem of increased reflection at the light receiving side surface caused by a highly concentrated dopant layer is provided, while the advantage of ohmic contact between the electrodes and semiconductor layer can be achieved.

In addition, as a result of this solar cell (500) having the back surface electric field layer (14a), carrier recombination loss caused by defects in the vicinity of the back side surface can be reduced.

The reconsolidation inhibitory effect produced by this type of back surface electric field layer is demonstrated in the manner described below.

Namely, in the case where positive holes and electrons are generated by absorption of light on the light receiving side of the p-type semiconductor layer (14,14a), the positive holes migrate to back side electrodes (32) of substantially equal potential; while the electrons reach a depletion layer between the n-type semiconductor layer and the p-type semiconductor layer, and then, due the potential difference in the depletion layer, flows to the n-type semiconductor layer side enabling the generation of electromotive force.

In contrast, in the case where positive holes and electrons are generated by absorption of light on the back side of the p-type semiconductor layer (14,14a), since electrons may not be reach the depletion layer, be trapped in defects in the vicinity of the back side surface, thereby resulting in reconsolidation with positive holes. However, even in the case where positive holes and electrons are generated on the back side, if the back surface electric field layer (14a) is present, electrons are repelled by an electric field (barrier) formed between the relatively lowly doped light receiving side (14) and the relatively highly doped back side (14a) of the p-type semiconductor layer (14,14a), thereby enabling the electrons to reach the depletion layer between the n-type semiconductor layer and the p-type semiconductor layer. This allows the generation of electromotive force as a result of electrons flowing to the n-type semiconductor layer side due to the potential difference in the depletion layer. In addition, migration of positive holes to the back side electrodes (32) is promoted by the electric field generated by the back surface electric field layer (14a).

Incidentally, in FIG. 7, light irradiated onto the solar cell (500) in order to generate electrical power is indicated with arrows 100. In addition, the dopant concentrations in the selective emitter layer (12a) and the back surface electric field layer (14a) are, for example, about $1\times10^{21}$ atoms/cm$^3$ to $2\times10^{21}$ atoms/cm$^3$.

<Back Contact-Type Solar Cell Having Front Surface Electric Field Layer>

Examples of a back contact-type solar cell having a front surface electric field layer are indicated in Patent Documents 2 and 3.

More specifically, as shown in FIG. 8, a back contact-type solar cell (600) having a front surface electric field layer has a semiconductor substrate (10) composed of an n-type (or p-type or intrinsic) semiconductor, a protective layer (24) is arranged on the light receiving front surface of the semiconductor substrate (10), and back side electrodes (22,32) and a protective layer (34) are arranged on a back side surface of the semiconductor substrate (10).

In addition, this solar cell has a back contact layer (12a,14a), obtained by selectively highly n-type or p-type doping those locations of the semiconductor substrate (10) composed of an n-type semiconductor that contact electrodes (32,34), and a front surface electric field layer (12b) obtained by highly n-type doping the light receiving side of the semiconductor substrate (10).

In this type of solar cell (600), an n-type back contact layer (12a), which is n-doped at a high concentration, and a p-type back contact layer (14a), which is p-doped at a high concentration, are alternately arranged on the back side. Other regions consist of intrinsic semiconductor regions, regions p-doped or n-doped at a low concentration, and regions where p-n junctions are formed. An electromotive force is generated as a result of these regions being irradiated with light. Electromotive force generated in this manner can be acquired from electrodes through the n-type back contact layer (12a) and the p-type back contact layer (14a).

In this type of solar cell (600), as a result of regions either p-doped or n-doped at a high concentration, electromotive force can be acquired while holding electromotive loss caused by contact resistance to a low level.

In addition, in this type of solar cell (600) having a front surface electric field layer, carrier reconsolidation loss caused by defects in the vicinity of the light receiving side surface can be reduced as a result of the highly n-doped layer (12b) on the light receiving side.

The reconsolidation inhibitory effect produced by this type of front surface electric field layer is demonstrated in the manner described below.

Namely, in the case where positive holes and electrons are generated by absorption of light near the electrodes (22,32) of the semiconductor substrate (10), at least one of the positive holes and electrons reach a depletion layer between highly p-doped locations (14a) and highly n-doped locations (12a), and positive holes flow to the highly p-doped locations (14a) and/or electrons flow to the highly n-doped locations (12a) due to the potential difference in the depletion layer. This enables the generation of electromotive force.

In contrast, in the case where positive holes and electrons are generated by absorption of light on the light receiving side of the semiconductor substrate (10), since positive holes and electrons are unable to reach the depletion layer, they are trapped in defects in the vicinity of the light receiving side surface, thereby resulting in their reconsolidation. However, even in the case where positive holes and electrons are generated on the light receiving side, if the front surface electric field layer (12b) is present, positive holes are repelled by an electric field (barrier) formed between the relatively lowly doped electrode side and the relatively highly doped front side (12b) of the semiconductor substrate (10) composed of an n-type semiconductor, thereby enabling the positive holes to reach the depletion layer between the highly p-doped locations (14a) and the highly n-doped locations (12a). This allows the generation of electromotive force as a result of positive holes flowing to the p-type semiconductor layer side due to the potential difference in the depletion layer.

Incidentally, in FIG. 8, light irradiated onto the solar cell (600) in order to generate electrical power is indicated with arrows 100.

In addition, in the production of certain types of transistors, a dopant is injected into a selected region of a semiconductor layer or substrate to form a doped layer in the selected region.

Examples of such transistors include field effect transistors (FET).

More specifically, as shown in FIG. 71, a field effect transistor (F700) has a substrate (F72), a semiconductor layer (F78), a gate insulating film (F73), a gate electrode (F74), a source electrode (F75) and a drain electrode (F76); and the semiconductor layer (F78) has an n-doped or p-doped doped region (F78b) at those locations where the source electrode and the drain electrode contact the semiconductor layer. In this type of field effect transistor, ohmic resistance between the semiconductor substrate and the electrodes is promoted by this doped region.

In order to form a doped layer in a selected region as described above, a method is known that consists of contacting a dopant source with a layer or substrate, and subjecting the dopant source with heat or laser irradiation to inject the dopant into the layer or substrate. Boron silicate glass or phosphate glass (Patent Document 3), liquid containing an inorganic dopant (Patent Document 4), or ink containing silicon and/or germanium nanoparticles (Patent Documents 5 and 6) are known to be used as the dopant source.

Background Art of Second Present Invention

Semiconductor silicon films, such as amorphous silicon films or polysilicon films, are used as semiconductor devices such as thin film transistors (TFT) or thin film solar cells.

In the case of using this type of semiconductor silicon film in a semiconductor device, the semiconductor silicon film is formed over the entire surface of a substrate by a vacuum process such as physical vapor deposition (PVD) such as sputtering, or chemical vapor deposition (CVD) such as plasma-enhanced chemical vapor deposition. In addition, in the case where it is necessary for the semiconductor silicon film to have a desired pattern such as a circuit pattern, a semiconductor silicon film having a desired pattern is provided by removing the unwanted portion of the semiconductor silicon film formed over the entire surface of a substrate by photolithography and the like.

However, these conventional methods have problems such as requiring large-scale equipment, consuming a large amount of energy, requiring considerable cooling time for each process since the process temperatures are high (higher than 250° C.), causing difficulties in handling, since the raw materials are in the form of gases, and generating a large amount of waste. These problems make the conventional methods both complex and expensive. In addition, in the case where the semiconductor silicon film is required to have a desired pattern in particular, there was the problem of poor utilization efficiency of raw materials (less than 5%), since the unwanted portion of the semiconductor silicon film formed over the entire surface of the substrate is removed.

The formation of semiconductor films by liquid phase methods have been examined in recent years in relation to the problems described above.

Regarding this, Patent Document 6 proposes the formation of a semiconductor silicon film using a dispersion containing silicon particles. Patent Document 6 proposes that a dried silicon particle film composed of silicon particles be irradiated with a laser to sinter the silicon particles.

In addition, studies on liquid phase methods have also focused on the use of direct writing technology for writing a desired pattern of a semiconductor silicon film directly on a substrate. Examples of direct writing technologies include printing methods such as inkjet printing or screen printing, which consist of coating and printing a raw material liquid containing constituent materials of a semiconductor silicon film.

Since these printing methods eliminate the need for a vacuum process and allow patterns to be formed by direct writing, they enable semiconductor devices to be produced both easily and inexpensively.

Background Art of Third Present Invention

As described in relation to the background art of the second present invention, liquid phase methods have been examined in recent years as methods used to form semiconductor films, and have been examined particularly for use as methods for forming semiconductor films for thin film transistors and the like at relatively low temperatures.

Liquid phase methods typically enable the entire process to be carried out at a relatively low temperature, such as a temperature equal to or lower than the glass transition temperature of a polymer material. This type of low-temperature process enables inexpensive, general-purpose polymer materials to be used as the substrates of semiconductor films. This leads to expectations of larger surface areas, greater flexibility, reduced weight and lower costs of semiconductor devices. In addition, this type of low-temperature process is also capable of shortening process time, since it does not require cooling for each step.

The use of organic semiconductor materials has been examined with respect to the production of semiconductor films using liquid phase methods in this manner.

However, organic semiconductor films have inadequate performance in terms of carrier mobility as well as inadequate durability in terms of stability in air in comparison with silicon semiconductor films. These problems place limitations on their applications, and make commercialization thereof difficult.

In addition, the use of inorganic compound semiconductor materials has also been examined with respect to the production of semiconductor films using liquid phase methods.

Regarding this, Patent Document 7, for example, discloses a method for depositing an $InGaZnO_4$ film using a nanoparticle dispersion. In Patent Document 7, an $InGaZnO_4$ film that has been dried at room temperature is pretreated with an ultraviolet (UV) ozone cleaner followed by irradiating with a KrF excimer laser (wavelength: 248 nm) to form a relatively uniform film of $InGaZnO_4$ crystals. In Patent Document 7, a thin film transistor having carrier mobility of 1.2 $cm^2/V \cdot s$ is fabricated by such a method.

However, since inorganic compound semiconductor materials such as $InGaZnO_4$ have problems with raw material availability, they are extremely expensive in comparison with silicon semiconductors, and are not practical for use as typical TFT materials.

In addition, with respect to the production of semiconductor films using a liquid phase method, the production of a semiconductor polysilicon film has been examined using an organic silicon compound solution such as a silicon solution containing a hydrogenated cyclic silane compound.

Regarding this, in Patent Documents 8 and 9, for example, an organic silicon compound solution is used that contains a high molecular weight, lowly volatile polysilane compound. This lowly volatile polysilane compound is obtained by using cyclopentasilane as a precursor.

However, there are cases in which organic silicon compound solutions require dehydrogenation annealing treatment (400° C. to 500° C.) to lower explosivity. This makes it difficult to lower the temperature of the overall process.

In addition, Patent Document 6 proposes the formation of a semiconductor silicon film using a dispersion containing silicon particles.

The use of direct writing technologies for writing a desired pattern of a semiconductor silicon film directly on a substrate has also been examined with respect to the use of liquid phase methods. Examples of direct writing technologies include printing methods such as inkjet printing or screen printing, which consist of coating and printing a raw material liquid containing constituent materials of a semiconductor silicon film.

Since these printing methods eliminate the need for a vacuum process and allow patterns to be formed by direct writing, they enable semiconductor devices to be produced both easily and inexpensively.

Incidentally, films having various forms have been proposed for use as silicon films. In Patent Document 10, for example, a method using a vapor phase method is proposed for producing a semiconductor silicon film in which columnar crystal grains are adjacent in the direction of the short axis.

Background Art of Fourth Invention

One or a plurality of silicon layers laminated on a substrate such as a silicon substrate is used in the production of semiconductor devices such as thin film transistors (TFT) or solar cells.

More specifically, in the production of a thin film transistor, an amorphous silicon layer is deposited on a substrate, and the amorphous silicon layer is crystallized with a laser and the like to form a polysilicon layer.

In this case, during crystallization of the amorphous silicon, the silicon crystals grow abnormally resulting in the formation of protrusions on the surface of the polysilicon layer. These surface protrusions are preferably removed; since they may cause interlayer shorting or interlayer leakage when an insulating layer is deposited thereon, and may also cause defective contact when an electrode is additionally formed thereon. Thus, acid etching or polishing and the like have been proposed in order to remove these protrusions and obtain a flat surface (Patent Documents 11 and 12).

In addition, with respect to the production of a semiconductor device having a doped layer in a selected region as in the case of a selective emitter-type or back contact-type of solar cell, a method has been developed for forming a silicon layer in which doped silicon particles have been sintered, namely for forming a dopant injection layer, by applying a silicon particle dispersion containing doped silicon particles to a substrate, drying the applied dispersion, and then heating (Patent Documents 5, 6 and 13).

Although this type of silicon layer also preferably has a flat surface as previously described, silicon layers obtained by sintering silicon particles typically have relatively large protrusions in the surface thereof.

Background Art of Fifth Present Invention

Liquid phase methods have recently been examined as methods for forming semiconductor films, as described regarding the background art of the second present invention. Liquid phase methods have been examined particularly for use as methods for forming semiconductor films for thin film transistors and the like at low cost and with a simple process.

Since liquid phase methods typically use a coatable semiconductor material, there is no need for conventionally required large-scale equipment, and since the raw material utilization efficiency can be enhanced by using an inkjet method and the like, costs can be lowered and the process can be simplified.

The use of organic semiconductor materials has been examined with respect to the production of semiconductor films by liquid phase methods in this manner. However, organic semiconductor films have inadequate performance in terms of carrier mobility as well as inadequate durability in terms of stability in air in comparison with silicon semiconductor films. These problems places limitations on their applications, and make commercialization thereof difficult.

In addition, with respect to the production of semiconductor films by liquid phase methods in this manner, Patent Document 6 proposes the formation of a semiconductor silicon film using a dispersion containing silicon particles.

Studies on liquid phase methods have also focused on the use of direct writing technology for writing a desired pattern of a semiconductor silicon film directly on a substrate. Examples of direct writing technologies include printing methods such as inkjet printing or screen printing, which consist of coating and printing a raw material liquid containing constituent materials of a semiconductor silicon film.

Since these printing methods eliminate the need for a vacuum process and allow patterns to be formed by direct writing, they enable semiconductor devices to be produced both easily and inexpensively.

Background Art of Sixth Present Invention

As described in relation to the background art of the second present invention, liquid phase methods have been examined in recent years as methods used to form semiconductor films, and have been examined particularly as methods for forming semiconductor films for thin film transistors and the like at relatively low temperatures.

Liquid phase methods typically enable the entire process to be carried out at a relatively low temperature, such as a temperature equal to or lower than the glass transition temperature of a polymer material. This type of low-temperature process enables inexpensive, general-purpose polymer materials to be used as the substrates of semiconductor films. This leads to expectations of larger surface areas, greater flexibility, reduced weight and lower costs of semiconductor devices. In addition, this type of low-temperature process is also capable of shortening process time, since it does not require cooling for each step.

The use of organic semiconductor materials has been examined with respect to the production of semiconductor films using these liquid phase methods.

However, organic semiconductor films have inadequate performance in terms of carrier mobility as well as inadequate durability in terms of stability in air in comparison with silicon semiconductor films. These problems place limitations on their applications, and makes commercialization thereof difficult.

In addition, the use of inorganic compound semiconductor materials has also been examined with respect to the production of semiconductor films using liquid phase methods.

Regarding this, Patent Document 7, for example, discloses a method for depositing an $InGaZnO_4$ film using a nanoparticle dispersion. In Patent Document 7, an $InGaZnO_4$ film that has been dried at room temperature is pretreated with an ultraviolet (UV) ozone cleaner followed by irradiating with a KrF excimer laser (wavelength: 248 nm) to form a relatively uniform film of $InGaZnO_4$ crystals. In Patent Document 7, a thin film transistor having carrier mobility of 1.2 $cm^2/V \cdot s$ is fabricated by such a method.

However, since inorganic compound semiconductor materials such as $InGaZnO_4$ have problems with raw material availability, they are extremely expensive in comparison with silicon semiconductors, and are not practical for use as typical TFT materials.

In addition, with respect to the production of semiconductor films using a liquid phase method, the production of a semiconductor polysilicon film has been examined using an organic silicon compound solution such as a silicon solution containing a hydrogenated cyclic silane compound.

Regarding this, in Patent Documents 8 and 9, for example, an organic silicon compound solution is used that contains a high molecular weight, lowly volatile polysilane compound. This lowly volatile polysilane compound is obtained by using cyclopentasilane as a precursor.

However, there are cases in which organic silicon compound solutions require dehydrogenation annealing treatment (400° C. to 500° C.) to lower vexplosivity. This makes it difficult to lower the temperature of the overall process.

In addition, Patent Document 6 proposes the formation of a semiconductor silicon film using a dispersion containing silicon particles.

The use of direct writing technologies for writing a desired pattern of a semiconductor silicon film directly on a substrate has also been examined with respect to the use of liquid phase methods. Examples of direct writing technologies include printing methods such as inkjet printing or screen printing, which consist of coating and printing a raw material liquid containing constituent materials of a semiconductor silicon film.

Since these printing methods eliminate the need for a vacuum process and allow patterns to be formed by direct writing, they enable semiconductor devices to be produced both easily and inexpensively.

Incidentally, in the production of certain types of semiconductor devices, a dopant such as phosphorous or boron is injected into a selected region of a semiconductor layer or substrate to form a doped layer in the selected region. In the production of certain types of solar cells and transistors in particular, a dopant is injected into a selected region of a semiconductor layer or substrate to form a diffused region or doped region in the selected region (Patent Documents 3 to 6).

PRIOR ART DOCUMENTS

Patent Documents

Patent Document 1: Japanese Unexamined Patent Publication No. 2010-186900
Patent Document 2: Japanese National Patent Publication No. 2009-521805
Patent Document 3: Japanese Unexamined Patent Publication No. 2010-262979
Patent Document 4: Japanese Unexamined Patent Publication No. H07-297429
Patent Document 5: Japanese National Patent Publication No. 2010-519731
Patent Document 6: Japanese National Patent Publication No. 2010-514585
Patent Document 7: Japanese Unexamined Patent Publication No. 2009-147192
Patent Document 8: Japanese Unexamined Patent Publication No. 2004-87546 (corresponding to Japanese Patent No. 4016419)
Patent Document 9: Japanese National Patent Publication No. 2010-506001
Patent Document 10: Japanese Unexamined Patent Publication No. 2002-270511
Patent Document 11: Japanese Unexamined Patent Publication No. H02-163935
Patent Document 12: Japanese Unexamined Patent Publication No. 2006-261681
Patent Document 13: U.S. Pat. No. 7,704,866

DISCLOSURE OF THE INVENTION

Problems to be Solved by the Invention

Object of First Present Invention

As previously described, various dopant sources are known to be used to form a doped layer (also referred to as a "diffused layer") in a selected region.

However, methods of the prior art had problems such as requiring a photolithography step in order to apply the dopant source to the selected region, requiring removing the dopant source after injection of dopant, and causing difficulty in adjusting the doped concentration in the direction of depth since the doped layer is formed by diffusion.

In contrast, the present invention provides a production method of a semiconductor device that solve the above problems. In addition, the present invention also provides a semiconductor device obtained by the method of the present invention, and a dispersion able to be used in the method of the present invention.

Object of Second Present Invention

Irradiating a dried silicon particle film composed of silicon particles to sinter the silicon particles has been proposed, as described in Patent Document 6. In this case, although sintering of the silicon particles can be achieved at a relatively low temperature, there was still room for improvement with respect to the properties of the resulting semiconductor film, depending on the application.

In addition, a dried silicon particle film composed of silicon particles is also known to be heated to sinter the silicon particles. However, in this case as well, there was room for improvement in terms of the properties of the resulting semiconductor film, depending on the application. In addition, in this case, there was the risk of deterioration of the performance of the substrate and other layers as a result of heating.

Thus, an object of the present invention is to provide a silicon semiconductor film having superior semiconductor properties composed of silicon particles, and particularly to provide a silicon semiconductor film having superior semiconductor properties composed of silicon particles without using heat treatment at a relatively high temperature.

Object of Third Present Invention

An object of the present invention is to provide a novel semiconductor silicon film, a semiconductor device having that semiconductor silicon film, and a production method thereof.

Object of Fourth Invention

As previously described, a silicon layer having a flat surface is required in the production of a semiconductor device.

Thus, the present invention provides a semiconductor laminate in which a silicon layer having a flat surface is formed on a substrate, and a production method of such a semiconductor laminate.

Object of Fifth Present Invention

An object of the present invention is to provide a method for producing a semiconductor silicon film both efficiently and at a relatively low temperature. More specifically, an object of the present invention is to provide a method for producing a semiconductor laminate having a highly continuous semiconductor silicon film without requiring large-scale and energy-consuming equipment.

In addition, an object of the present invention is to provide a semiconductor laminate having a highly continuous semiconductor silicon film, and a semiconductor device having such a semiconductor laminate.

Other objects of the present invention will be made clear from the description of the present application and the scope of claims for patent.

Object of Sixth Present Invention

An object of the present invention is to provide a method for producing a semiconductor silicon film efficiently and at a relatively low temperature. More specifically, an object of the present invention is to provide a method for producing a semiconductor laminate, that enables the formation of a semiconductor film on a substrate having relatively low heat resistance, such as a plastic substrate, without requiring large-scale and energy-consuming equipment.

In addition, an object of the present invention is to provide a semiconductor laminate, which have a substrate comprising a polymer material and a semiconductor silicon film laminated thereon.

Moreover, an object of the present invention is to provide a production method of a semiconductor laminate, that enables the formation of a diffused region in a selected region without using a photolithography step.

Other objects of the present invention will be made clear from the description of the present application and the scope of claims for patent.

Means for Solving the Problems

First Present Invention

As a result of conducting extensive studies, the inventors of the subject invention conceived the first present invention as indicated in (A1) to (A29) below.

<A1> A production method of a semiconductor device, having a semiconductor layer or substrate composed of a semiconductor element, and a first dopant injection layer on the semiconductor layer or substrate, wherein the method comprises the following steps (a) to (c); and wherein the crystal orientation of the first dopant injection layer is the same as the crystal orientation of the semiconductor layer or substrate; and/or the dopant concentration at a depth of 0.1 μm from the surface of the first dopant injection layer is $1 \times 10^{20}$ atoms/cm$^3$ or more, and the dopant concentration at a depth of 0.3 μm from the surface of the first dopant injection layer is 1/10 or less of the dopant concentration at a depth of 0.1 μm:

(a) applying a first dispersion containing first particles to a first location of the semiconductor layer or substrate, wherein the first particles are essentially composed of an element identical to the semiconductor layer or substrate and are doped with a p-type or n-type, dopant;

(b) drying the applied first dispersion to obtain a first green dopant injection layer; and (c) irradiating the first green dopant injection layer with light to dope the first location of the semiconductor layer or substrate with the p-type or n-type dopant, and at the same time, to sinter the first green dopant injection layer and thereby obtain a first dopant injection layer coalesced with the semiconductor layer or substrate.

<A2> The method according to <A1>, wherein the crystal orientation of the first dopant injection layer is the same as the crystal orientation of the semiconductor layer or substrate.

<A3> The method according to <A1>, wherein the dopant concentration at a depth of 0.1 μm from the surface of the first dopant injection layer is $1 \times 10^{20}$ atoms/cm$^3$ or more, and the dopant concentration at a depth of 0.3 μm from the surface of the first dopant injection layer is 1/10 or less of the dopant concentration at a depth of 0.1 μm.

<A4> The method according to any one of <A1> to <A3>,
wherein the method further comprises the following steps (a') to (c'); and
wherein the crystal orientation of a second dopant injection layer is the same as the crystal orientation of the semiconductor layer or substrate; and/or the dopant concentration at a depth of 0.1 μm from the surface of the second dopant injection layer is $1 \times 10^{20}$ atoms/cm$^3$ or more, and the dopant concentration at a depth of 0.3 μm from the surface of the second dopant injection layer is 1/10 or less of the dopant concentration at a depth of 0.1 μm:
(a') applying a second dispersion containing second particles to a second location of the semiconductor layer or substrate at the same time as step (a), between step (a) and step (b), or between step (b) and step (c), wherein the second particles are essentially composed of the same element as the semiconductor layer or substrate and are doped with a dopant of a type that differs from the dopant of the first particles;
(b') drying the applied second dispersion to obtain a second green dopant injection layer at the same time as step (b) or separately from step (b); and
(c') irradiating the second green dopant injection layer with light at the same time as step (c) or separately from step (c) to dope the second location of the semiconductor layer or substrate with a p-type or n-type dopant, and at the same time, to sinter the second green dopant layer and thereby obtain a second dopant injection layer coalesced with the semiconductor layer or substrate.

<A5> The method according to any one of <A1> to <A3>,
wherein the method further comprises the following steps (a") to (c") after step (c); and
wherein the crystal orientation of a second dopant injection layer is the same as the crystal orientation of the semiconductor layer or substrate; and/or the dopant concentration at a depth of 0.1 μm from the surface of the second dopant injection layer is $1 \times 10^{20}$ atoms/cm$^3$ or more, and the dopant concentration at a depth of 0.3 μm from the surface of the second dopant injection layer is 1/10 or less of the dopant concentration at a depth of 0.1 μm:
(a") applying a second dispersion containing second particles to a second location of the semiconductor layer or substrate, wherein the second particles are essentially composed of the same element as the semiconductor layer or substrate and are doped with a dopant of a type that differs from the dopant of the first particles;
(b") drying the applied second dispersion to obtain a second green dopant injection layer, and
(c") irradiating the second green dopant injection layer with light to dope the second location of the semiconductor layer or substrate with a p-type or n-type dopant, and at the same time, to sinter the second green dopant layer and thereby obtain a second dopant injection layer coalesced with the semiconductor layer or substrate.

<A6> The method according to any one of <A1> to <A5>, wherein the semiconductor element is silicon, germanium or a combination thereof.

<A7> The method according to any one of <A1> to <A6>, wherein applying the dispersion is carried out by printing or spin coating process.

<A8> The method according to any one of <A1> to <A7>, wherein the degree of crystallization of the particles is 40% or less.

<A9> The method according to any one of <A1> to <A8>, wherein the mean primary particle diameter of the particles is 30 nm or less.

<A10> The method according to any one of <A1> to <A9>, wherein the dopant is selected from the group consisting of B, Al, Ga, In, Ti, P, As, Sb or a combination thereof.

<A11> The method according to any one of <A1> to <A10>, wherein the particles contain $1 \times 10^{20}$ atoms/cm$^3$ or more of the dopant.

<A12> The method according to any one of <A1> to <A11>, further comprising forming an electrode on the dopant injection layer.

<A13> The method according to any one of <A1> to <A12>, wherein the semiconductor device is a solar cell.

<A14> The method according to <A13>, wherein the dopant injection layer is for forming a selective emitter layer of a selective emitter-type solar cell, or a back contact layer of a back contact-type solar cell.

<A15> The method according to <A13> or <A14>, wherein the dopant injection layer is for forming a front surface electric field layer or a back surface electric field layer.

<A16> The method according to any one of <A1> to <A15>, wherein the semiconductor device is a thin film transistor.

<A17> A semiconductor device,
wherein a first dopant injection layer formed by sintering first particles is arranged at a first location of a semiconductor layer or substrate composed of a semiconductor element;
wherein the first particles are essentially composed of the same element as the semiconductor layer or substrate and are doped with a p-type or n-type dopant;
wherein the first dopant injection layer is coalesced with the semiconductor layer or substrate; and
wherein the crystal orientation of the first injection layer is the same as the crystal orientation of the semiconductor layer of substrate; and/or the dopant concentration at a depth of 0.1 μm from the surface of the first dopant injection layer is $1 \times 10^{20}$ atoms/cm$^3$ or more, and the dopant concentration at a depth of 0.3 μm from the surface of the first dopant injection layer is 1/10 or less of the dopant concentration at a depth of 0.1 μm.

<A18> The semiconductor device according to <A17>, wherein the crystal orientation of the first dopant injection layer is the same as the crystal orientation of the semiconductor layer or substrate.

<A19> The semiconductor device according to <A17>, wherein the dopant concentration at a depth of 0.1 μm from the surface of the first dopant injection layer is $1 \times 10^{20}$ atoms/cm$^3$ or more, and the dopant concentration at a depth of 0.3 μm from the surface of the first dopant injection layer is 1/10 or less of the dopant concentration at a depth of 0.1 μm.

<A20> The semiconductor device according to any one of <A17> to <A19>,
wherein a second dopant injection layer formed by sintering second particles is arranged at a second location of the semiconductor layer or substrate;
wherein the second particles are essentially composed of the same element as the semiconductor layer or substrate and are doped with a dopant of a type that differs from the dopant of the first particles;
wherein the second dopant injection layer is coalesced with the semiconductor layer or substrate; and
wherein the crystal orientation of the second dopant injection layer is the same as the crystal orientation of the semiconductor layer or substrate; and/or the dopant concentration at a depth of 0.1 μm from the surface of the second dopant injection layer is $1×10^{20}$ atoms/cm$^3$ or more, and the dopant concentration at a depth of 0.3 μm from the surface of the second dopant injection layer is 1/10 or less of the dopant concentration at a depth of 0.1 μm.

<A21> The semiconductor device according to any one of <A17> to <A20>, wherein the semiconductor element is silicon, germanium or a combination thereof.

<A22> The semiconductor device according to any one of <A17> to <A21>, wherein an electrode is formed on the dopant injection layer.

<A23> The semiconductor device according to any one of <A17> to <A22>, which is a solar cell.

<A24> The semiconductor device according to <A23>, wherein the dopant injection layer is for forming a selective emitter layer of a selective emitter-type solar cell, or a back contact layer of the back contact-type solar cell.

<A25> The semiconductor device according to <A23> or <A24>, wherein the dopant injection layer is for forming a back surface electric field layer or front surface electric field layer.

<A26> The semiconductor device according to any one of <A17> to <A22>, which is a thin film transistor.

<A27> A dispersion containing particles, wherein the particles have a degree of crystallization of 40% or less, and are essentially composed of an n-doped or p-doped semiconductor element.

<A28> A dispersion containing particles, wherein the particles have a mean primary particle diameter of 30 nm or less, and are essentially composed of an n-doped or p-doped semiconductor element.

<A29> The dispersion according to <A27> or <A28>, wherein the semiconductor element is silicon, germanium or a combination thereof.

Second Present Invention

As a result of conducting extensive studies, the inventors of the subject invention conceived the second present invention as indicated in (B1) to (B15) below.

<B1> A green silicon particle film composed of silicon particles not mutually sintered, wherein the amount of desorbing gas that desorbs when heated at a pressure of 1 atmosphere and temperature of 600° C. in an inert gas atmosphere is 500 ppm by weight or less based on the weight of the green silicon particle film.

<B2> The green silicon particle film according to <B1>, wherein the desorbing gas is selected from the group consisting of a silane compound, organic solvent and combinations thereof.

<B3> The green silicon particle film according to <B1> or <B2>, having a thickness of 50 nm to 2000 nm.

<B4> The green silicon particle film according to any one of <B1> to <B3>, wherein the silicon particles are silicon particles obtained by laser pyrolysis.

<B5> A production method of a green silicon particle film,
wherein the method comprises the following steps:
(a) applying a silicon particle dispersion containing a dispersion medium and silicon particles dispersed therein onto a substrate to form a silicon particle dispersion film;
(b) drying the silicon particle dispersion film to form a dried silicon particle film; and
(c) firing the dried silicon particle film at a temperature of 300° C. to 900° C. to form a green silicon particle film.

<B6> The method according to <B5>, wherein the firing is carried out at a temperature of 500° C. or higher in step (c).

<B7> The method according to <B5> or <B6>, wherein the firing is carried out at a temperature of 800° C. or lower in step (c).

<B8> A semiconductor silicon film composed of mutually sintered silicon particles and substantially not containing carbon atoms.

<B9> The semiconductor silicon film according to <B8>, which has not been subjected to heat treatment at a temperature higher than 1,000° C.

<B10> A semiconductor device having the semiconductor silicon film according to <B8> or <B9> as a semiconductor film.

<B11> The semiconductor device according to <B10>, which is a solar cell.

<B12> A production method of a semiconductor silicon film,
wherein the method comprises the following steps:
obtaining a green silicon particle film by the method of any one of <B5> to <B7>; and
irradiating the green silicon particle film with light or applying heat thereto to sinter the silicon particles in the green silicon particle film and thereby form a semiconductor silicon film.

<B13> A production method of a semiconductor silicon film, comprising irradiating the green silicon particle film according to any one of <B1> to <B4> with light or applying heat thereto to sinter the silicon particles in the green silicon particle film.

<B14> The method according to <B12> or <B13>, wherein the sintering is carried out by a laser light irradiation.

<B15> The method according to any one of <B12> to <B14>, wherein the sintering is carried out in a non-oxidizing atmosphere.

Third Present Invention

As a result of conducting extensive studies, the inventors of the subject invention conceived the third present invention as indicated in (C1) to (C14) below.

<C1> A semiconductor silicon film in which a plurality of elongated silicon particles are adjacent in the direction of the short axis, wherein each of the elongated silicon particles is made of a plurality of sintered silicon particles.

<C2> The semiconductor silicon film according to <C1>, wherein at least a portion of the elongated silicon particles have a short axis diameter of 100 nm or more.

<C3> The semiconductor silicon film according to <C1> or <C2>, wherein at least a portion of the elongated silicon particles have an aspect ratio of greater than 1.2.

<C4> A semiconductor device having the semiconductor silicon film of any one of <C1> to <C3>.

<C5> The semiconductor device according to <C4>, which is a solar cell.

<C6> A production method of a semiconductor silicon film in which a plurality of elongated silicon particles are adjacent in the direction of the short axis, wherein the method comprises the following steps:

(a) applying a first silicon particle dispersion containing a first dispersion medium and first silicon particles dispersed therein on a substrate to form a first silicon particle dispersion film;

(b) drying the first silicon particle dispersion film to form a first green semiconductor silicon film;

(c) irradiating the first green semiconductor silicon film with light to sinter the first silicon particles in the first green semiconductor silicon film and thereby form a first semiconductor silicon film;

(d) applying a second silicon particle dispersion containing a second dispersion medium and second silicon particles dispersed therein on the first semiconductor silicon film to form a second silicon particle dispersion film;

(e) drying the second silicon particle dispersion film to form a second green semiconductor silicon film; and (f) irradiating the second green semiconductor silicon film with light to sinter the second silicon particles in the second green semiconductor silicon film; and wherein the variance of the first silicon particles is 5 nm$^2$ or more.

<C7> The method according to <C6>, wherein the mean primary particle diameter of the silicon particles is 100 nm or less.

<C8> The method according to <C6> or <C7>, wherein the silicon particles are obtained by laser pyrolysis.

<C9> The method according to any one of <C6> to <C8>, wherein the green semiconductor silicon film has a thickness of 50 nm to 2000 nm.

<C10> The method according to any one of <C6> to <C9>, wherein the light irradiation is a laser irradiation.

<C11> The method according to any one of <C6> to <C10>, wherein the light irradiation is conducted in a non-oxidizing atmosphere.

<C12> A semiconductor silicon film obtainable by the method of any one of <C6> to <C11>.

<C13> A production method of a semiconductor device, comprising fabricating a semiconductor silicon film by the method of any one of <C6> to <C11>.

<C14> A semiconductor device obtainable by the method of <C13>.

Forth Present Invention

As a result of conducting extensive studies, the inventors of the subject invention conceived the forth present invention as indicated in (D1) to (D15) below.

<D1> A semiconductor laminate, wherein the laminate has a substrate and a composite silicon film on the substrate, and the composite silicon film has a first silicon layer derived from amorphous silicon and a second silicon layer derived from silicon particles on the first silicon layer.

<D2> The semiconductor laminate according to <D1>, wherein the height of protrusions on the composite silicon film is 100 nm or less.

<D3> A semiconductor device having the semiconductor laminate according to <D1> or <D2>.

<D4> The semiconductor device according to <D3>, which is a solar cell.

<D5> The semiconductor device according to <D4>, wherein the composite silicon layer is for forming a selective emitter layer of a selective emitter-type solar cell, or a back contact layer of a back contact-type solar cell.

<D6> The semiconductor device according to <D4> or <D5>, wherein the composite silicon layer is for forming a back surface electric field layer or a front surface electric field layer.

<D7> The semiconductor device according to <D3>, which is a field effect transistor.

<D8> A production method of a semiconductor laminate, comprising the following steps:

(a) forming an amorphous silicon layer on a substrate;

(b) applying a silicon particle dispersion onto the amorphous silicon layer and drying the dispersion to form a green laminate in which a silicon particle layer is laminated on the amorphous silicon layer; and (c) irradiating the green laminate with light to form a composite silicon layer having a first silicon layer derived from amorphous silicon and a second silicon layer derived from silicon particles on the first silicon layer by.

<D9> The method according to <D8>, wherein the thickness of the amorphous silicon layer is 300 nm or less.

<D10> The method according to <D8> or <D9>, wherein the thickness of the silicon particle layer is 300 nm or less.

<D11> The method according to any one of <D8> to <D10>, wherein the mean primary particle diameter of the silicon particles is 100 nm or less.

<D12> The method according to any one of <D8> to <D11>, wherein the light irradiation is a laser irradiation.

<D13> A semiconductor laminate obtainable by the method of any one of <D8> to <D12>.

<D14> A production method of a semiconductor device, comprising fabricating a semiconductor laminate by the method of any one of <D8> to <D12>.

<D15> A semiconductor device obtainable by the method of <D14>.

Fifth Present Invention

As a result of conducting extensive studies, the inventors of the subject invention conceived the fifth present invention as indicated in (E1) to (E19) below.

<E1> A method for producing a semiconductor laminate having a substrate and a semiconductor silicon film laminated thereon, wherein the method comprises the following steps:

(a) applying a silicon particle dispersion containing a dispersion medium and silicon particles dispersed therein onto the surface of a substrate to form a silicon particle dispersion film;

(b) drying the silicon particle dispersion film to form a green silicon film; and (c) irradiating the green silicon film with light to sinter the silicon particles in the green silicon film and thereby form a semiconductor silicon film; and wherein the contact angle of molten silicon to the surface of the substrate is 70 degrees or less.

<E2> The method according to <E1>, wherein the surface of the substrate is provided by a material selected from the group consisting of carbides, nitrides, carbonitrides and combinations thereof.

<E3> The method according to <E2>, wherein the surface of the substrate is provided by a material selected from the group consisting of silicon carbide, silicon nitride, silicon carbonitride, graphite and combinations thereof.

<E4> The method according to any one of <E1> to <E3>, wherein the substrate has a substrate body and a surface layer, and the surface layer is made of a material having a contact angle with molten silicon of 70 degrees or less.

<E5> The method according to any one of <E1> to <E3>, wherein the entire substrate is made of the same material as that of the surface of the substrate.

<E6> The method according to any one of <E1> to <E5>, wherein the mean primary particle diameter of the silicon particles is 100 nm or less.

<E7> The method according to any one of <E1> to <E6>, wherein the silicon particles are silicon particles obtained by laser pyrolysis.

<E8> The method according to any one of <E1> to <E7>, wherein the light irradiation is conducted in a non-oxidizing atmosphere.

<E9> The method according to any one of <E1> to <E8>, wherein the light irradiation is a laser irradiation.

<E10> The method according to <E9>, wherein the wavelength of the laser is 600 nm or less.

<E11> The method according to any one of <E1> to <E10>, wherein the light irradiation is a pulsed light irradiation.

<E12> A production method of a semiconductor device, comprising fabricating a semiconductor laminate by the method of any one of <E1> to <E11>.

<E13> A semiconductor laminate obtainable by the method of any one of <E1> to <E11>.

<E14> A semiconductor device obtainable by the method of <E12>.

<E15> A semiconductor laminate having a substrate and a semiconductor silicon film laminated thereon,
wherein the semiconductor silicon film is made of a plurality of mutually sintered silicon particles, and
wherein the contact angle of molten silicon to the surface of the substrate is 70 degrees or less.

<E16> The semiconductor laminate according to <E15>, wherein the film thickness of the semiconductor silicon film is 50 nm to 500 nm.

<E17> A semiconductor device having the semiconductor laminate of <E15> or <E16>.

<E18> A method for producing a semiconductor laminate having a substrate and a semiconductor silicon film laminated thereon,
wherein the method comprises the following steps:
(a) applying a silicon particle dispersion containing a dispersion medium and silicon particles dispersed therein onto the surface of a substrate to form a silicon particle dispersion film;
(b) drying the silicon particle dispersion film to form a green silicon film; and
(c) irradiating the green silicon film with light to sinter the silicon particles in the green silicon film and thereby form a semiconductor silicon film; and
wherein the surface of the substrate is provided by a material selected from the group consisting of silicon carbide, silicon nitride, silicon carbonitride, graphite and combinations thereof.

<E19> A semiconductor laminate having a substrate and a semiconductor silicon film laminated thereon,
wherein the semiconductor silicon film is made of a plurality of mutually sintered silicon particles, and
wherein the surface of the substrate is provided by a material selected from the group consisting of silicon carbide, silicon nitride, silicon carbonitride, graphite and combinations thereof.

Sixth Present Invention

As a result of conducting extensive studies, the inventors of the subject invention conceived the sixth present invention as indicated in (F1) to (F26) below.

<F1> A production method of a semiconductor laminate having a substrate and a semiconductor silicon film laminated thereon,
wherein the method comprises the following steps:
(a) applying a silicon particle dispersion containing a dispersion medium and silicon particles dispersed therein onto a substrate to form a silicon particle dispersion film;
(b) drying the silicon particle dispersion film to form a green semiconductor silicon film; and
(c) irradiating the green semiconductor silicon film with light to sinter the silicon particles in the green semiconductor silicon film and thereby form a semiconductor silicon film.

<F2> The method according to <F1>, wherein the substrate has a polymer material.

<F3> The method according to <F1> or <F2>, wherein the glass transition temperature of the polymer material is 300° C. or lower.

<F4> The method according to any one of <F1> to <F3>, wherein the mean primary particle diameter of the silicon particles is 100 nm or less.

<F5> The method according to any one of <F1> to <F4>, wherein the method further comprises the following steps:
(a') applying a second silicon particle dispersion containing a second dispersion medium and second silicon particles dispersed therein onto the semiconductor silicon film obtained in step (c) to form a second silicon particle dispersion film;
(b') drying the second silicon particle dispersion film to form a second green semiconductor silicon film; and
(c') irradiating the second green semiconductor silicon film with light to sinter the second silicon particles in the second green semiconductor silicon film and thereby form a semiconductor silicon film.

<F6> The method according to any one of <F1> to <F5>, wherein the method further comprises the following steps:
(a") applying a third silicon particle dispersion containing a third dispersion medium and third silicon particles dispersed therein onto a selected region of the semiconductor silicon film obtained in step (c) or (c') to form a third silicon particle dispersion film, wherein the third silicon particles are doped with a p-type or n-type dopant; (b") drying the third silicon particle dispersion film to form a green dopant injection film; and
(c") irradiating the green dopant injection film with light to sinter the third silicon particles in the green dopant injection film and thereby form a dopant injection film, and to dope the selected region of the semiconductor silicon film with the p-type or n-type dopant.

<F7> The method according to any one of <F1> to <F6>, wherein the dopant is selected from the group consisting of B, Al, Ga, In, Ti, P, As, Sb and combinations thereof.

<F8> The method according to any one of <F1> to <F7>, wherein the particles contain the dopant at $1 \times 10^{20}$ atoms/cm$^3$ or more.

<F9> The method according to any one of <F1> to <F8>, further comprising forming an electrode on the dopant injection film.

<F10> The method according to any one of <F1> to <F9>, wherein the carrier mobility of the ultimately obtained semiconductor silicon film is 0.1 cm$^2$/V·s or more.

<F11> The method according to any one of <F1> to <F10>, wherein the on/off ratio of the ultimately obtained semiconductor silicon film is $10^2$ or more.

<F12> The method according to any one of <F1> to <F11>, wherein the silicon particles are silicon particles obtained by laser pyrolysis.

<F13> The method according to any one of <F1> to <F12>, wherein the green semiconductor silicon film has a thickness of 50 nm to 2000 nm.

<F14> The method according to any one of <F1> to <F13>, wherein the light irradiation is a pulsed light irradiation, and the irradiated energy of the pulsed light is 15 mJ/(cm²·shot) to 250 mJ/(cm²·shot).

<F15> The method according to any one of <F1> to <F14>, wherein the light irradiation is a pulsed light irradiation, and number of pulsed light irradiation times is 5 times to 100 times.

<F16> The method according to any one of <F1> to <F15>, wherein the light irradiation is a pulsed light irradiation, and the irradiation duration of the pulsed light is 200 nanoseconds/shot or less.

<F17> The method according to any one of <F1> to <F16>, wherein the light irradiation is a laser irradiation.

<F18> The method according to <F17>, wherein the wavelength of the laser is 600 nm or less.

<F19> The method according to any one of <F1> to <F18>, wherein the light irradiation is conducted in a non-oxidizing atmosphere.

<F20> A production method of a semiconductor device, comprising forming a semiconductor laminate by the method of any one of <F1> to <F19>.

<F21> A semiconductor laminate obtainable by the method of any one of <F1> to <F19>.

<F22> A semiconductor device obtainable by the method of <F20>.

<F23> A semiconductor laminate having a substrate and a semiconductor silicon film laminated thereon,
wherein the substrate has a polymer material;
wherein the semiconductor silicon film is made of a plurality of mutually sintered silicon particles; and
wherein the carrier mobility of the semiconductor silicon film is 1.0 cm²/V·s or more.

<F24> The semiconductor laminate according to <F23>, further having a dopant injection film made of a plurality of mutually sintered silicon particles on the semiconductor silicon film.

<F25> A semiconductor laminate having a substrate, a semiconductor silicon film laminated thereon, and a dopant injection film laminated on the semiconductor silicon film, wherein
the semiconductor silicon film is made of a plurality of mutually sintered silicon particles, and
the dopant injection film is made of a plurality of mutually sintered silicon particles.

<F26> A semiconductor device having the semiconductor laminate of any one of <F23> to <F25>.

Effect of the Invention

Effects of First Present Invention

In a semiconductor device obtained by the method of the present invention and the semiconductor device of the present invention, in the case where the crystal orientation of a dopant injection layer is the same as the crystal orientation of a semiconductor layer or substrate, entrapment of a carrier at the interface between the dopant injection layer and the semiconductor layer or substrate composed of a semiconductor element can be inhibited.

In addition, in a semiconductor device obtained by the method of the present invention and the semiconductor device of the present invention, in the case where the concentration of dopant at a depth of 0.1 μm from the surface of a first dopant injection layer is $1 \times 10^{20}$ atoms/cm³ or more, and the dopant concentration at a depth of 0.3 μm, and particularly a depth of 0.2 μm from the surface of the first dopant injection layer is 1/10 or less of the dopant concentration at a depth of 0.1 μm, namely in the case where the doped concentration gradient is high and thereby a high doped concentration is reached while reducing the thickness of the highly doped portion, light absorption by the high dopant concentration layer can be inhibited, and properties obtained when the high dopant concentration layer is used as a back surface electric field layer or front surface electric field layer can be improved.

In addition, the dispersion of the present invention can be preferably used as the method of the present invention.

Effects of Second Present Invention

According to the green silicon particle film of the present invention having a low content of desorbing gas, a semiconductor silicon film having favorable semiconductor properties can be provided by sintering the green silicon particle film with light irradiation or heating. In addition, in the case of having sintered this green silicon particle film by irradiating with light, a semiconductor silicon film having favorable semiconductor properties can be provided without using a relatively high temperature.

According to the semiconductor silicon film of the present invention having a low carbon content, favorable semiconductor properties can be provided.

According to the method of the present invention, the green silicon particle film and semiconductor silicon film of the present invention can be obtained.

Effects of Third Present Invention

According to the semiconductor silicon film of the present invention in which a plurality of elongated silicon particles are adjacent in the direction of the short axis, favorable carrier mobility can be achieved in a device in which a carrier is allowed to flow in the direction of thickness of the semiconductor silicon film. This is the result of few or substantially no grain boundaries being present in the direction of thickness of the semiconductor silicon film, namely in the direction of the long axis of the elongated silicon particles. In addition, according to the method of the present invention for producing a semiconductor silicon film, the semiconductor silicon film of the present invention can be obtained by a liquid phase method.

Effects of Fourth Invention

The semiconductor laminate of the present invention can have a composite silicon layer having a flat surface, thereby allowing the obtaining of a semiconductor device having favorable properties when depositing an insulating layer or electrode and the like thereon. In addition, in the method of the present invention for producing a semiconductor laminate, a composite silicon layer on a substrate can have a flat surface, even without additionally removing surface irregularities.

Effects of Fifth Present Invention

According to the method of the present invention for producing a semiconductor laminate, a semiconductor silicon film can be produced efficiently at a relatively low temperature. More specifically, according to the method of the present invention, a semiconductor laminate having a highly continuous semiconductor silicon film can be produced without requiring large-scale or energy-consuming equipment.

In addition, the semiconductor laminate of the present invention has a highly continuous semiconductor silicon film, and as a result thereof, can provide preferable semiconductor properties.

Effects of Sixth Present Invention

According to the method of the present invention for producing a semiconductor laminate, a semiconductor laminate having desired semiconductor properties can be formed by a simple method. More specifically, according to the method of the present invention, a semiconductor laminate having favorable semiconductor properties can be produced at a lower temperature in comparison with process temperatures used in the prior art.

In addition, the semiconductor laminate of the present invention can be used for semiconductor device that is preferable in terms of semiconductor properties, cost, flexibility and/or light weight.

BRIEF DESCRIPTION OF THE DRAWINGS

FIG. 9 is an FE-SEM (field emission scanning electron microscope) micrograph of a laminate of Example A1, wherein (a) is an overhead perspective view and (b) is a lateral cross-sectional view.

FIG. 24 indicates an SCM (scanning capacitance microscope) micrograph (a) and a composite SCM and AFM (atomic force microscope) micrograph of a laminate of Example A1.

FIG. 27 is an FE-SEM (field emission scanning electron microscope) micrograph of a laminate of Example A2, wherein (a) is an overhead perspective view and (b) is a lateral cross-sectional view.

FIG. 29 indicates an SCM (scanning capacitance microscope) micrograph (a) and a composite SCM and AFM (atomic force microscope) micrograph of a laminate of Example A2.

FIG. 32 is an FE-SEM (field emission scanning electron microscope) micrograph of a laminate of Comparative Example A1, wherein (a) is an overhead perspective view and (b) is a lateral cross-sectional view.

FIG. 36 is an FE-SEM (field emission scanning electron microscope) micrograph of a laminate of Example A3, wherein (a) is an overhead perspective view and (b) is a lateral cross-sectional view.

FIG. 52 is an FE-SEM (field emission scanning electron microscope) micrograph of a semiconductor silicon film of Example C1, wherein FIG. 52(a) is an overhead perspective view of a lateral cross-section, and FIG. 52(b) is a side view of a lateral cross-section.

FIG. 55 is an FE-SEM (field emission scanning electron microscope) micrograph of a semiconductor silicon film of Reference Example C1, wherein FIG. 55(a) is an overhead perspective view of a lateral cross-section, and FIG. 55(b) is a side view of a lateral cross-section.

FIG. 56 is an FE-SEM (field emission scanning electron microscope) micrograph of a semiconductor silicon film of Reference Example C2, wherein FIG. 56 is a side view of a lateral cross-section.

FIG. 58 is an FE-SEM (field emission scanning electron microscope) micrograph of a semiconductor laminate of Example D1, wherein (a) is an overhead perspective view, and (b) is a lateral cross-sectional view.

FIG. 59 is an FE-SEM (field emission scanning electron microscope) micrograph of a semiconductor laminate of Comparative Example D1, wherein (a) is an overhead perspective view, and (b) is a lateral cross-sectional view.

FIG. 62 indicates scanning electron microscope (SEM) micrographs of a semiconductor silicon film produced in (a) Example E1, (b) Example E2 and (c) Comparative Example E1.

MODE FOR CARRYING OUT THE INVENTION

Definitions

<<Variance>>

Figure 1:
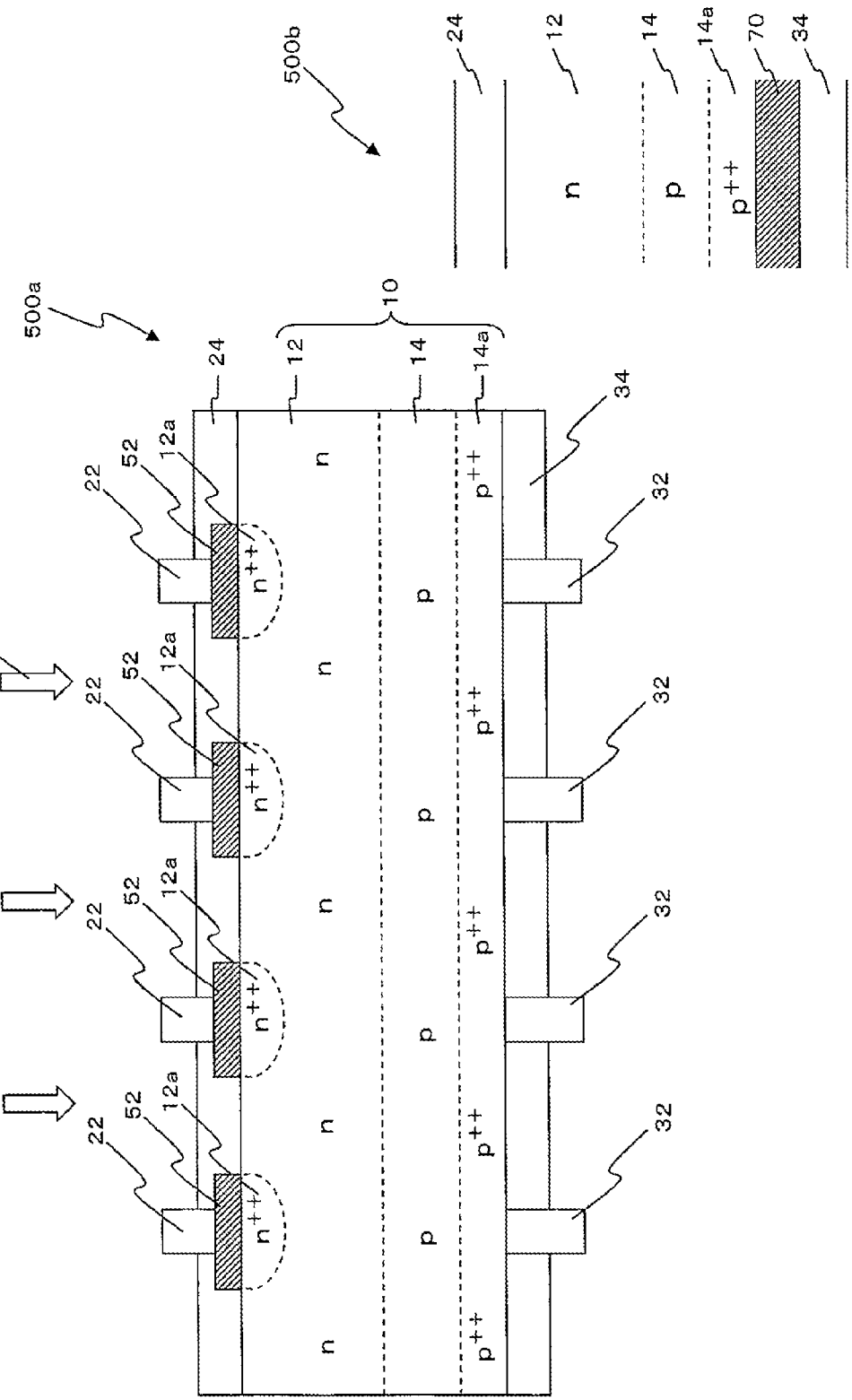
FIG. 1 is a drawing for explaining a selective emitter-type solar cell of the present invention.

In relation to the present invention, the variance ($\sigma^2$) of particles such as silicon particles is a value determined according to the following equation when the diameters of individual particles are taken to be $x_1, x_2, x_3, \ldots, x_n$.

$$\bar{x} = \frac{1}{n}\sum_{i=1}^{n} x_i$$

$$\sigma^2 = \frac{1}{n}\sum_{i=1}^{n}(x_i - \bar{x})^2$$

[Equation 1]

<<Mean Primary Particle Diameter>>

In relation to the present invention, the mean primary particle diameter of particles can be determined by measuring particles directly based on images captured by observing with a scanning electron microscope (SEM) or transmission electron microscope (TEM) and the like, analyzing groups of particles composed of 100 particles or more, and determining the number average primary particle diameter.

Incidentally, in the examples, the mean primary particle diameter of silicon particles was determined by observing with a TEM, analyzing images at a magnification factor of 100,000 times, and calculating the mean primary particle diameter and/or variance of a silicon particle dispersion based on 500 particles or more.

First Present Invention

<<Semiconductor Device Production Method>>

The method of the present invention produces a semiconductor device having a semiconductor layer or substrate composed of a semiconductor element, and a first dopant injection layer on the semiconductor layer or substrate. The method of the present invention comprises the following steps (a) to (c):

(a) applying a first dispersion containing first particles to a first location of the semiconductor layer or substrate, wherein the first particles are essentially composed of an element identical to the semiconductor layer or substrate and are doped with a p-type or n-type dopant;

(b) drying the applied first dispersion to obtain a first green dopant injection layer; and (c) irradiating the first green dopant injection layer with light to dope the first location of the semiconductor layer or substrate with a p-type or n-type dopant, and at the same time, to sinter the first green dopant injection layer and thereby obtain a first dopant injection layer coalesced with the semiconductor layer or substrate.

In this method of the present invention, in a first aspect thereof, the crystal orientation of the first dopant injection layer is the same as the crystal orientation of the semiconductor layer or substrate. In this case, carrier entrapment at the interface between the dopant injection layer and the semiconductor layer or substrate can be inhibited.

Thus, according to the case of further forming an electrode on the dopant injection layer in particular, the migration of carrier that reaches the electrode from the semiconductor layer or substrate via the dopant injection layer can be promoted. Accordingly, in the case where the semiconductor device of the present invention is a solar cell, electrical power generation efficiency can be improved. Further, while in the case where the semiconductor device of the present invention is a thin film transistor, on/off ratio and other semiconductor properties can be improved.

According to this method of the present invention, in another aspect thereof, the dopant concentration at a depth of 0.1 μm from the surface of the first dopant injection layer is $1 \times 10^{20}$ atoms/cm$^3$ or more, particularly $5 \times 10^{20}$ atoms/cm$^3$ or more, and even more particularly $1 \times 10^{21}$ atoms/cm$^3$ or more; and the dopant concentration at a depth of 0.3 μm, and particularly 0.2 μm, from the surface of the first dopant injection layer is 1/10 or less, particularly 1/100 or less, and even more particularly 1/1000 or less of the dopant concentration at a depth of 0.1 μm.

In the case where the doped concentration gradient is high, and thereby the thickness of a highly doped portion is reduced while a high doped concentration is achieved in this manner, light absorption by a high dopant concentration layer can be inhibited, and properties as a back surface electric field layer or front surface electric field layer can be improved.

Thus, particularly in the case where the semiconductor device of the present invention is back contact-type solar cell, and a surface electrode layer is formed by forming a dopant injection layer over an entire light receiving side surface, electrical power generation efficiency can be improved.

More specifically, as shown in FIG. 1, a selective emitter-type solar cell (500*a*) obtained with the method of the present invention, for example, has a semiconductor substrate (10) having an n-type semiconductor layer (12,12*a*) and a p-type semiconductor layer (14,14*a*). In the solar cell (500*a*), light receiving side electrodes (22) and a protective layer (24) are arranged on the light receiving side surface of the semiconductor substrate (10), and back side electrodes (32) and a protective layer (34) are arranged on the back side surface of the semiconductor substrate (10).

In this solar cell (500*a*), the dopant concentration at locations where the n-type semiconductor layer (12,12*a*) contacts the electrodes (22) is enhanced by an n-type dopant derived from a dopant injection layer (52) to obtain a selective emitter layer (12*a*).

Incidentally, in relation to the present invention, the semiconductor substrate (10) may be semiconductor silicon film, and particularly a semiconductor silicon film formed by mutually sintering a plurality of silicon particles. In addition, the dopant injection layer (52) may be removed after having injected dopant into the n-type semiconductor layer (12*a*).

In addition, this solar cell (500*a*) has a back surface electric field layer (14*a*) obtained by highly doping the back side of the p-type semiconductor layer (14,14*a*). Incidentally, as indicated by reference symbol 500*b* depicting a partial view of FIG. 1, the back surface electric field layer (14*a*) of this solar cell can also be formed by enhancing dopant concentration with a p-type dopant derived from a dopant injection layer (70) obtained with the method of the present invention.

Figure 2:
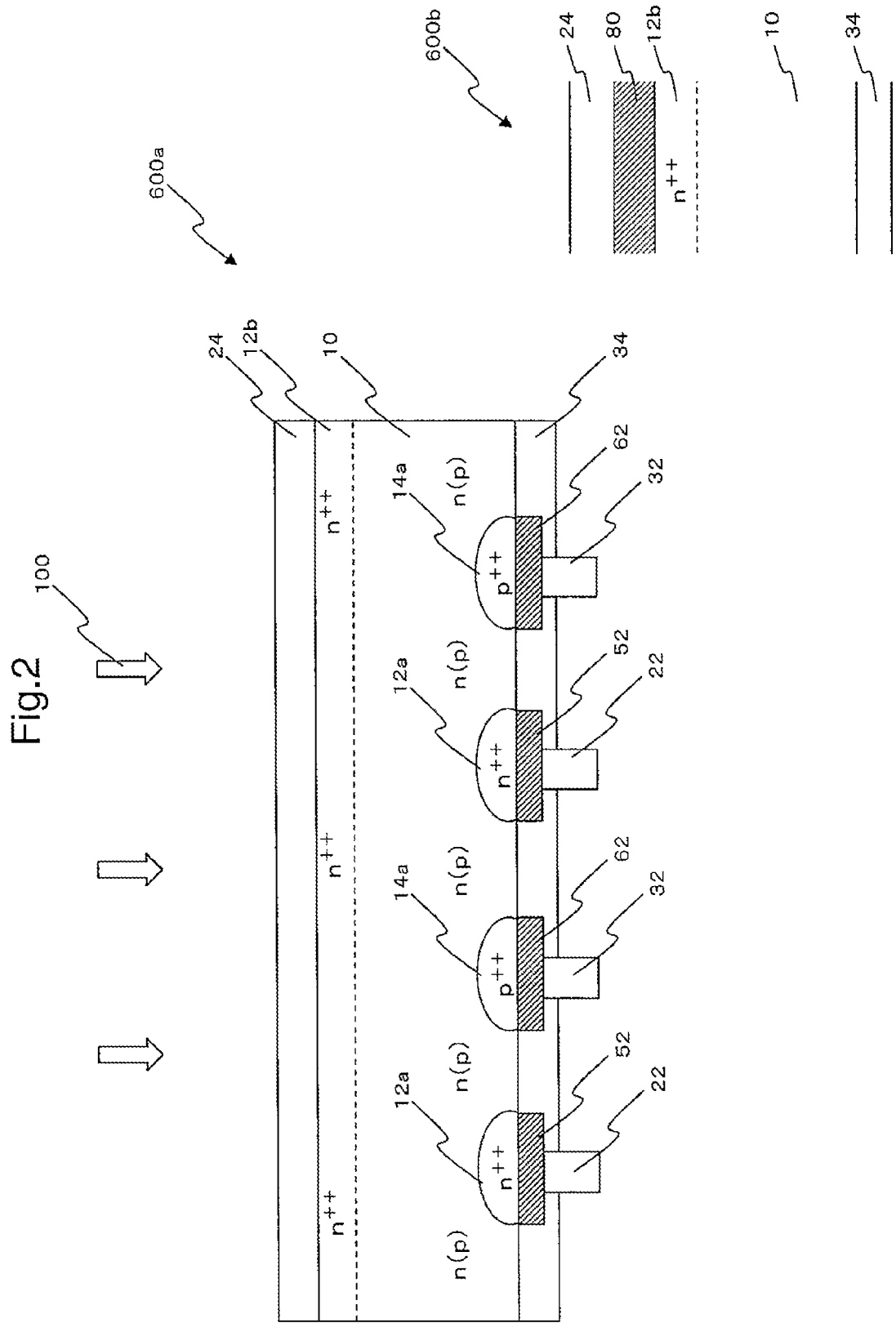
FIG. 2 is a drawing for explaining a back contact-type solar cell of the present invention.

In addition, as shown in FIG. 2, a back contact-type solar cell (600*a*) obtained with the method of the present invention, for example, has the semiconductor layer (10) composed of an n-type (or p-type) semiconductor. In the solar cell (600*a*), the protective layer (24) is arranged on the light receiving side surface of the semiconductor substrate (10), and the back side electrodes (22,32) and the protective layer (34) are arranged on the back side surface of the semiconductor substrate (10).

In this solar cell (600*a*), the dopant concentration at those locations of the semiconductor substrate (10) composed of an n-type semiconductor that contact the electrodes (32,34) is enhanced with n-type and p-type dopant derived from the dopant injection layers (52,62) to obtain a back contact layer (12*a*,14*a*).

Incidentally, in relation to the present invention, the semiconductor substrate (10) may be a semiconductor silicon film, and particularly a semiconductor silicon film formed by mutually sintering a plurality of silicon particles. In addition, the dopant injection layer (52,62) may also be removed after having injected dopant into the back contact layer (12*a*,14*a*).

In addition, this solar cell (600*a*) has a surface electric field layer (12*b*) obtained by highly n-type doping the light receiving side of the semiconductor substrate (10). Incidentally, as indicated by reference symbol 600*b* depicting a partial view of FIG. 2, the front surface electric field layer (12*b*) of this solar cell (600*a*) can also be formed by enhancing dopant concentration with an n-type dopant derived from a dopant injection layer (80) obtained with the method of the present invention.

According to the method of the present invention, in the case of fabricating the selective emitter-type solar cell (500*a*), the selective emitter-type solar cell (500*a*) can be fabricated as indicated in, for example, FIGS. 3 to 6.

Figure 3:
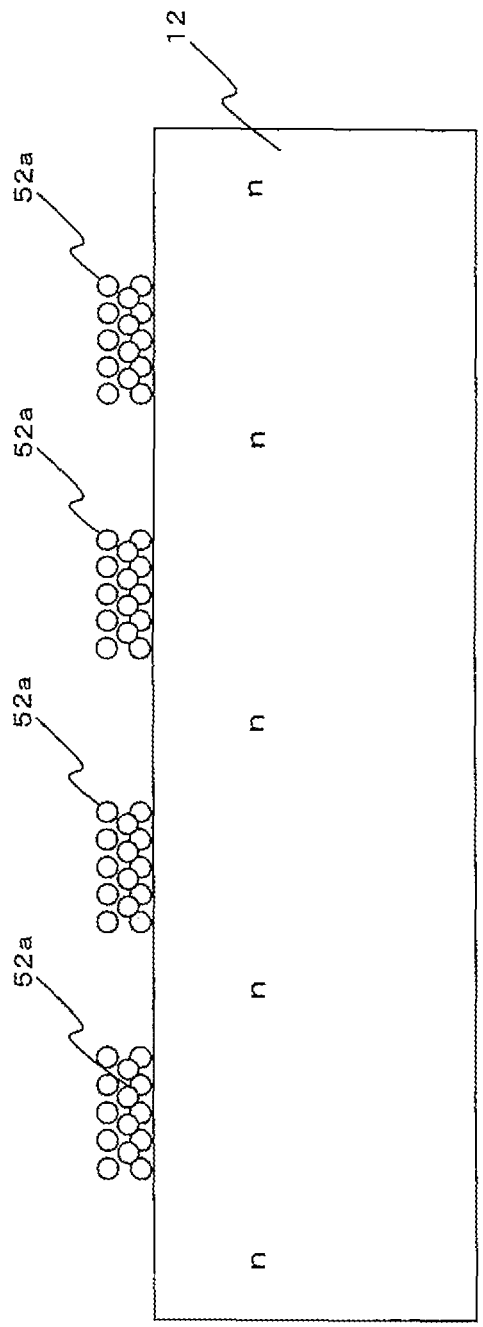
FIG. 3 is a drawing for explaining the method of the present invention for producing a selective emitter-type solar cell.
Figure 4:
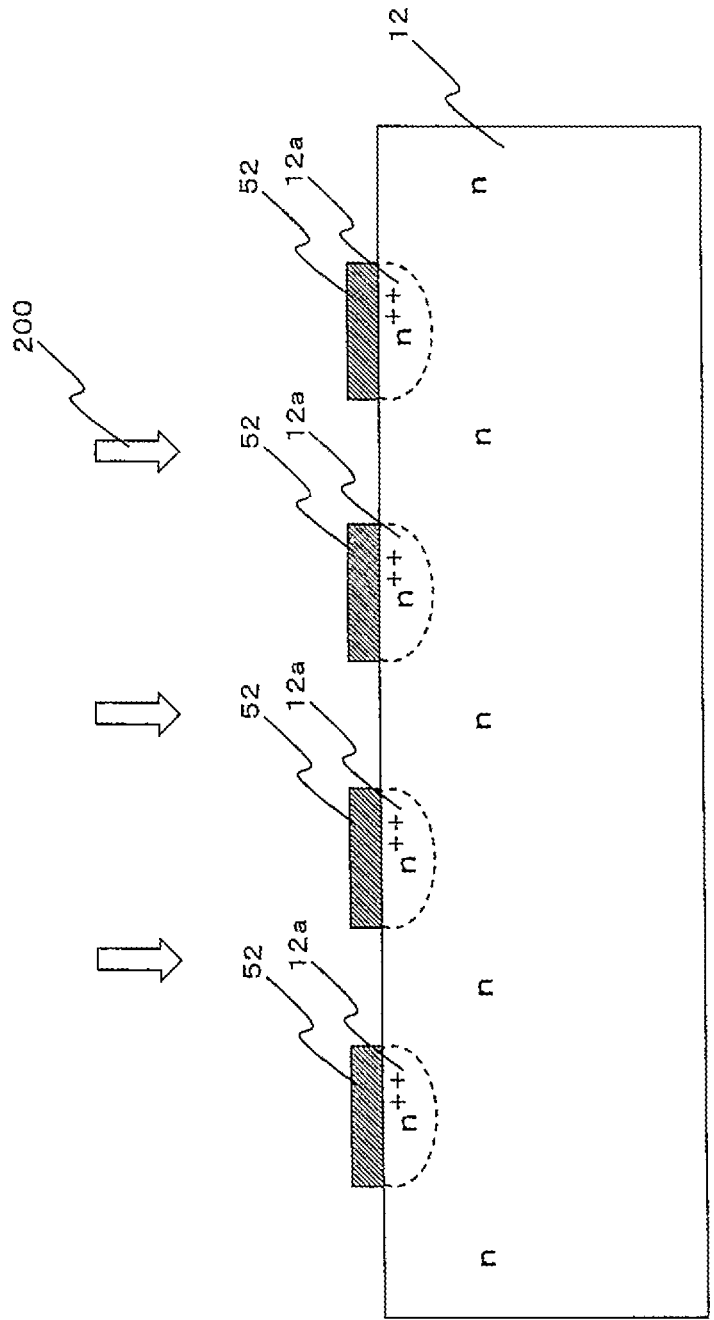
FIG. 4 is a drawing for explaining the method of the present invention for producing a selective emitter-type solar cell.
Figure 5:
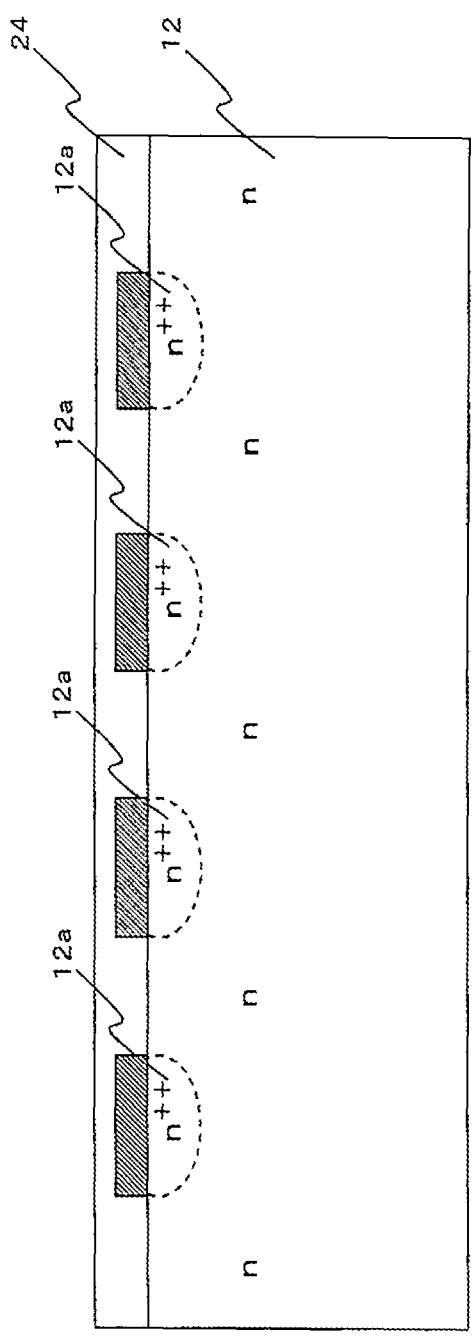
FIG. 5 is a drawing for explaining the method of the present invention for producing a selective emitter-type solar cell.
Figure 6:
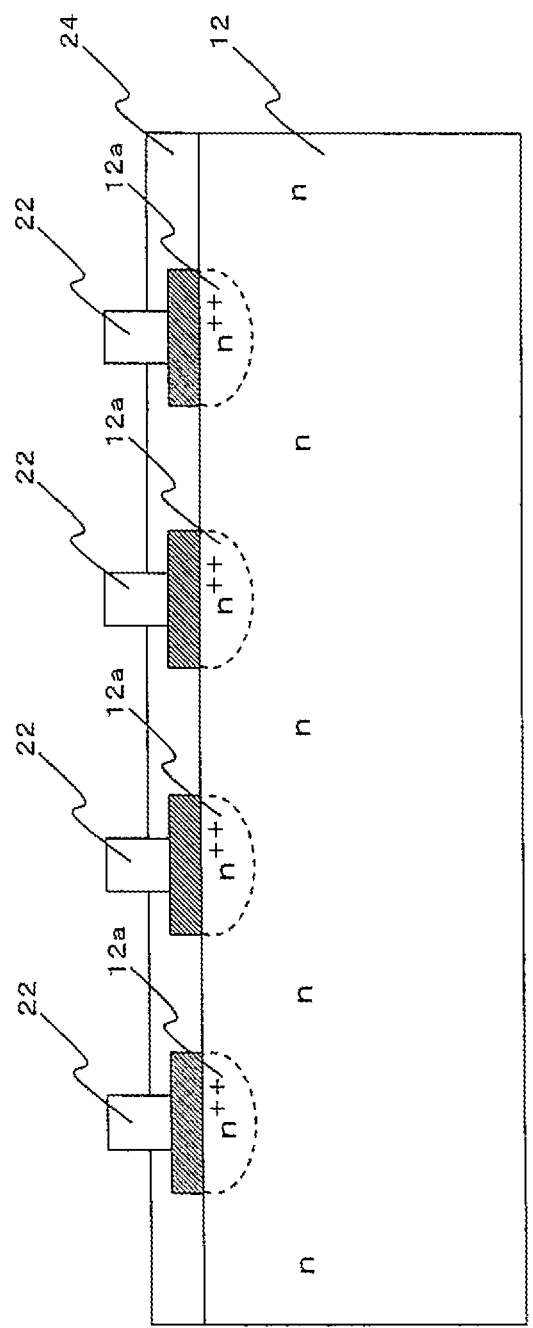
FIG. 6 is a drawing for explaining the method of the present invention for producing a selective emitter-type solar cell.
Figure 7:
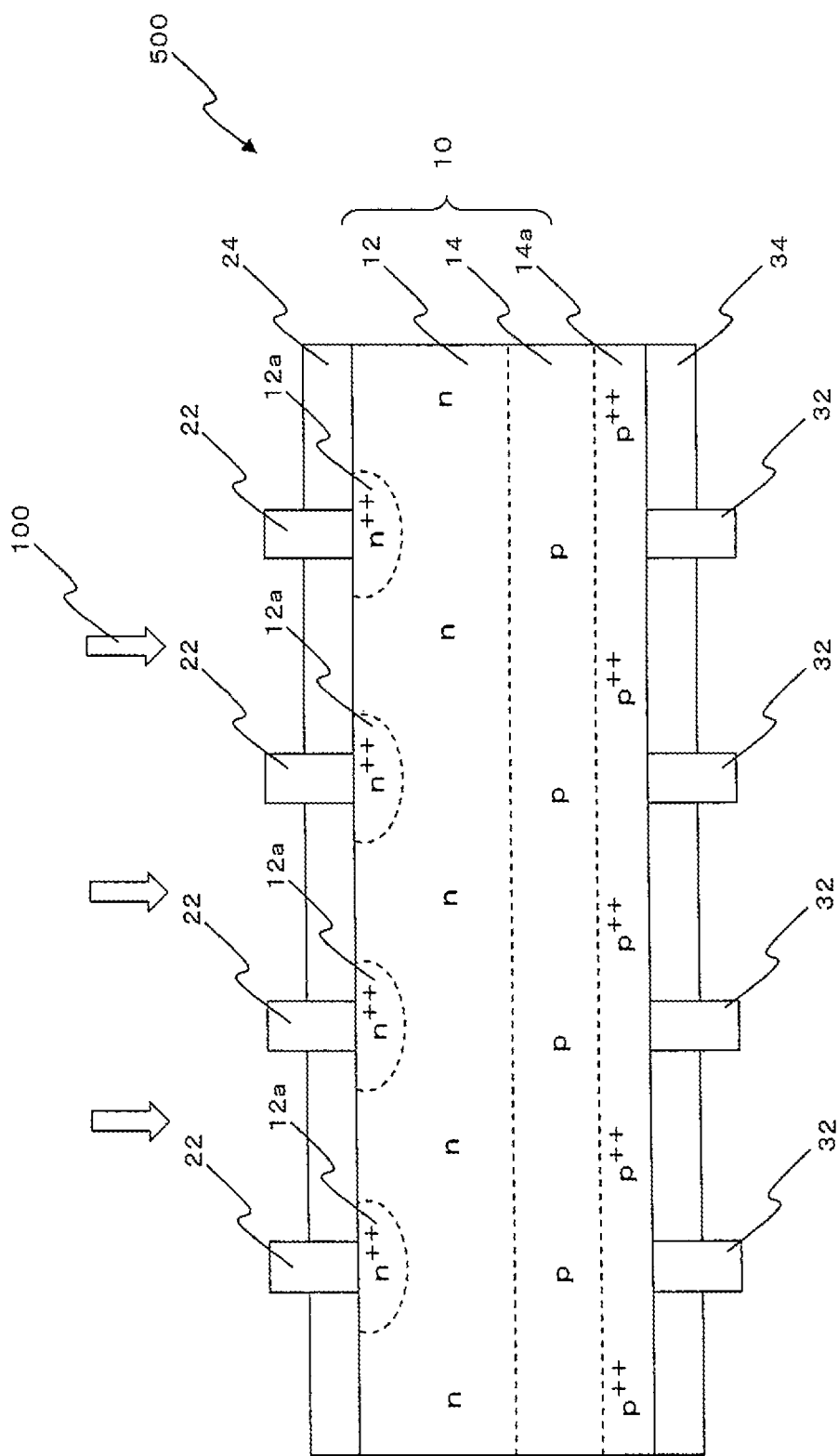
FIG. 7 is a drawing for explaining a selective emitter-type solar cell of the prior art.
Figure 8:
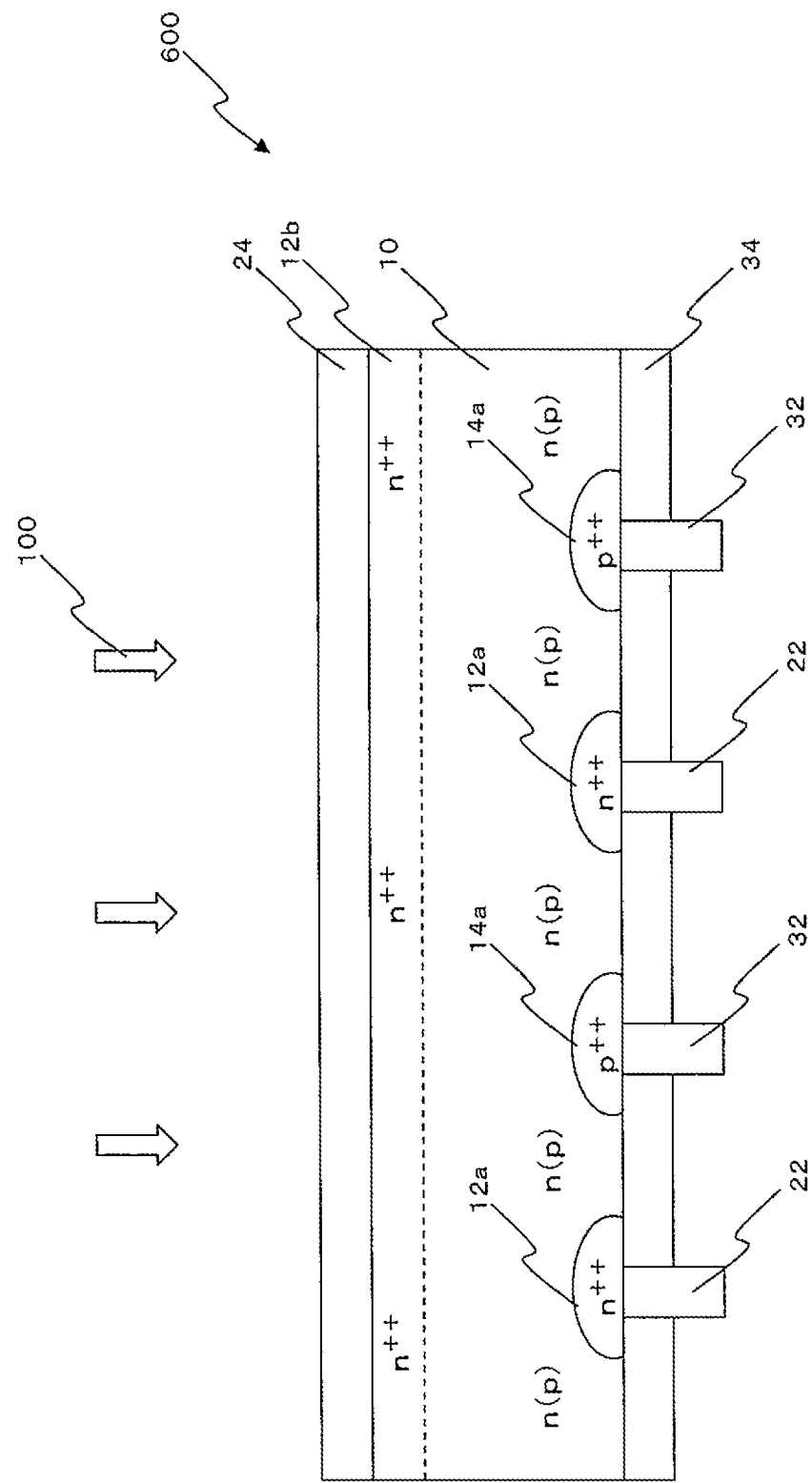
FIG. 8 is a drawing for explaining a back contact-type solar cell of the prior art.

Namely, in the case of fabricating the selective emitter-type solar cell (500*a*) by the method of the present invention, for example, a dispersion containing particles doped with a p-type dopant or n-type dopant is applied to a specific location of the n-type semiconductor layer (12), followed by drying to obtain a green dopant injection layer (52*a*) (FIG. 3). This green dopant injection layer (52*a*) is irradiated with light (200) to dope the specific location (12*a*) of the semiconductor layer or substrate with the p-type or n-type dopant, and at the same time, to sinter the green dopant injection layer and thereby obtain the dopant injection layer (52) coalesced with the semiconductor layer or substrate (12).

In addition, the protective layer (24) is then optionally formed (FIG. 5), followed by forming the electrodes (22) thereon so that the electrodes are able to reach the dopant injection layer (52) by thermal diffusion.

Incidentally, in the method of the present invention, in combination with forming the first dopant injection layer using first particles doped with a p-type or n-type dopant, a second dopant injection layer can also be formed by using second particles doped with a type of dopant differing from that of the dopant of the first particles.

More specifically, the method of the present invention further can comprise the following steps (a') to (c'), wherein the crystal orientation of the second dopant injection layer is the same as the crystal orientation of the semiconductor layer or substrate; and/or the dopant concentration at a depth of 0.1 µm from the surface of the second dopant injection layer is $1 \times 10^{20}$ atoms/cm$^3$ or more, and the dopant concentration at a depth of 0.3 µm, and particularly 0.2 µm, from the surface of the second dopant injection layer is $\frac{1}{10}$ or less of the dopant concentration at a depth of 0.1 µm:

(a') applying a second dispersion having the second particles to a second location of the semiconductor layer or substrate at the same time as step (a), between step (a) and step (b), or between step (b) and step (c), wherein the second particles are essentially composed of the same element as the semiconductor layer or substrate and are doped with a dopant of a type that differs from the dopant of the first particles;

(b') drying the applied second dispersion to obtain a second green dopant injection layer at the same time as step (b) or separately from step (b); and (c') irradiating the second green dopant injection layer with light at the same time as step (c) or separately from step (c) to dope the second location of the semiconductor layer or substrate with a p-type or n-type dopant, and at the same time, to sinter the second green dopant layer and thereby obtain a second dopant injection layer coalesced with the semiconductor layer or substrate.

Namely, in the method of the present invention, particles doped with a p-type dopant and particles doped with an n-type dopant can be sintered by collectively irradiating with light, or can be sintered by collectively drying and irradiating with light. This type of treatment is beneficial, since it shortens the production process. In addition, in this case, since the application of the dispersion can be carried out using a printing method such as inkjet printing or screen printing without using photolithography, this treatment is particularly beneficial to shorten the production process.

In addition, the method of the present invention can comprise the following steps (a") to (c") after the step (c), wherein the crystal orientation of the second dopant injection layer can be the same as the crystal orientation of the semiconductor layer or substrate; and/or the concentration of dopant at a depth of 0.1 from the surface of the second dopant injection layer can be $1 \times 10^{20}$ atoms/cm$^3$, and the concentration of dopant at a depth of 0.3 µm, and particularly 0.2 µm, from the surface of the second dopant layer can be $\frac{1}{10}$ or less of the dopant concentration at a depth of 0.1 µm:

(a") the second dispersion containing the second particles is applied to the second location of the semiconductor layer or substrate, wherein the second particles are essentially composed of the same element as the semiconductor layer or substrate and are doped with the other dopant of the p-type or n-type dopant;

(b") drying the applied second dispersion to obtain the second green dopant injection layer, and (c") irradiating the second green dopant injection layer with light to dope the second location of the semiconductor layer or substrate with a p-type or n-type dopant, and at the same time, to sinter the second green dopant layer and thereby obtain a dopant injection layer coalesced with the semiconductor layer or substrate.

Namely, in the method of the present invention, a dopant injection layer for injecting a p-type dopant, and a dopant injection layer for injecting an n-type dopant can be formed by repeating the method of the present invention.

The description relating to the first dopant injection layer can be referred to with respect to the production method of the second dopant injection layer, doping concentration, and the like.

Incidentally, in relation to the present invention, whether the crystal orientation of a dopant injection layer and the crystal orientation of the semiconductor layer or substrate are the same can be confirmed by the absence of disturbances in the crystal lattice between the dopant injection layer and the semiconductor layer or substrate when analyzed with a transmission electron microscope (TEM), and by agreement between diffraction lines of the dopant injection layer and diffraction lines of the semiconductor layer or substrate when analyzed with electron diffraction (ED).

(Semiconductor Layer or Substrate Composed of Semiconductor Element)

Any semiconductor layer or substrate composed of a semiconductor element can be used as a semiconductor layer or substrate in the present invention. Thus, examples of a semiconductor layer or substrate composed of a semiconductor element include a silicon wafer, gallium wafer, amorphous silicon layer, amorphous gallium layer, crystalline silicon layer and crystalline gallium layer. Silicon, germanium or a combination thereof can be used as the semiconductor element.

<Application>

There are no particular limitations on the application process of the dispersion in steps (a), (a') and (a") of the method of the present invention for producing a semiconductor device, provided the application process allows the dispersion to be applied uniformly at a desired thickness. Application of the dispersion can be carried out by, for example, inkjet printing, spin coating or screen printing. A process using a printing method such as inkjet printing or screen printing is particularly beneficial for shortening the production process.

In addition, this application can be carried out so that the thickness of a green film obtained when drying a dispersion film is 50 nm or more, 100 nm or more, or 200 nm or more; and 2000 nm or less, 1000 nm or less, 500 nm or less, or 300 nm or less. More specifically, in the case of obtaining a field effect transistor (FET), for example, application can be carried out so that the thickness of the green film is 50 nm or more, or 100 nm or more; and 500 nm or less, or 300 nm or less. In addition, in the case of obtaining a solar cell, application can be carried out so that the thickness of the green film is 100 nm or more, or 200 nm or more; and 2000 nm or less, 1000 nm or less, 500 nm or less, or 300 nm or less. However, there are no particular limitations on the thickness of the green film in the present invention.

(Dispersion Medium)

There are no particular limitations on the dispersion medium of the dispersion, provided it does not impair the object or effects of the present invention. Thus, for example, an organic solvent that does not react with particles used in the present invention can be used. More specifically, the dispersion medium can be a non-aqueous solvent such as an alcohol, alkane, alkene, alkyne, ketone, ether, ester, aromatic compound or nitrogen-containing compound, and in particular, isopropyl alcohol (IPA) or N-methyl-2-pyrrolidone (NMP). In addition, a glycol (divalent alcohol) such as ethylene glycol can also be used as an alcohol. Incidentally, the dispersion medium is preferably a dehydrated solvent in order to inhibit oxidation of particles used in the present invention.

(Particles)

There are no particular limitations on the particles of the dispersion, provided they are particles that are doped with a p-type dopant or n-type dopant, and composed of the same element as the semiconductor layer or substrate, and do not impair the object or effects of the present invention. Examples of such particles used include silicon particles and germanium particles as indicated in Patent Documents 5 and 6. More specifically, examples of these silicon particles or germanium particles include silicon particles and germanium particles obtained by laser pyrolysis, and particularly particles obtained by laser pyrolysis using a $CO_2$ laser.

The dispersion particles preferably have a relatively low degree of crystallization and/or a relatively small particle size in order to melt and sinter the particles by irradiating with light, to coalesce the resulting dopant injection layer with the semiconductor layer or substrate, and to make the crystal orientation of the dopant injection layer to be the same as the crystal orientation of the semiconductor layer or substrate.

For example, the degree of crystallization of the particles is preferably 40% or less, 30% or less, 20% or less, 10% or less, or 5% or less.

Figure 34:
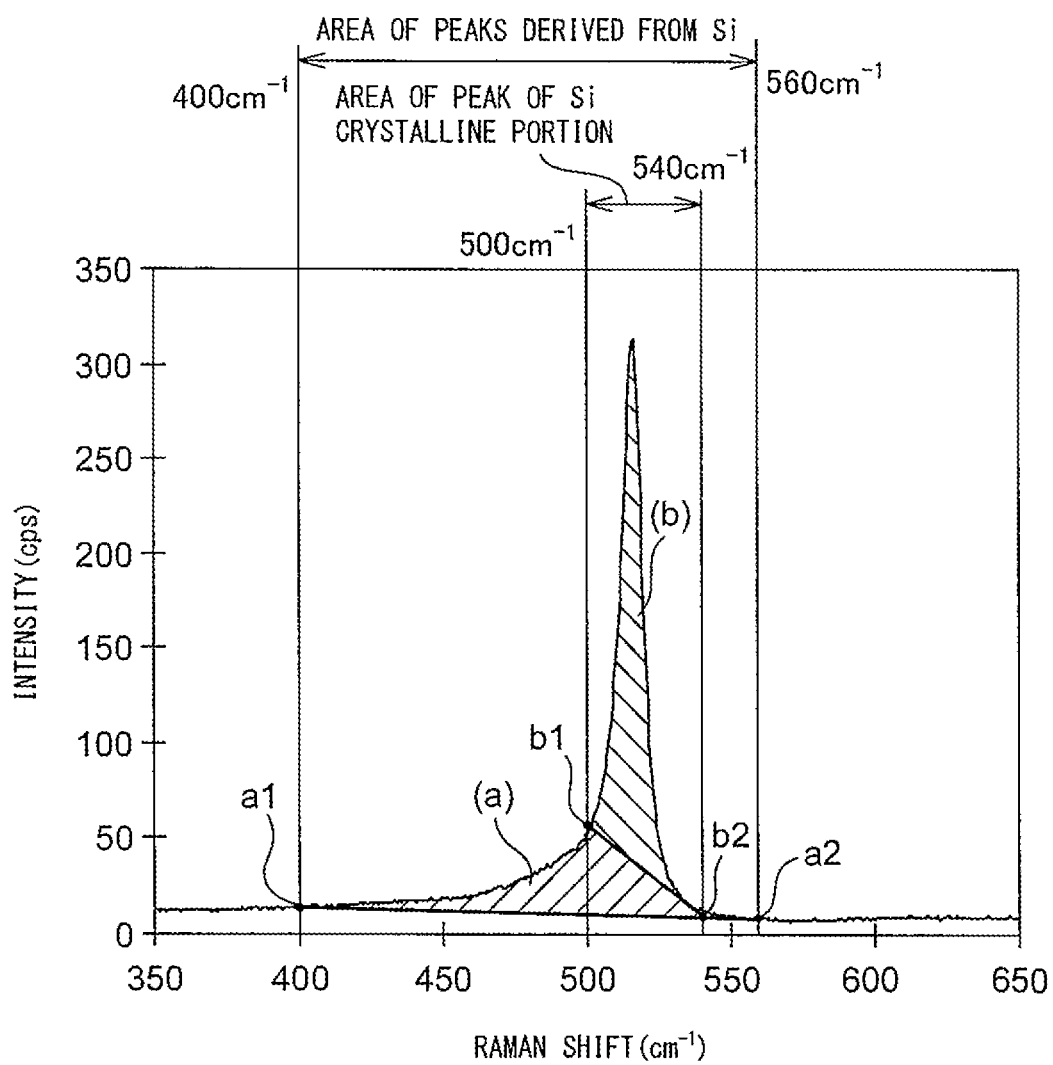
FIG. 34 is a drawing for explaining a method for measuring degree of crystallinity in the present invention.

The degree of crystallization in the present invention is a value determined based on Raman scattering. More specifically, with respect to silicon particles, for example, a peak derived from silicon is detected at 400 $cm^{-1}$ to 560 $cm^{-1}$, and a peak derived from the silicon crystalline portion is detected at 400 $cm^{-1}$ to 540 $cm^{-1}$. Thus, as shown in FIG. 34, the degree of crystallization can be determined by calculating the ratio of the area of the peak derived from the silicon crystalline portion ((b) of FIG. 34) to the area of all peaks derived from silicon ((a) and (b) of FIG. 34). Incidentally, the area of all peaks derived from silicon ((a) and (b) of FIG. 34) can be defined as the area of a region above a line that connects two intersection points (a1 and a2) of the peak curve and Raman shifts of 400 $cm^{-1}$ and 560 $cm^{-1}$. On the other hand, the area of the peak derived from the silicon crystalline portion ((b) of FIG. 34) can be defined as the area of a region above a line that connects two intersection points (b1 and b2) of the peak curve and Raman shifts of 500 $cm^{-1}$ and 540 $cm^{-1}$.

For example, the mean primary particle diameter of the particles is preferably 1 nm or more, or 3 nm or more; and 100 nm or less, 30 nm or less, 20 nm or less, or 10 nm or less.

The dopant used to dope the dispersion particles is a p-type or n-type dopant, and can be selected from the group consisting of boron (B), aluminum (Al), gallium (Ga), indium (In), titanium (Ti), phosphorous (P), arsenic (As), antimony (Sb), and combinations thereof.

In addition, the doping degree of the dispersion particles can be determined dependent on desired dopant concentrations in the dopant injection layer and semiconductor layer or substrate. More specifically, dopant can be contained at $1\times10^{20}$ atoms/$cm^3$ or more, $5\times10^{20}$ atoms/$cm^3$ or more, or $1\times10^{21}$ atoms/$cm^3$ or more. In addition, the dopant concentration may also be $1\times10^{22}$ atoms/$cm^3$ or less, or $1\times10^{21}$ atoms/$cm^3$ or less.

<Drying>

There are no particular limitations on the drying in steps (b), (b') and (b") of the method of the present invention for producing a semiconductor device, provided the dispersion medium can be substantially removed from the dispersion. Examples of the drying process include drying by arranging a substrate having the dispersion on a hot plate, or drying by arranging it in a heated atmosphere.

The drying temperature can be selected so as to not allow deterioration and the like of the substrate and dispersion particles. The drying temperature can be selected so as to be, for example, 50° C. or higher, 70° C. or higher, or 90° C. or higher; and 100° C. or lower, 150° C. or lower, 200° C. or lower, or 250° C. or lower.

(Light Irradiation)

Light irradiation in steps (c), (c') and (c") of the method of the present invention for producing a semiconductor device may be any light irradiation that allows a p-type or n-type dopant contained in the dopant injection layer to be diffused in a selected region of the semiconductor layer or substrate, allows the green dopant injection layer to be sintered and thereby coalesced with the semiconductor layer or substrate, and allows the crystal orientation of the dopant injection layer to be the same as the crystal orientation of the semiconductor layer or substrate.

Incidentally, in the case of sintering particles by irradiating with light in this manner, only the particles can be melted, or only the particles and the surface portion of the semiconductor layer or substrate under the particles can be melted. In this manner, the molten particles, or the molten particles and surface portion of the semiconductor layer or substrate located under the particles is rapidly cooled by transfer of heat to the main portion of the semiconductor layer or substrate. Namely, the molten semiconductor particles and the like are cooled and solidified from the main portion of the semiconductor layer or substrate towards the surface portion of the semiconductor particles. Thus, in this case, by suitably controlling the output of the irradiated light, the particle size of the particles and the like, the resulting dopant injection layer can be coalesced with the semiconductor layer or substrate, and the crystal orientation of the dopant injection layer can be made to be the same as the crystal orientation of the semiconductor layer or substrate.

(Radiated Light)

Any light can be used as the irradiated light, provided it can achieve sintering of the particles as the above manner. For example, laser light composed of a single wavelength, and particularly laser light having a wavelength of 600 nm or less, 500 nm or less, or 400 nm or less; and 300 nm or more can be used as the irradiated light. In addition, sintering of the silicon particles can be carried out using a flash lamp such as a xenon flash lamp that emits a flash of light over a wavelength range of a specific bandwidth (such as 200 nm to 1100 nm). In addition, light such as pulsed light or continuously oscillating light can also be used, provided it can achieve particle sintering as the above manner.

In the case of irradiating using pulsed light of a relatively short wavelength (such as that of a YVO laser having a wavelength of 355 nm), the number of pulsed light irradiation times can be 1 time or more, 2 times or more, 5 times or more, or 10 times or more; and 100 times or less, 80 times or less, or 50 times or less. In addition, in this case, the irradiated energy of the pulsed light can be 15 mJ/($cm^2 \cdot shot$) or more, 50 mJ/($cm^2 \cdot shot$) or more, 100 mJ/($cm^2 \cdot shot$) or more, 150 mJ/($cm^2 \cdot shot$) or more, 200 mJ/($cm^2 \cdot shot$) or more, or 300 mJ/($cm^2 \cdot shot$) or more; and 1,000 mJ/($cm^2 \cdot shot$) or less, or 800 mJ/($cm^2 \cdot shot$) or less. Moreover, in this case, the irradiation duration of the pulsed light can be 200 nanoseconds/shot or less, 100 nanoseconds/shot or less, or 50 nanoseconds/shot or less.

In addition, in the case of irradiating using pulsed light of a relatively long wavelength (such as a green laser having a wavelength of 532 nm), the number of pulsed light irradiation times can be 5 times or more, 10 times or more, 25 times or more, or 50 times or more; and 300 times or less, 200 times or less, or 100 times or less. In addition, in this case, the irradiated energy of the pulsed light can be 100 mJ/(cm$^2$·shot) or more, 300 mJ/(cm$^2$·shot) or more, 500 mJ/(cm$^2$·shot) or more, 900 mJ/(cm$^2$·shot) or more, or 1,300 mJ/(cm$^2$·shot) or more; and 3000 mJ/(cm$^2$·shot) or less, 2000 mJ/(cm$^2$·shot) or less, or 1500 mJ/(cm$^2$·shot) or less. Moreover, in this case, the irradiation duration of the pulsed light can be 50 nanoseconds/shot or more, 100 nanoseconds/shot or more, or 150 nanoseconds/shot or more; and 300 nanoseconds/shot or less, 200 nanoseconds/shot or less, or 180 nanoseconds/shot or less.

In the case where the number of light irradiation times is excessively few, the amount of energy per pulse required to achieve the desired sintering becomes large, thereby resulting in the risk of damaging the dopant injection layer. In addition, in the case where the amount of energy irradiated in a single irradiation is excessively low, the sintering temperature is not reached. In addition, even if the sintering temperature is reached, in the case where the amount of energy is excessively low, the required number of light irradiation times to obtain the required cumulative amount of energy increases, thereby resulting in the possibility of lengthening treatment time.

Optimum conditions with respect to irradiated energy, number of light irradiation times, and the like are dependent on such factors as the wavelength of the irradiated light used, and the properties of the particles. Optimum values can be determined by a person with ordinary skill in the art by carrying out experiments with reference to the description of the present specification.

Incidentally, the number of pulsed light irradiation times, the irradiated energy, and the irradiation duration are preferably selected as described above so that the dopant injection layer is coalesced with the semiconductor layer or substrate composed of a semiconductor element, a selected location of the semiconductor layer or substrate composed of a semiconductor element is doped with a p-type or n-type dopant derived from the dopant injection layer, and the crystal orientation of the dopant injection layer is made to be the same as the crystal orientation of the semiconductor layer or substrate.

(Radiating Atmosphere)

Light irradiation for sintering the dispersion particles is preferably carried out in a non-oxidizing atmosphere such as an atmosphere composed of hydrogen, rare gas, nitrogen or combination thereof in order to prevent oxidation of the dispersion particles. Specific examples of rare gases include argon, helium and neon. Incidentally, the atmosphere preferably contains hydrogen in order to form a continuous layer by reducing the oxidized surface portion due the reduction action of the dispersion particles. In addition, in order to form a non-oxidizing atmosphere, the oxygen content of the atmosphere can be 1% by volume or less, 0.5% by volume or less, 0.1% by volume or less, or 0.01% by volume or less.

<<Semiconductor Device>>

In the semiconductor device of the present invention, a first dopant injection layer formed by sintering first particles is arranged at a first location of a semiconductor layer or substrate composed of a semiconductor element, and the first particles are essentially composed of the same element as the semiconductor layer or substrate and are doped with a p-type or n-type dopant.

In addition, in this semiconductor device of the present invention, in a first aspect thereof, the first dopant injection layer is coalesced with the semiconductor layer or substrate, and the crystal orientation of the first injection layer is the same as the crystal orientation of the semiconductor layer or substrate. In addition, in this semiconductor device of the present invention, in another aspect thereof, the dopant concentration at a depth of 0.1 μm from the surface of the first dopant injection layer is $1\times10^{20}$ atoms/cm$^3$ or more particularly $5\times10^{20}$ atoms/cm$^3$ or more, and even more particularly $1\times10^{21}$ atoms/cm$^3$ or more; and the dopant concentration at a depth of 0.3 μm, and particularly 0.2 μm, from the surface of the first dopant injection layer is 1/10 or less, particularly 1/100 or less, and even more particularly 1/1000 or less of the dopant concentration at a depth of 0.1 μm.

The semiconductor device of the present invention can further have a second dopant injection layer. Namely, in the semiconductor device of the present invention, for example, a second dopant injection layer formed by sintering second particles is arranged at a second location of the semiconductor layer or substrate; and the second particles are essentially composed of the same element as the semiconductor layer or substrate, and are doped with a different type of dopant from that of the first particles.

In this case, the second dopant injection layer is coalesced with the semiconductor layer or substrate, and the crystal orientation of the second dopant injection layer can be the same as the crystal orientation of the semiconductor layer or substrate. In addition, in this case, the dopant concentration at a depth of 0.1 μm from the surface of the second dopant injection layer can be $1\times10^{20}$ atoms/cm$^3$ or more, and the dopant concentration at a depth of 0.3 μm, and particularly 0.2 μm, from the surface of the second dopant injection layer can be 1/10 or less of the dopant concentration at a depth of 0.1 μm.

The description relating to the first dopant injection layer can be referred to with respect to the production method of the second dopant injection layer, doping concentration, and the like.

Although there are no particular limitations on the production method thereof, the semiconductor device of the present invention can be obtained by, for example, the method of the present invention, and the description relating to the method of the present invention for producing a semiconductor device can be referred to with respect to the details of each constituent.

<<Dispersion>>

The dispersion of the present invention is a dispersion containing particles, and the particles have a degree of crystallization of 40% or less, and/or a mean primary particle diameter of 30 nm or less, and are essentially composed of an n-doped or p-doped semiconductor element.

The dispersion of the present invention can be used for the method of the present invention for producing a semiconductor device, and the description relating to the method of the present invention for producing a semiconductor device can be referred to with respect to the details of each constituent.

Second Present Invention

<Green Silicon Particle Film of Present Invention>>

The green silicon particle film of the present invention is composed of silicon particles not mutually sintered, and the amount of a desorbing gas that desorbs when heated at a pressure of 1 atmosphere and temperature of 600° C. in an inert gas atmosphere is 500 ppm by weight or less, 300 ppm by weight or less, 100 ppm by weight or less, or 50 ppm by weight or less, based on the weight of the green silicon particle film. The silicon particle film being composed of silicon particles not mutually sintered means that the silicon particle film has not been subject to heat treatment at a temperature that causes the silicon particles to be sintered, for example, at a temperature higher than 1,000° C., 900° C., or 800° C., and/or that the silicon particle film requires sintering treatment in order for the silicon particle film to be used as a semiconductor film.

The green silicon particle film of the present invention having a low desorbing gas content can provide a semiconductor silicon film having unexpectedly favorable properties by sintering the silicon particles with light irradiation or heating. Although not limited by any theory, it is believed that, in the case where a green silicon particle film to be sintered contains desorbing gas, carbon atoms and other impurities derived from the desorbing gas impair semiconductor properties in the semiconductor silicon film obtained by sintering.

(Desorbing Gas)

In relation to the green silicon particle film of the present invention, a "desorbing gas" refers to a gas component that desorbs when heated at a pressure of 1 atmosphere and temperature of 600° C. in an inert gas atmosphere, and thus a gas component that is physically or chemically adsorbed to silicon particles, for example. Examples of inert gas used include nitrogen, helium, argon and neon.

Specific examples of the "desorbing gas" include gas components selected from the group consisting of silane compounds, organic solvents and combinations thereof. Examples of silane compounds as adsorbed gas include ones derived from silicon particles, and reaction products of silicon particles and organic solvent. In addition, examples of organic solvent as adsorbed gas include ones derived from a dispersion medium used for forming the green silicon particle film by a liquid phase method.

The amount of the adsorbed gas can be measured by, for example, thermal desorption spectroscopy (TDS).

(Film Thickness)

The thickness of the dried silicon particle film of the present invention is, for example, 50 nm or more, 100 nm or more, or 200 nm or more; and 2000 nm or less, 1000 nm or less, 500 nm or less, or 300 nm or less. More specifically, in the case of obtaining a field effect transistor (FET), for example, application can be carried out so that the thickness of the dried silicon particle film is 50 nm or more, or 100 nm or more; and 500 nm or less, or 300 nm or less. In addition, in the case of a solar cell, application can be carried out so that the thickness of the dried silicon particle film is 100 nm or more, or 200 nm or more; and 2000 nm or less, 1000 nm or less, 500 nm or less, or 300 nm or less.

(Mean Primary Particle Diameter)

In addition, the mean primary particle diameter of the silicon particles is preferably 100 nm or less. Thus, the silicon particles can be 1 nm or more, or 5 nm or more; and 100 nm or less, 50 nm or less, or 30 nm or less. The mean primary particle diameter is preferably 100 nm or less in order to sinter the silicon particles with light.

(Variance)

Variance of the silicon particles can be 200 $nm^2$ or less, 100 $nm^2$ or less, 80 $nm^2$ or less, 50 $nm^2$ or less, 30 $nm^2$ or less, 10 $nm^2$ or less, or 5 $nm^2$ or less.

In the case where variance of the silicon particles is excessively large, small particles (namely, particles having a large surface area irradiated by light relative to volume) are preferentially melted when sintering by light, and the small particles are presumed to be sintered while collected around the periphery of large particles. Thus, in this case, it may be difficult to obtain a homogeneous film.

(Silicon Particle Production Method)

There are no particular limitations on the silicon particles that compose the green silicon particle film of the present invention, provided they do not impair the object and effects of the present invention. The silicon particles as indicated in Patent Document 6, for example, can be used. More specifically, examples of these silicon particles include silicon particles obtained by laser pyrolysis, and particularly silicon particles obtained by laser pyrolysis using a $CO_2$ laser.

These silicon particles are silicon particles composed of a polycrystalline or single crystal core, and an amorphous outer layer. In this case, semiconductor properties attributable to the polycrystalline or single crystal core, and sintering ease attributable to the amorphous outer layer can be utilized in combination.

<<Method of Present Invention for Producing Green Silicon Particle Film>>

The method of the present for producing a green silicon particle film comprises the following steps (a) to (c):

(a) applying a silicon particle dispersion containing a dispersion medium and silicon particles dispersed therein onto a substrate to form a silicon particle dispersion film;

(b) drying the silicon particle dispersion film to form a dried silicon particle film; and (c) firing the dried silicon particle film at a temperature of 300° C. to 900° C. to form a green silicon particle film.

Figure 45:
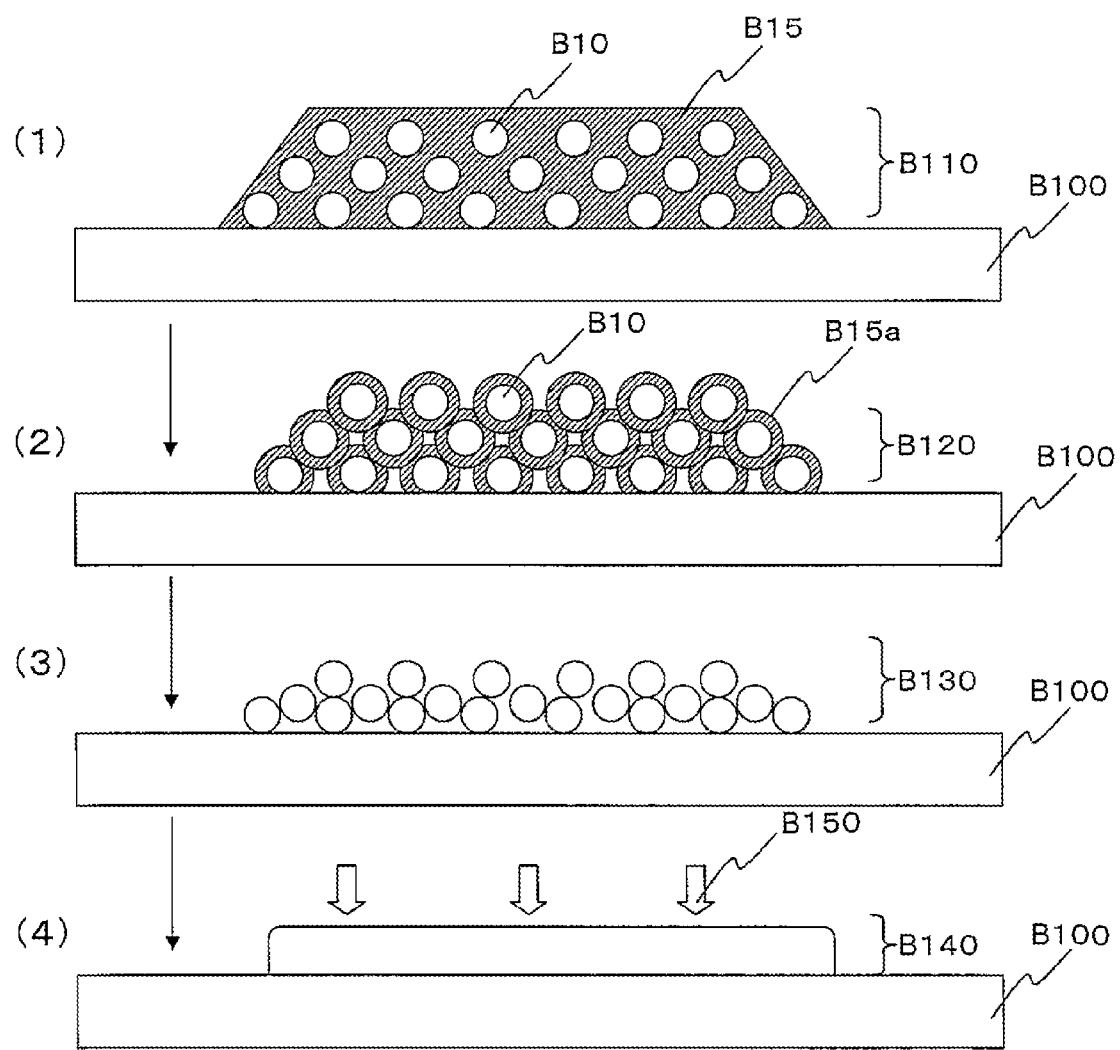
FIG. 45 indicates the green silicon particle film of the present invention and the production method of a semiconductor silicon film of the present invention.

More specifically, the method of the present invention for producing a green silicon particle film can be carried out, for example, as shown in FIG. 45.

Namely, in step (a) of the method of the present invention, a silicon particle dispersion film (B110) is formed by applying a silicon particle dispersion containing a dispersion medium (B15) and silicon particles (B10) onto a substrate (B10) as shown in FIG. 45(1).

In step (b), a dried silicon particle film (B120) is formed by drying the silicon particle dispersion film (B110) as shown in FIG. 45(2). In the case of such drying, even if the dispersion medium does not appear to be remaining, desorbing gas (B15a) of the dispersion medium and the like remains adsorbed on the surface of the silicon particles of the dried silicon particle film.

In step (c), as shown in FIG. 45(3), a green silicon particle film (B130) is formed by drying the dried silicon particle film at a temperature higher than the temperature required to dry the dispersion medium, namely by removing desorbing gas of the dispersion medium and the like that remains adsorbed on the surface of the silicon particles.

Incidentally, as shown in FIG. 45(4), the semiconductor silicon film (B140) of the present invention can be formed by irradiating the green silicon particle film (B130) of the present invention with light to sinter the silicon particles (B10), or by heating the green silicon particle film (B130) of the present invention to sinter the silicon particles (B10). By reducing the desorbing gas content of the green silicon particle film (B130) to be sintered, the content of impurities derived from the desorbing gas, and particularly the content of carbon atoms, can be lowered in the resulting semiconductor silicon film (B140) of the present invention, thereby enabling the semiconductor silicon film (B140) to have superior semiconductor properties.

Figure 46:
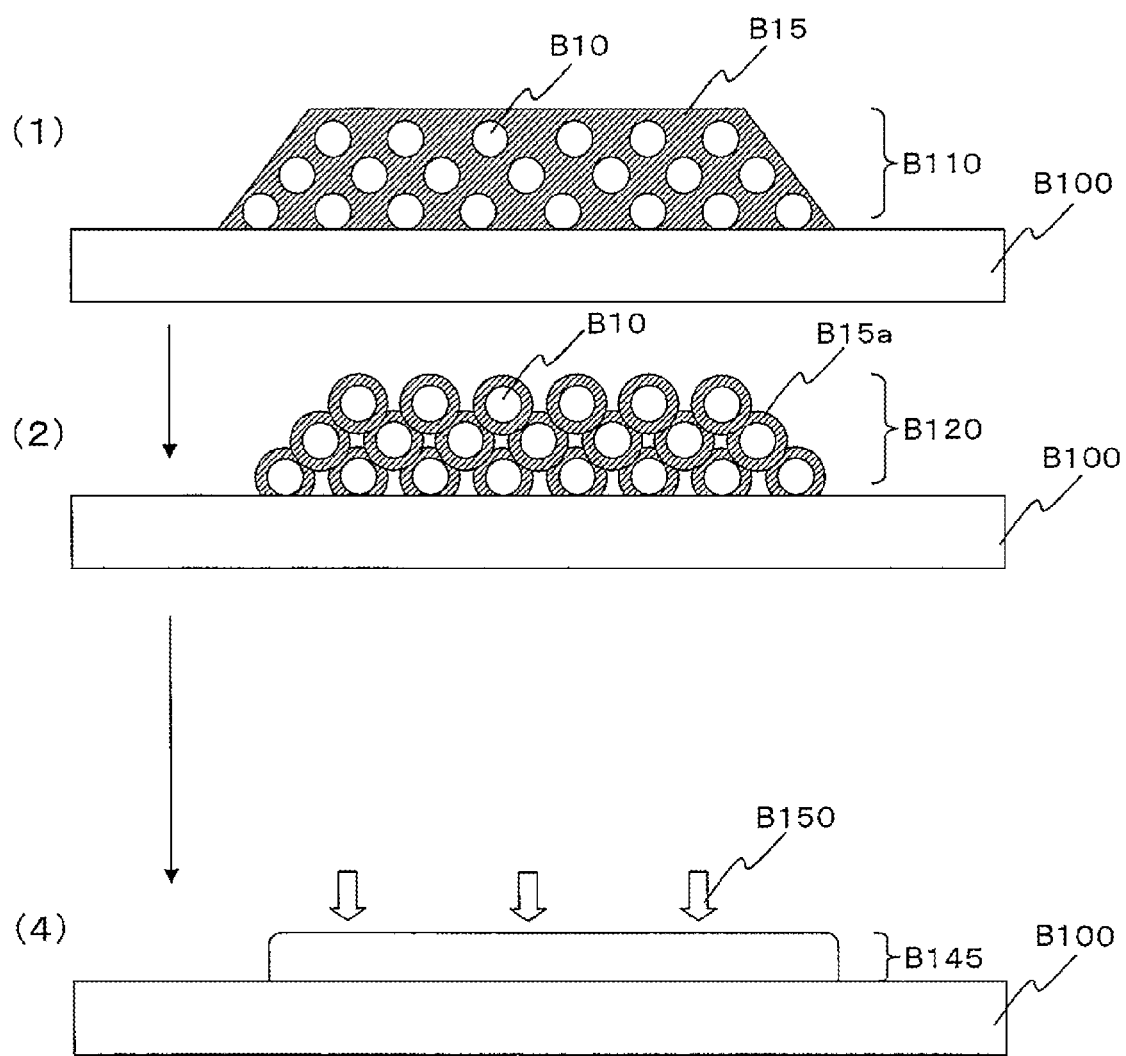
FIG. 46 indicates a production method of a semiconductor silicon film of the prior art.

Methods of the prior art for sintering silicon particles with light do not use a firing step of step (c). Namely, in a method of the prior art, the silicon particle dispersion film (B110) is formed as shown in FIG. 46(1), and after obtaining the dried silicon particle film (B120) by drying the silicon particle dispersion film (B110) as shown in FIG. 46(2), a semiconductor silicon film (B145) is formed by irradiating the film with light (B150) to sinter the silicon particles (B10) as shown in FIG. 46(4), or by heating the film to sinter the silicon particles (B10), without using a firing step as shown in FIG. 45(3).

<<Individual Steps of Method of Present Invention for Producing Green Silicon Particle Film>>

The following provides a detailed explanation of each step of the method of the present invention for producing a green silicon particle film.

<<Step (a) of Method of Present Invention for Producing Green Silicon Particle Film>>

In step (a) of the method of the present invention, a silicon particle dispersion containing a dispersion medium and silicon particles dispersed therein is applied onto a substrate to form a silicon particle dispersion film.

(Dispersion Medium)

There are no particular limitations on the dispersion medium of the silicon particle dispersion provided it does not impair the object or effects of the present invention. Thus, for example, an organic solvent, and particularly an organic solvent that does not react with the silicon particles, can be used. The dispersion medium is preferably a dehydrated solvent in order to inhibit oxidation of the silicon particles. Incidentally, the description of the first present invention can be referred to with respect to the specific dispersion medium.

(Silicon Particles)

The description relating to the green silicon particle film of the present invention can be referred to with respect to the silicon particles used in the method of the present invention.

(Substrate)

There are no particular limitations on the substrate used in the method of the present invention, provided it does not impair the object or effects of the present invention. Thus, for example, a silicon substrate, glass substrate or polymer substrate can be used as the substrate.

(Application)

There are no particular limitations on the method used to apply the silicon particle dispersion, provided it allows the silicon particle dispersion to be applied uniformly at a desired thickness. This application process can be carried out by, for example, inkjet printing, spin coating and the like.

<<Step (b) of Method of Present Invention for Producing Green Silicon Particle Film>>

In step (b) of the method of the present invention, the silicon particle dispersion film is dried to form a dried silicon particle film.

There are no particular limitations on this drying, provided it is a method that allows the dispersion medium in the silicon particle dispersion film to be evaporated. The drying can be carried out by, for example, arranging a substrate having the silicon particle dispersion film on a hot plate.

The drying temperature can be determined as, for example, a temperature that is adequate for evaporating dispersion medium in the silicon particle dispersion film. This drying can be carried out particularly within a range of the boiling point of the dispersion medium ±30° C., a range of boiling point of the dispersion medium ±20° C., or a range of boiling point of the dispersion medium of ±10° C. In addition, this drying can be carried out in an inert atmosphere, and particularly in a nitrogen atmosphere or argon atmosphere and the like.

Incidentally, this drying can also be carried out coupled with the application of step (a). For example, the application of step (a) can be carried out by spin coating, and thereby application and drying can be carried out simultaneously. Namely, drying may be carried out only as a step coupled with application, or drying may be carried out as a separate step from application. In addition, this drying can also be carried out coupled with the firing of step (c), and thus, the drying of step (b) and the firing of step (c) can be carried out in succession.

<<Step (c) of Method of Present Invention for Producing Green Silicon Particle Film>>

In step (c) of the method of the present invention, the dried silicon particle film is fired at a temperature of 300° C. to 900° C. to form a green silicon particle film.

In step (c) of the method of the present invention, at least a portion, and preferably substantially all, of desorbing gas of the dispersion medium and the like remaining adsorbed to the surface of the silicon particles of the dried silicon particle film is removed by firing the dried silicon particle film at a temperature higher than the temperature required to dry the silicon particle dispersion film. Thus, according to the method of the present invention, a green silicon particle film having a low content of desorbing gas, and particularly the green silicon particle film of the present invention, can be obtained.

The temperature at which the dried silicon particle film is fired can be 300° C. or higher, 400° C. or higher, 450° C. or higher, 500° C. or higher, or 600° C. or higher; and 900° C. or lower, 800° C. or lower, or 700° C. or lower. This firing temperature can be determined in consideration of the desired degree of desorbing gas removal, the acceptable firing temperature and the like. In addition, this firing can be carried out in an inert atmosphere, and particularly in a nitrogen atmosphere or argon atmosphere and the like. In addition, the firing time of the dried silicon particle film can be 1 second or more, 10 seconds or more, 30 seconds or more, 1 minute or more, 5 minutes or more, 10 minutes or more, 20 minutes or more, or 30 minutes or more; and 3 hours or less, 2 hours or less, or 1 hour or less. In addition, firing of the dried silicon particle film may be accelerated by removing desorbing gas under reduced pressure.

<<Semiconductor Silicon Film of the Present Invention>>

The semiconductor silicon film of the present invention is composed of mutually sintered silicon particles, and substantially does not contain carbon atoms. This semiconductor silicon film of the present invention can have superior semiconductor properties by substantially not containing carbon atoms.

In one aspect thereof, the semiconductor silicon film of the present invention has not been subjected to a heat treatment at a temperature higher than 1,000° C., 900° C. or 800° C. This semiconductor silicon film of the present invention has not been subjected to deterioration of the substrate and other surrounding layers caused by heat, in comparison with conventional semiconductor silicon films that are sintered at relatively high temperatures.

In relation to the semiconductor silicon film of the present invention, "carbon atoms" particularly refer to carbon atoms derived from the dispersion medium used when applying the silicon particles with a solution method.

<<Method of Present Invention for Producing Semiconductor Silicon Film>>

In one aspect thereof, the method of the present invention for producing a semiconductor silicon film comprises obtaining a green silicon particle film by the method of the present invention; and irradiating with light or applying heat to the green silicon particle film to sinter the silicon particles in the green silicon particle film, and thereby form a semiconductor silicon film. In addition, in another aspect thereof, the method of the present invention for producing a semiconductor silicon film comprises irradiating the green silicon particle film of the present invention with light or applying heat to the green silicon particle film to sinter the silicon particles in the green silicon particle film.

(Radiated Light)

In the case of sintering the silicon particles by irradiating the green silicon particle film with light, any light can be used as the light, provided it can achieve sintering of the silicon particles in the green silicon particle film. For example, laser light can be used.

The description relating to the first present invention can be referred to with respect to the wavelength of light, the number of light irradiation times, and the irradiation duration in the case of using light irradiation, particularly pulsed light irradiation.

Incidentally, the number of pulsed light irradiation times, the irradiated energy, and the irradiation duration are preferably selected in order to achieve sintering of the silicon particles while inhibiting deterioration of substrate materials.

(Applied Heat)

In the case of sintering the silicon particles by applying heat to the green silicon particle film, any temperature, that can achieve sintering of the silicon particles, can be used. Thus, for example, sintering of the silicon particles can be carried out at a temperature higher than 800° C., 900° C. or 1,000° C.

(Sintering Atmosphere)

Light irradiation or heating for sintering the silicon particles is preferably carried out in a non-oxidizing atmosphere in order to prevent oxidation of the silicon particles. Incidentally, the description relating to the irradiating atmosphere of the first present invention can be referred to with respect to specific non-oxidizing atmospheres.

<<Semiconductor Device>>

The semiconductor device of the present invention has the semiconductor silicon film of the present invention as a semiconductor film. The semiconductor device of the present invention is, for example, a field effect transistor or solar cell.

Although there are no particular limitations on the production method thereof, the semiconductor device of the present invention can be obtained by, for example, the method of the present invention. The description relating to the method of the present invention for producing a semiconductor device can be referred to with respect to the details of each constituent.

<<Semiconductor Device Production Method>>

The method of the present invention for producing a semiconductor device such as a field effect transistor (FET) or solar cell comprises producing a semiconductor silicon film by the method of the present invention. The method of the present invention for producing a field effect transistor, for example, can further comprise producing a gate insulator, producing source and drain electrodes, and the like. In addition, the method of the present invention for producing a solar cell, for example, can comprise producing at least one of an N-type and P-type semiconductor by the method of the present invention, producing a collector electrode, and the like.

Third Present Invention

<<Semiconductor Silicon Film>>

The semiconductor silicon film of the present invention is a semiconductor silicon film obtained by arranging a plurality of elongated silicon particles mutually adjacent in the direction of the short axis. Each of the elongated silicon particles of the semiconductor silicon film of the present invention is sintered body of a plurality of silicon particles.

(Short Axis Diameter)

At least a portion of the elongated silicon particles can have a short axis diameter of 100 nm or more, or 200 nm or more. In addition, the short axis diameter can be 1,000 nm or less, 800 nm or less, or 500 nm or less. "At least a portion of the elongated silicon particles" refers to at least 10% or more, 20% or more, 30% or more, 40% or more, or 50% or more of the elongated silicon particles based on the number thereof.

In the case where the short axis diameter of the elongated silicon particles is excessively small, namely in the case where the elongated silicon particles are excessively small, grain boundaries in the semiconductor silicon film become excessively numerous, thereby preventing achievement of favorable carrier mobility. In addition, in the case where this short axis diameter is excessively large, namely in the case where the elongated silicon particles are excessively large, the structure of the semiconductor silicon film becomes coarse, thereby preventing achievement of favorable carrier mobility.

(Aspect Ratio)

At least a portion of the elongated silicon particles can have an aspect ratio of more than 1.0, more than 1.2, or more than 1.5. In addition, this aspect ratio can be 5.0 or less, 4.0 or less, or 3.0 or less. "At least a portion of the elongated silicon particles" may refer to at least 10%, 20%, 30%, 40%, or 50% of the elongated silicon particles based on the number thereof.

In the case where the aspect ratio of the elongated silicon particles is excessively small, the effect of the present invention of being able to achieve favorable carrier mobility in a device through which a carrier flows in the direction of thickness of a semiconductor silicon film is diminished. In addition, in the case where the aspect ratio is excessively large, surface irregularities in the film surface become large, thereby making the structure of the film heterogeneous.

(Production Method)

Although there are no particular limitations on the production method thereof, the semiconductor silicon film of the present invention can be obtained by, for example, the production method of the present invention, and the description relating to the method of the present invention for producing a semiconductor silicon film can be referred to with respect to the details of each constituent.

<<Semiconductor Device>>

The semiconductor device of the present invention has the semiconductor silicon film of the present invention as a semiconductor film. The semiconductor device of the present invention is, for example, a field effect transistor or solar cell.

<<Semiconductor Silicon Film Production Method>>

The method of the present invention for producing a semiconductor thin film having a substrate and a semiconductor silicon film laminated thereon is comprised of the following steps (a) to (f):

(a) applying a first silicon particle dispersion containing a first dispersion medium and first silicon particles dispersed therein on a substrate to form a first silicon particle dispersion film;

(b) drying the first silicon particle dispersion film to form a first green semiconductor silicon film;

(c) irradiating the first green semiconductor silicon film with light to sinter the first silicon particles in the first green semiconductor silicon film and thereby form a first semiconductor silicon film;

(d) applying a second silicon particle dispersion containing a second dispersion medium and second silicon particles dispersed therein on the first semiconductor silicon film to form a second silicon particle dispersion film;

(e) drying the second silicon particle dispersion film to form a second green semiconductor silicon film; and (f) irradiating the second green semiconductor silicon film with light to sinter the second silicon particles in the second green semiconductor silicon film.

Variance of the first silicon particles in the method of the present invention is 5 $nm^2$ or more.

As previously described, in the method of the present invention, after having formed the first semiconductor silicon film from the first silicon particle dispersion in steps (a) to (c), the second silicon particle dispersion is further applied onto the first semiconductor silicon film followed by drying and sintering to form the second semiconductor silicon film in steps (d) to (f). According to this method of the present invention, a semiconductor silicon film can be obtained in which a plurality of elongated silicon particles are mutually adjacent in the direction of the short axis.

Although not limited to the principle thereof, this is thought to be due to the reasons indicated below. Namely, the first semiconductor silicon film has a plurality of sintered silicon particles scattered on a substrate, and the second silicon particles undergo crystal grain growth by using the sintered silicon particles as nuclei. Although this crystal grain growth of the second silicon particles occurs both in the vertical and horizontal directions relative to the substrate, since crystal grain growth in the horizontal direction is limited by particles which growth using other adjacent sintered silicon particles as nuclei, the degree of crystal grain growth in the vertical direction is thought to be relatively greater.

Figure 51:
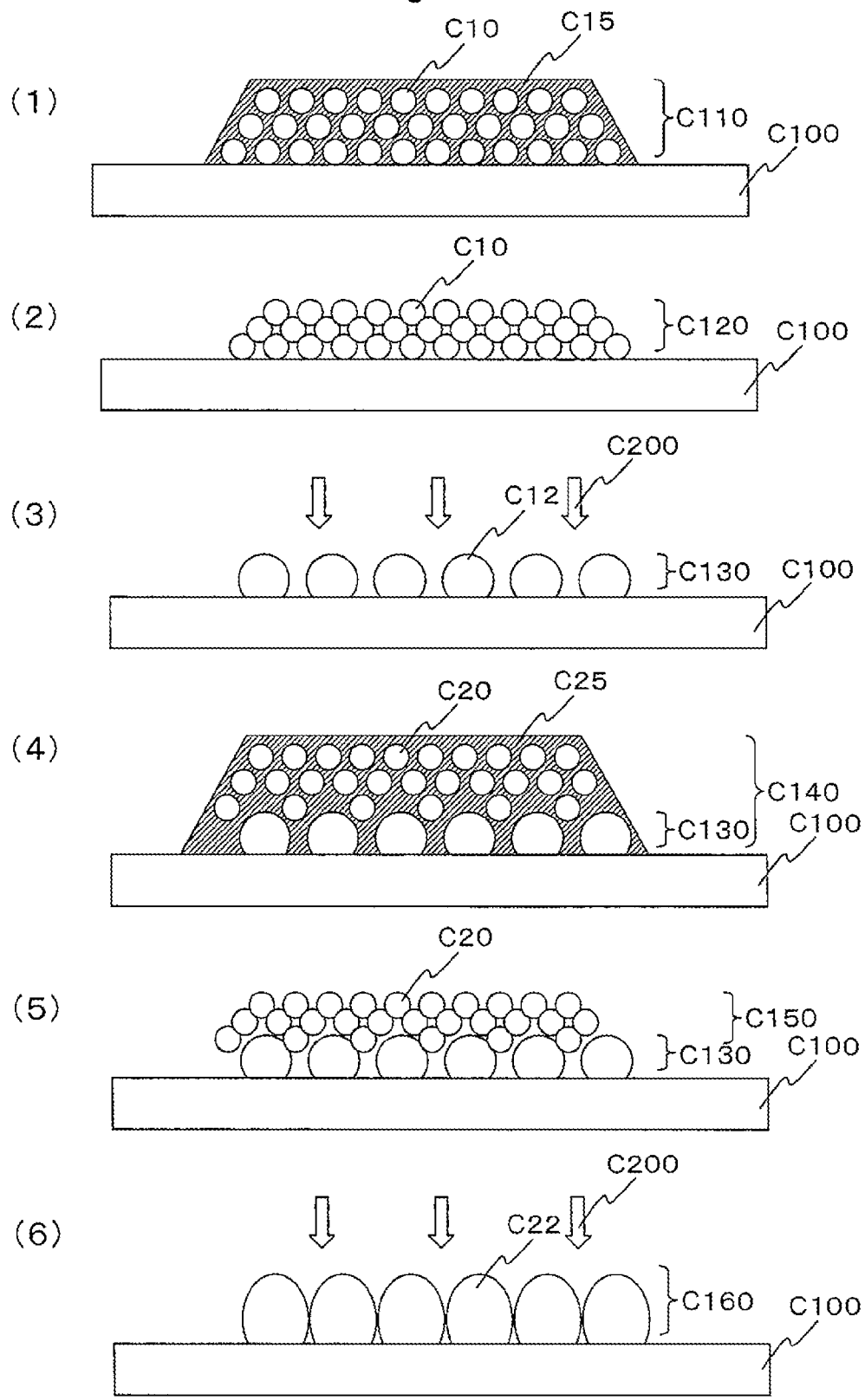
FIG. 51 is a drawing for explaining the method of the present invention for producing a semiconductor silicon film.

More specifically, the method of the present invention can be carried out as shown in FIG. 51.

Namely, in step (a) of the method of the present invention, a first silicon particle dispersion film (C110) is formed by applying a first silicon particle dispersion containing a first dispersion medium (C15) and first silicon particles (C10) on a substrate (C100) as shown in FIG. 51(1). The variance of the first silicon particles is 5 $nm^2$ or more. Namely, the first silicon particles have a relatively large particle size distribution.

In step (b), a first green semiconductor silicon film (C120) is formed by drying the first silicon particle dispersion film (C110) as shown in FIG. 51(2).

In step (c), a first semiconductor silicon film (C130) having sintered silicon particles (C12) is formed by irradiating the first green semiconductor silicon film (C120) with light (C200) to sinter the first silicon particles (C10) as shown in FIG. 51(3). As previously described, since the distribution of particle size of the first silicon particles is relatively large, relatively small silicon particles are sintered around the relatively large silicon particles by using those relatively large silicon particles as nuclei, and as a result thereof, the first semiconductor silicon film is not a flat film, but rather a film composed of a plurality of sintered silicon particles.

In step (d), a second silicon particle dispersion film (C140) is formed by applying a second silicon particle dispersion containing a second dispersion medium (C25) and second silicon particles (C20) onto the first semiconductor silicon film (C130) as shown in FIG. 51(4).

In step (e), a second green semiconductor silicon film (C150) is formed by drying the second silicon particle dispersion film (C140) as shown in FIG. 51(5).

In step (f), a semiconductor silicon film (C160) having elongated silicon particles (C22) is formed by irradiating the second green semiconductor silicon film (C150) with light (C200) to sinter the second silicon particles (C20).

<<Steps (a) and (d) of Semiconductor Silicon Film Production Method>>

In steps (a) and (d) of the method of the present invention, a silicon particle dispersion film is formed by applying a silicon particle dispersion containing a dispersion medium and silicon particles dispersed therein onto a substrate.

(Dispersion Medium)

There are no particular limitations on the dispersion medium of the silicon particle dispersion, provided it does not impair the object or effects of the present invention. Thus, for example, an organic solvent that does not react with the silicon particles can be used. The dispersion medium is preferably a dehydrated solvent in order to inhibit oxidation of the silicon particles. Incidentally, the description of the first present invention can be referred to with respect to the specific dispersion medium.

(Silicon Particles)

The variance of the first silicon particles can be 5 $nm^2$ or more, 10 $nm^2$ or more, 20 $nm^2$ or more, or 30 $nm^2$ or more. In addition, this variance can be 200 $nm^2$ or less, 100 $nm^2$ or less, or 80 $nm^2$ or less.

In the case where the variance of the first silicon particles is excessively small, the silicon particles are uniformly sintered when sintered with light, and a relatively flat film tends to be formed. When such a flat film is used as the first semiconductor silicon film in the method of the present invention, a semiconductor silicon film is unable to be ultimately obtained in which a plurality of elongated silicon particles are arranged mutually adjacent in the direction of the short axis. In addition, in the case where the variance of the first silicon particles is excessively large, heterogeneity of the resulting film becomes excessively large when sintered with light, thereby also making heterogeneity of the ultimately obtained film excessively large.

In addition, although there are no particular limitations thereon, the variance of the second silicon particles is, for example, 5 $nm^2$ or more, 10 $nm^2$ or more, 20 $nm^2$ or more, or 30 $nm^2$ or more. In addition, this variance can be 200 $nm^2$ or less, 100 $nm^2$ or less, or 80 $nm^2$ or less.

Although there are no particular limitations on the silicon particles of the silicon particle dispersions, provided they do not impair the object and effects of the present invention. The silicon particles as indicated in Patent Document 6, for example, can be used. More specifically, examples of these silicon particles include silicon particles obtained by laser pyrolysis, and particularly silicon particles obtained by laser pyrolysis using a $CO_2$ laser.

These silicon particles can be silicon particles composed of a polycrystalline or single crystal core, and an amorphous outer layer. In this case, semiconductor properties attributable to the polycrystalline or single crystal core, and sintering ease attributable to the amorphous outer layer can be utilized in combination.

In addition, the mean primary particle diameter of the silicon particles is preferably 100 nm or less. Thus, the silicon particles are, for example, 1 nm or more, or 5 nm or more; and 100 nm or less, 50 nm or less, or 30 nm or less.

The mean primary particle diameter is preferably 100 nm or less in order to sinter the silicon particles with light.

The silicon particle dispersion used in the method of the present invention may also contain a dopant such as phosphorous or boron and known additives in addition to the dispersion medium and silicon particles.

(Substrate)

There are no particular limitations on the substrate used in the method of the present invention, provided it does not impair the object and effects of the present invention. Thus, a silicon substrate, for example, can be used as the substrate.

However, since a semiconductor silicon film can be formed on the substrate at a relatively low temperature in the method of the present invention, a substrate having relatively low heat resistance, such as a substrate having a polymer material, can be used. A substrate composed of a polymer material provided with an electrically conductive film or semiconductor film on the surface thereof in particular can be used as a substrate having a polymer material. The electrically conductive film can be a film of a metal or metal oxide, and particularly a film of a transparent, electrically conductive oxide such as indium zinc oxide (IZO) or indium tin oxide (ITO). In addition, the semiconductor film can be a semiconductor silicon film.

Since the production method of the present invention can be carried out with a low-temperature process, a polymer material having a glass transition temperature of 300° C. or less, 250° C. or less, 200° C. or less, 100° C. or less, or 50° C. or less can be used as a polymer material for the substrate.

Thus, for example, a polymer material containing at least one type selected from the group consisting of polyimide, polyether sulfone, polycarbonate, polyethylene terephthalate, and polyethylene naphthalate can be used as the polymer material. In addition, a polymer material containing at least one type selected from the group consisting of polycarbonate, polyethylene terephthalate, and polyethylene naphthalate, and particularly ones containing 50% by weight or more of polycarbonate, is preferable, since these polymers are versatile and inexpensive.

(Application)

There are no particular limitations on the method used to apply the silicon particle dispersion, provided it allows the silicon particle dispersion to be applied uniformly at a desired thickness. The application can be carried out by, for example, inkjet printing, spin coating and the like.

In addition, this application can be carried out so that the thickness of the green semiconductor silicon film obtained when the silicon particle dispersion film is dried can be 50 nm or more, 100 nm or more, or 200 nm or more; and 2000 nm or less, 1000 nm or less, 500 nm or less, or 300 nm or less.

More specifically, in the case of obtaining a field effect transistor (FET), for example, application can be carried out so that the thickness of the green film is 50 nm or more, or 100 nm or more; and 500 nm or less, or 300 nm or less. In addition, in the case of obtaining a solar cell, application can be carried out so that the thickness of the green film is 100 nm or more, or 200 nm or more; and 2000 nm or less, 1000 nm or less, 500 nm or less, or 300 nm or less.

<<Steps (b) and (e) of Semiconductor Silicon Film Production Method>>

In steps (b) and (e) of the method of the present invention, a green semiconductor silicon film is formed by drying a silicon particle dispersion film.

(Drying)

There are no particular limitations on this drying, provided a method used can substantially remove dispersion medium from the silicon particle dispersion film. The drying can be carried out by, for example, arranging a substrate having the silicon particle dispersion film on a hot plate.

The drying temperature can be selected so as to not allow deformation, deterioration and the like of the substrate, and can be selected so as to be, for example, 50° C. or higher, 70° C. or higher, or 90° C. or higher; and 100° C. or lower, 150° C. or lower, 200° C. or lower, or 250° C. or lower.

Incidentally, this drying can also be carried out as a step coupled with the application of steps (a) and (d). For example, the application of steps (a) and (d) can be carried out by spin coating, and thereby application and drying can be carried out simultaneously. Namely, drying may be carried out only as a step coupled with application, or drying may be carried out as a separate step from application.

<<Steps (c) and (f) of Semiconductor Silicon Film Production Method>>

In step (c) of the method of the present invention, a semiconductor silicon film is formed by irradiating a green semiconductor silicon film with light to sinter the silicon particles in the green semiconductor silicon film.

(Radiated Light)

Any light can be used as irradiated light, provided it can achieve sintering of the silicon particles in the green silicon particle film. For example, laser light can be used.

The description relating to the first present invention can be referred to with respect to the wavelength of light, the number of light irradiation times, and the irradiation duration in the case of using light irradiation, particularly pulsed light irradiation.

Incidentally, the number of pulsed light irradiation times, the irradiated energy, and the irradiation duration are preferably selected in order to achieve sintering of the silicon particles while inhibiting deterioration of a polymer material by heat, particularly in the case where the substrate has a polymer material.

(Radiating Atmosphere)

Light irradiation for sintering the silicon particles is preferably carried out in a non-oxidizing atmosphere in order to prevent oxidation of the silicon particles. Incidentally, the description relating to the irradiating atmosphere of the first present invention can be referred to with respect to specific non-oxidizing atmospheres.

<<Semiconductor Device Production Method>>

The method of the present invention for producing a semiconductor device such as a field effect transistor (FET) or solar cell comprises producing a semiconductor silicon film by the method of the present invention. The method of the present invention for producing a field effect transistor, for example, can further comprise producing a gate insulator, producing source and drain electrodes, and the like. In addition, the method of the present invention for producing a solar cell, for example, can comprise producing at least one of an N-type and P-type semiconductor or an intrinsic semiconductor by the method of the present invention, forming a collector electrode, and the like.

Fourth Invention

<<Semiconductor Laminate>>

The semiconductor laminate of the present invention has a substrate and a composite silicon film on the substrate, and the composite silicon film has a first silicon layer derived from amorphous silicon and a second silicon layer derived from silicon particles on the first silicon layer.

Incidentally, in the composite silicon layer of the semiconductor laminate of the present invention, the interface between the first silicon layer derived from amorphous silicon and the second silicon layer derived from silicon particles on the first silicon layer is not required to be well-defined, but rather can also have a transition layer of a significant thickness in which the composition between these layers changes gradually.

The height of protrusions of the composite silicon layer in the semiconductor laminate of the present invention can be 100 nm or less, 90 nm or less, 80 nm or less, 70 nm or less, 60 nm or less, or 50 nm or less. Incidentally, in relation to the present invention, the "height of protrusions of the composite silicon layer" refers to the height of protrusions based on flat portions in cross-sectional images observed with an SEM.

The semiconductor laminate of the present invention can be produced by, for example, the method of the present invention.

<<Semiconductor Device>>

The semiconductor device of the present invention has the semiconductor laminate of the present invention. In the case where the semiconductor device of the present invention is a field effect transistor or solar cell, as a result of the composite silicon layer having a flat surface, stable properties can be provided when depositing an insulating layer or electrode and the like on the composite silicon layer.

The semiconductor device of the present invention is, for example, a solar cell.

More specifically, in the case where the semiconductor device of the present invention is a solar cell, a selective emitter-type solar cell or back contact-type solar cell can be obtained by containing a dopant in the composite silicon layer and using this composite silicon layer as a dopant injection layer. Similarly, a solar cell having a back surface electric field (BSF) layer and/or front surface electric field (FSF) layer can be obtained by containing a dopant in the composite silicon layer and using the composite silicon layer as a dopant injection layer.

Incidentally, the description relating to the first present invention can be referred to with respect to the specific configurations of these solar cells.

The semiconductor device of the present invention is, for example, a field effect transistor.

More specifically, in the case where the semiconductor device of the present invention is a field effect transistor, the composite silicon layer of the present invention can be used as an active layer.

<<Semiconductor Laminate Production Method>>

The method of the present invention for producing a semiconductor laminate comprises the following steps:

(a) forming an amorphous silicon layer on a substrate;

(b) applying a silicon particle dispersion onto the amorphous silicon layer and drying the dispersion to form a green laminate in which a silicon particle layer is laminated on the amorphous silicon layer; and (c) irradiating the green laminate with light to form a composite silicon layer having a first silicon layer derived from amorphous silicon and a second silicon layer derived from silicon particles on the first silicon layer.

The semiconductor laminate of the present invention can be produced by the method of the present invention.

Figure 57:
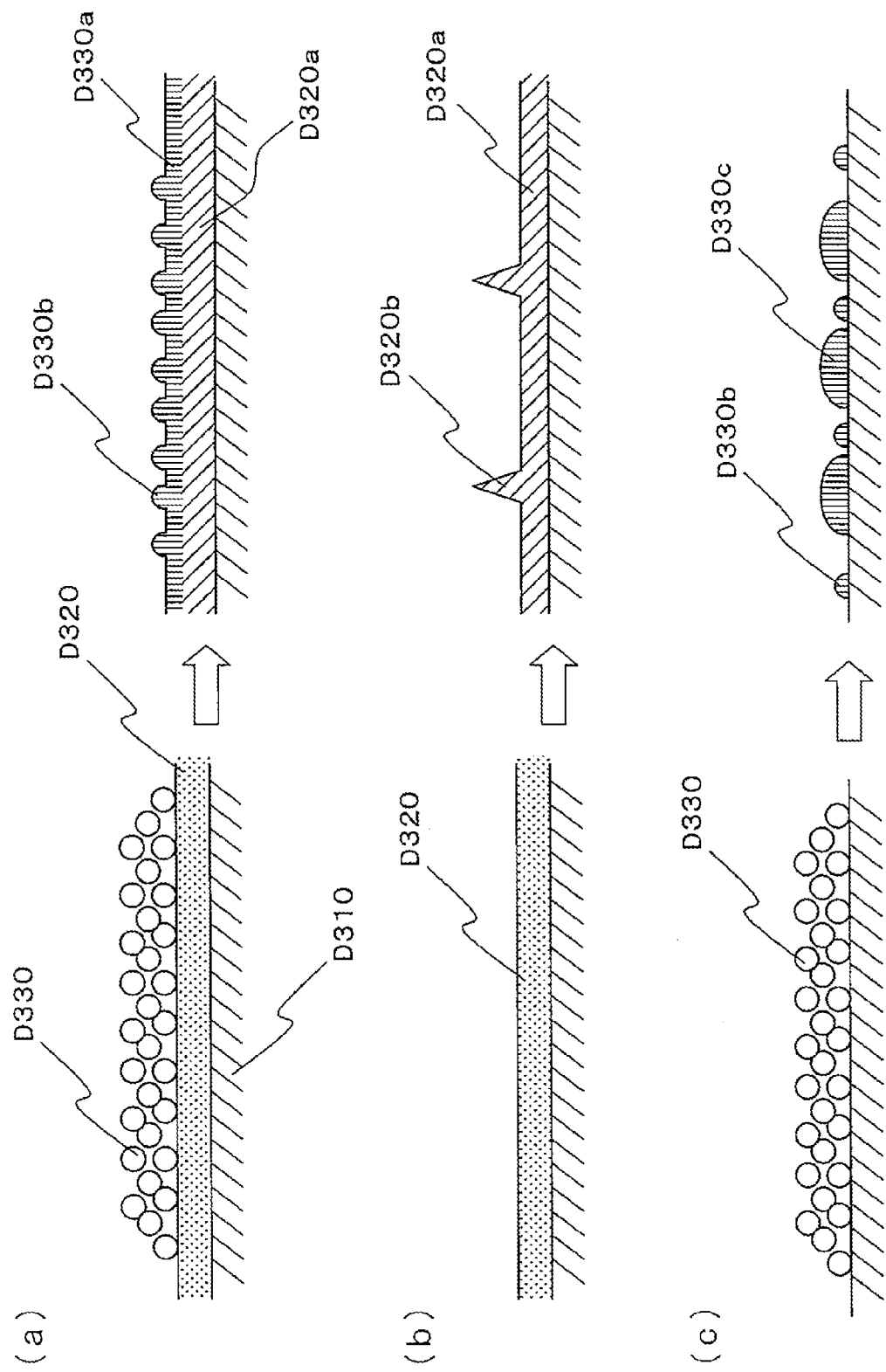
FIG. 57(a) is a drawing for explaining the method of the present invention for producing a semiconductor laminate.
FIG. 57(b) is a drawing for explaining the method for producing a semiconductor laminate by irradiating a sole amorphous silicon layer with light.
FIG. 57(c) is a drawing for explaining a method for producing a semiconductor laminate by irradiating a sole silicon particle layer with light.

One embodiment of the semiconductor laminate obtained by the present invention is shown in FIG. 57(*a*). In the case of having a laminate of an amorphous silicon layer (D320) and a silicon particle layer (D330) on a substrate (D10) (left side of the drawing), fusion or sintering by a laser occurs in both the amorphous silicon layer and the silicon particle layer. Thus, in the case of irradiating with a laser, the silicon particle layer and the amorphous silicon layer are similarly fused, the silicon layer (D320*a*) derived from amorphous silicon and the silicon layer (D330*a*,D330*b*) derived from silicon particles are coalesced to form the composite silicon layer (D320*a*,D330*a*,D330*b*) (right side in the drawing). Accordingly, a semiconductor laminate having a flat surface can be obtained.

Thus, when forming the composite silicon layer, by coalescing the amorphous silicon layer and the silicon particle layer, the time required to form the semiconductor laminate can be shortened. Therefore, even in the case where silicon heating time is restricted due to the pulse width of the laser when fusing or sintering the silicon particles with a pulsed laser and the like, remarkable effects of flattening the surface can be achieved.

In contrast, in the case of producing a semiconductor laminate by irradiating only an amorphous silicon layer with light, protrusions (D320*b*) are formed on the surface as shown in FIG. 57(*b*). This is because, when amorphous silicon layer is fused and then solidified into crystals, solidification occurs at grain boundary triple points in the final stage, and during this solidification at grain boundary triple points, the protrusions (D320*b*) are formed due to volume expansion.

In addition, in the case of producing a semiconductor laminate by irradiating only a silicon particle layer with light, the resulting silicon layer has relatively large particles (D330*c*) formed by sintering of the particles as shown in FIG. 57(*c*), thereby resulting in the surface having large surface irregularities.

Incidentally, in the case of producing a semiconductor laminate by irradiating a laminate having a silicon particle layer and an amorphous silicon layer thereon with light, an air layer may remain in the resulting silicon layer, causing the formation of voids. This is because since voids are formed between deposited silicon particles which are typically spherical, the voids between the silicon particles remain even when an amorphous silicon layer is laminated on the deposited silicon particles, and then the laminated layers are sintered.

<<Step (a) of Semiconductor Laminate Production Method>>

In step (a) of the method of the present invention for producing a semiconductor laminate, an amorphous silicon layer is formed on a substrate.

(Substrate)

There are no particular limitations on the substrate used in the method of the present invention, provided it does not impair the object or effects of the present invention. Thus, for example, a silicon substrate or glass substrate can be used as the substrate.

(Amorphous Silicon Layer)

There are no particular limitations on the amorphous silicon layer used in the method of the present invention, provided it does not impair the object or effects of the present invention. Thus, for example, a layer formed by sputtering or chemical vapor deposition (CVD) can be used.

The thickness of the amorphous silicon layer can be 300 nm or less, 250 nm or less, or 200 nm or less. In addition, the thickness of the amorphous silicon layer can be 10 nm or more, 30 nm or more, 50 nm or more, or 100 nm or more.

<<Step (b) of Semiconductor Laminate Production Method>>

In step (b) of the method of the present invention for producing a semiconductor laminate, an green laminate obtained by laminating a silicon particle layer on an amorphous silicon layer is formed by applying a silicon particle dispersion onto the amorphous silicon layer and drying.

The thickness of the silicon particle layer can be 300 nm or less, 250 nm or less, or 200 nm or less. In addition, the thickness of the silicon particle layer can be 50 nm or more, or 100 nm or more.

(Particles)

There are no particular limitations on the silicon particles contained in the silicon particle dispersion, provided they are particles composed of silicon. Examples of such particles used include silicon particles as indicated in Patent Documents 5 and 6. More specifically, examples of these silicon particles include silicon particles obtained by laser pyrolysis, and particularly silicon particles obtained by laser pyrolysis using a $CO_2$ laser.

The dispersion particles preferably have a relatively small particle size in order to melt and sinter the particles by irradiating with light and form a semiconductor laminate having a flat surface.

For example, the mean primary particle diameter of the particles is preferably 1 nm or more, or 3 nm or more; and 100 nm or less, 30 nm or less, 20 nm or less, or 10 nm or less.

The silicon particles may be doped with a p-type or n-type dopant. The p-type or n-type dopant can be selected from the group consisting of boron (B), aluminum (Al), gallium (Ga), indium (In), titanium (Ti), phosphorous (P), arsenic (As), antimony (Sb) and combinations thereof.

In addition, the doping degree of the silicon particles can be determined dependent on desired dopant concentration in the composite silicon layer as the dopant injection layer, and the substrate. More specifically, the particles can contain dopant at $1 \times 10^{20}$ atoms/cm$^3$ or more, $5 \times 10^{20}$ atoms/cm$^3$ or more, or $1 \times 10^{21}$ atoms/cm$^3$ or more.

(Dispersion Medium)

There are no particular limitations on the dispersion medium of the dispersion, provided it does not impair the object or effects of the present invention. Thus, for example, an organic solvent that does not react with the silicon particles used in the present invention can be used. The dispersion medium is preferably a dehydrated solvent in order to inhibit oxidation of the particles used in the present invention. Incidentally, the description of the first present invention can be referred to with respect to the specific dispersion medium.

<Drying>

There are no particular limitations on this drying, provided a method used can substantially remove dispersion medium from the dispersion. The drying can be carried out by, for example, arranging a substrate having the dispersion on a hot plate, or by arranging it in a heated atmosphere.

The drying temperature can be selected so as to not allow deterioration and the like of the substrate or dispersion particles, and can be selected so as to be, for example, 50° C. or higher, 70° C. or higher, or 90° C. or higher; and 100° C. or lower, 150° C. or lower, 200° C. or lower, or 250° C. or lower.

<<Step (c) of Semiconductor Laminate Production Method>>

In step (c) of the method of the present invention for producing a semiconductor laminate, a composite silicon layer having a first silicon layer derived from amorphous silicon and a second silicon layer derived from silicon particles on the first silicon layer is formed by irradiating the green laminated with light.

(Radiated Light)

Any light can be used as irradiated light, provided it can achieve formation of the composite silicon layer as previously described. Laser light, for example, can be used.

The description relating to the first present invention can be referred to with respect to the wavelength of light, the number of light irradiation times, irradiated energy, and the irradiation duration in the case of using light irradiation, particularly pulsed light irradiation.

(Radiating Atmosphere)

Light irradiation for sintering the dispersion particles is preferably carried out in a non-oxidizing atmosphere in order to prevent oxidation of the dispersion particles. Incidentally, the description relating to the irradiating atmosphere of the first present invention can be referred to with respect to specific non-oxidizing atmospheres.

<<Semiconductor Device Production Method>>

The method of the present invention for producing a semiconductor device such as a field effect transistor (FET) or solar cell comprises producing a semiconductor laminate by the method of the present invention. The method of the present invention for producing a field effect transistor, for example, can further comprise producing a gate insulator, producing source and drain electrodes, and the like.

In addition, in the method of the present invention for producing a solar cell, for example, the composite silicon layer obtained by the method of the present invention can be used to form a selective emitter layer of a selective emitter-type solar cell or a back contact layer of the back contact-type solar cell. In addition, in the method of the present invention for producing a solar cell, the composite silicon layer obtained by the method of the present invention can be used to form a back surface electric field layer or front surface electric field layer.

Fifth Present Invention

<<Semiconductor Laminate Production Method>>

The method of the present invention for producing a semiconductor laminate having a substrate and a semiconductor silicon film laminated thereon comprises the following steps:

(a) applying a silicon particle dispersion containing a dispersion medium and silicon particles dispersed therein onto the surface of a substrate to form a silicon particle dispersion film;

(b) drying the silicon particle dispersion film to form a green silicon film; and (c) irradiating the green silicon film with light to sinter the silicon particles in the green silicon film and thereby form a semiconductor silicon film.

In this method of the present invention, the surface of the substrate has high affinity for molten silicon, for example the contact angle of the molten silicon to the surface of the substrate is 70 degrees or less, and thereby a highly continuous semiconductor silicon film can be formed when the silicon particles are sintered with light.

Figure 65:
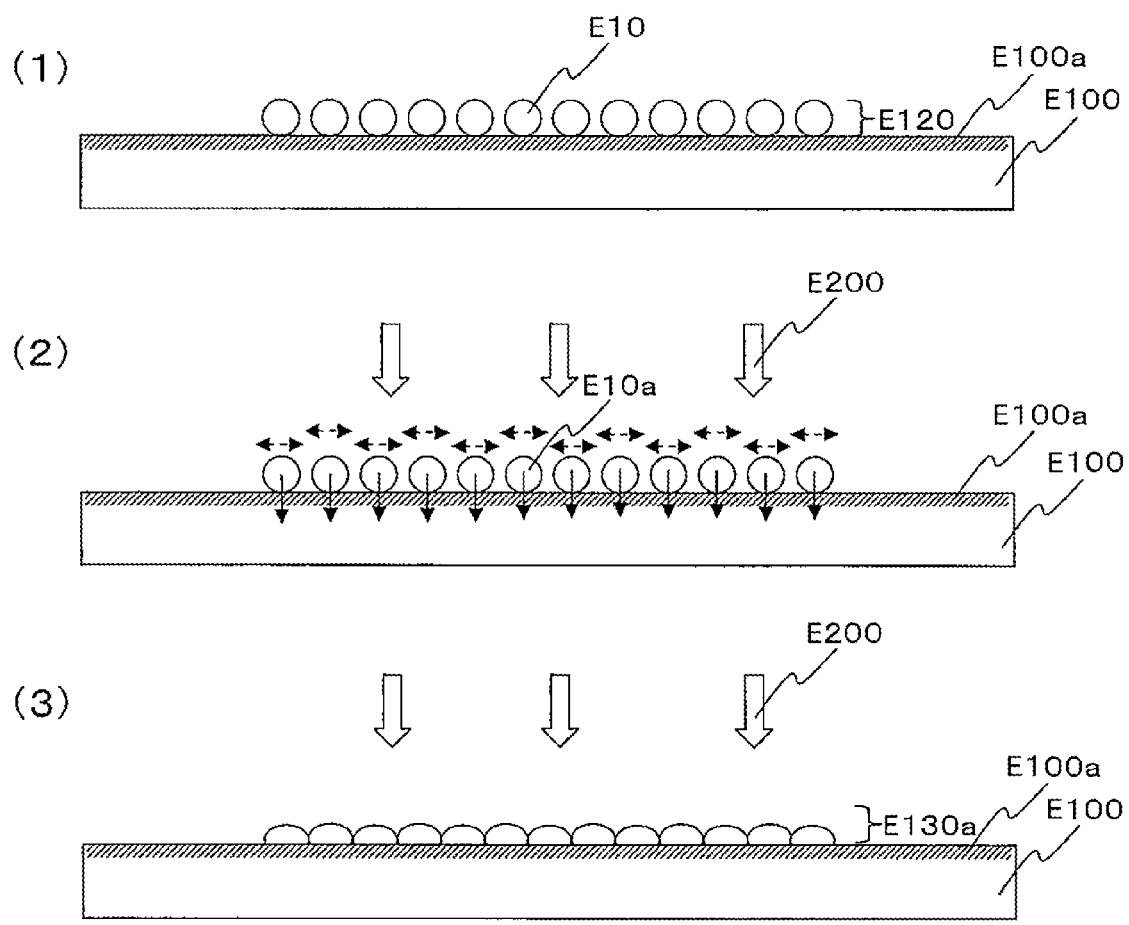
FIG. 65 conceptually indicates the method of the present invention for producing a semiconductor laminate.

Although not limited to the principle thereof, this is thought to be due to a mechanism like that indicated below. Namely, in this method of the present invention as shown in FIG. 65, a green silicon film (E120) composed of silicon particles (E10) is formed on the surface of a substrate (E100) (FIG. 65(1)), and the silicon particles (E10) are melted by irradiating the green silicon film (E120) with light (E200) to obtain molten silicon (E10a) (FIG. 65(2)). At this time, if the surface (E100a) of the substrate has high affinity for the molten silicon (E10a), it is believed that the molten silicon particles wet the substrate surface at that location, and then solidify. In this case, a highly continuous semiconductor silicon film (E130*a*) is thought to be formed, since aggregation of the molten silicon is difficult to progress (FIG. 65(3)).

Figure 66:
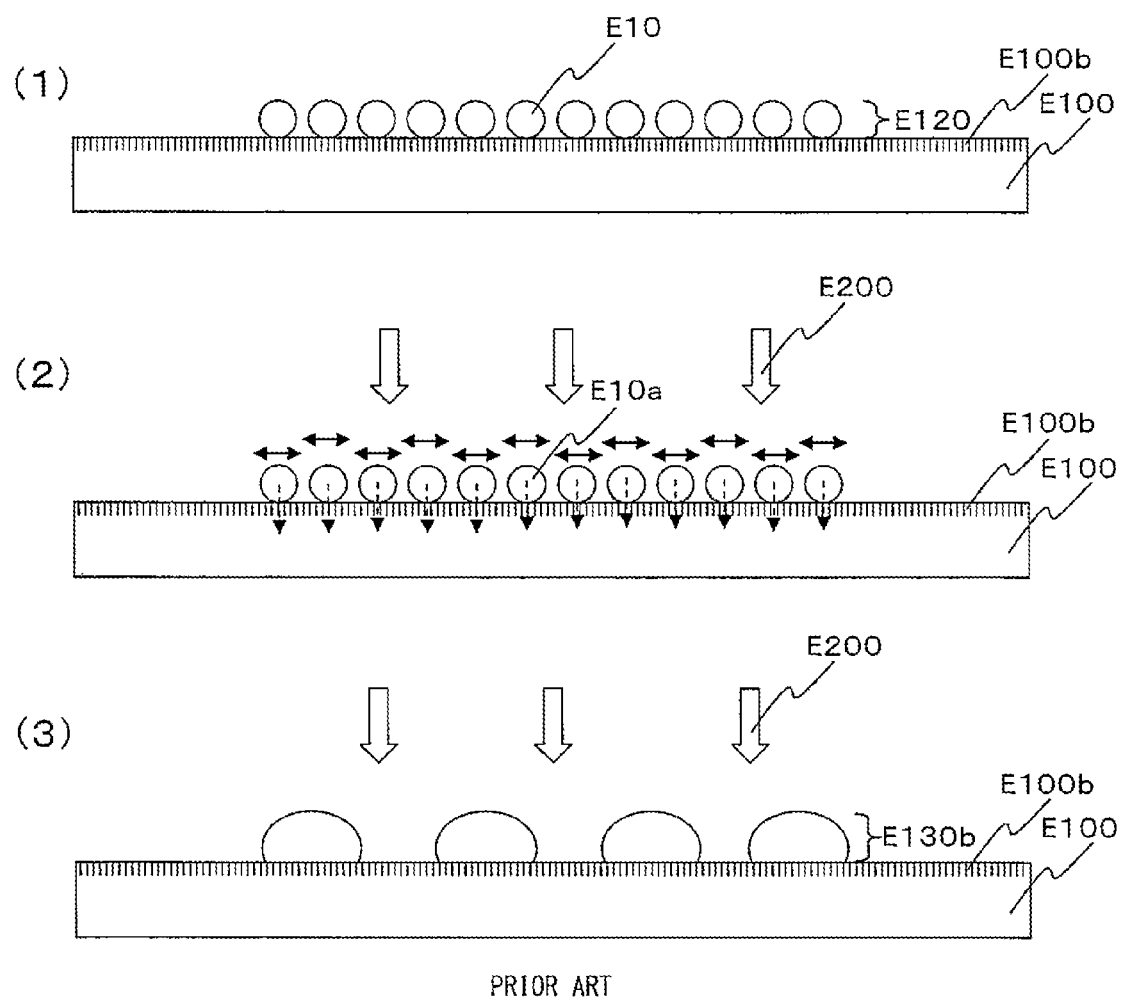
FIG. 66 conceptually indicates the method of the prior art for producing a semiconductor laminate.

In contrast, as shown in FIG. 66, in the case where the surface (E100*b*) of the substrate has low affinity for the molten silicon (E10*a*), the molten silicon particles are thought to migrate easily, and thereby molten silicon particles aggregate and then solidify. In the case where molten silicon particles aggregate in this manner, the semiconductor silicon film is thought to become discontinuous, and as a result thereof, a semiconductor silicon film (E130*b*) having low continuity is thought to be obtained (FIG. 66(3)).

There are no limitations on the substrate surface having high affinity for molten silicon, and the substrate surface can be provided by any material, provided it does not impair the object or effects of the present invention.

The substrate surface having high affinity for molten silicon has a contact angle with the molten silicon of, for example, 70 degrees or less, 60 degrees or less, 50 degrees or less, or 40 degrees or less.

Incidentally, the contact angle with molten silicon is an indicator representing affinity of molten silicon for a substrate, and is defined in degrees as the angle formed between a tangent to liquid droplets of molten silicon and the substrate surface. In relation to the present invention, the contact angle with the molten silicon refers to a contact angle measured in a stable state at 1450° C.

Regarding this, it is described in, for example, "Wettability and reactivity of molten silicon with various substrates", Appl. Phys. A Vol. 78, 617-622 (2004), Yuan, Z. et al. that the contact angle observed when silicon carbide is used as a substrate surface is 8 degrees, while the contact angle observed when silicon oxide is used as a substrate surface is 85 degrees.

In addition, it is described in "Development and evaluation of refractory CVD coatings as contact materials for molten silicon", Journal of Crystal Growth, Volume 50, Issue 1, September 1980, pp. 347-365, M. T. Duffy, et al. and "The effect of oxygen partial pressure on wetting of SiC, AlN and $Si_3N_4$ in Surfaces and Interfaces in Ceramic and Ceramic-Metal Systems", P. J. A. and A. Evans, ed., 1981, pp. 457-466, Barsoum, M. W. et al. that the contact angle observed when using as a substrate surface silicon nitride fabricated by chemical vapor deposition (CVD) is 43 degrees to 50 degrees.

A substrate surface having high affinity for molten silicon is, for example, provided by a material selected from the group consisting of carbides, nitrides, carbonitrides and combinations thereof, and particularly silicon carbide, silicon nitride, silicon carbonitride, graphite and combinations thereof. In relation to the present invention, the substrate surface having high affinity for molten silicon is a material other than silicon.

Incidentally, an example of a material having low affinity for molten silicon is thermally oxidized silicon oxide.

<<Step (a) of Semiconductor Laminate Production Method>>

In step (a) of the method of the present invention, a silicon particle dispersion film is formed by applying a silicon particle dispersion containing a dispersion medium and silicon particles dispersed therein on the surface of a substrate.

(Substrate)

There are no particular limitations on the substrate used in the method of the present invention, provided it does not impair the object and effects of the present invention.

In one aspect thereof, the substrate has a substrate body and surface layer, and the surface layer is made of a material having high affinity for molten silicon. In this case, the thickness of the surface layer is, for example, 30 nm or more, 100 nm or more, or 300 nm or more; and 2,000 nm or less, 1000 nm or less, 700 nm or less, or 500 nm or less.

In this case, the substrate body can be composed of an inorganic material such as doped silicon or undoped silicon.

In addition, in the method of the present invention, since silicon particles are sintered by irradiating with light, heating is limited to the surface and is of extremely short duration. Thus, a substrate body having relatively low heat resistance, such as a substrate body having a polymer material, can also be used.

Thus, examples of polymer materials used include polymer materials containing at least one type selected from the group consisting of polyimide, polyether sulfone, polycarbonate, polyethylene terephthalate and polyethylene naphthalate. Among these, a polymer material containing at least one type selected from the group consisting of polycarbonate, polyethylene terephthalate and polyethylene naphthalate, and particularly ones containing 50% by weight or more of polycarbonate, is preferable, since these polymers are versatile and inexpensive.

In addition, in another aspect thereof, the entire substrate is made of the same material as that of the surface of the substrate.

(Dispersion Medium)

There are no particular limitations on the dispersion medium of the silicon particle dispersion, provided it does not impair the object or effects of the present invention. Thus, for example, an organic solvent that does not react with the silicon particles can be used. The dispersion medium is preferably a dehydrated solvent in order to inhibit oxidation of the silicon particles. Incidentally, the description of the first present invention can be referred to with respect to the specific dispersion medium.

(Silicon Particles)

There are no particular limitations on the silicon particles of the silicon particle dispersion, provided they do not impair the object and effects of the present invention. The silicon particles as indicated in Patent Document 6, for example, can be used. More specifically, examples of these silicon particles include silicon particles obtained by laser pyrolysis, and particularly silicon particles obtained by laser pyrolysis using a $CO_2$ laser.

These silicon particles are silicon particles composed of a polycrystalline or single crystal core, and an amorphous outer layer. In this case, semiconductor properties attributable to the polycrystalline or single crystal core, and sintering ease attributable to the amorphous outer layer can be utilized in combination.

In addition, the mean primary particle diameter of the silicon particles is preferably 100 nm or less. Thus, the silicon particles can be 1 nm or more, or 5 nm or more; and 100 nm or less, 50 nm or less, or 30 nm or less. The mean primary particle diameter is preferably 100 nm or less in order to sinter the silicon particles with light.

The silicon particle dispersion used in the method of the present invention may also contain a dopant such as phosphorous or boron and known additives in addition to the dispersion medium and silicon particles.

(Application)

There are no particular limitations on the method used to apply the silicon particle dispersion provided, it allows the silicon particle dispersion to be applied uniformly at a desired thickness. The application can be carried out by, for example, inkjet printing, spin coating and the like.

In addition, this application can be carried out so that the thickness of the green silicon film obtained when the silicon particle dispersion film is dried is 50 nm or more, 100 nm or more, or 200 nm or more; and 2000 nm or less, 1000 nm or less, 500 nm or less, or 300 nm or less. More specifically, in the case of obtaining a field effect transistor (FET), for example, application can be carried out so that the thickness of the green silicon film is 50 nm or more, or 100 nm or more; and 500 nm or less, or 300 nm or less. In addition, in the case of obtaining a solar cell, application can be carried out so that the thickness of the green silicon film is 100 nm or more, or 200 nm or more; and 2000 nm or less, 1000 nm or less, 500 nm or less, or 300 nm or less.

<<Step (b) of Semiconductor Laminate Production Method>>

In step (b) of the method of the present invention, a green silicon film is formed by drying the silicon particle dispersion film.

(Drying)

There are no particular limitations on this drying, provided a method capable of substantially removing dispersion medium from the silicon particle dispersion film is used. The drying can be carried out by, for example, arranging a substrate having the silicon particle dispersion film on a hot plate.

The drying temperature can be selected so as to not allow deformation, deterioration and the like of the substrate, and can be selected so as to be, for example, 50° C. or higher, 70° C. or higher, or 90° C. or higher; and 200° C. or lower, 400° C. or lower, or 600° C. or lower.

In addition, this drying can also be carried out as a step coupled with the application of step (a). For example, the application of step (a) can be carried out by spin coating, and thereby application and drying can be carried out simultaneously. Namely, drying may be carried out only as a step coupled with application, or drying may be carried out as a separate step from application.

<<Step (c) of Semiconductor Laminate Production Method>>

In step (c) of the method of the present invention, a semiconductor silicon film is formed by irradiating the green silicon film with light to sinter silicon particles in the green silicon film.

(Radiated Light)

Any light can be used as irradiated light, provided it can achieve sintering of the silicon particles in the green silicon film. For example, laser light can be used.

The description relating to the first present invention can be referred to with respect to the wavelength of light, the number of light irradiation times, irradiated energy, and the irradiation duration in the case of using light irradiation, particularly pulsed light irradiation.

Incidentally, the number of pulsed light irradiation times, the irradiated energy, and the irradiation duration are preferably selected in order to achieve sintering of the silicon particles while inhibiting deterioration of a polymer material by heat, particularly in the case where the substrate has a polymer material.

(Radiating Atmosphere)

Light irradiation for sintering the silicon particles is preferably carried out in a non-oxidizing atmosphere in order to prevent oxidation of the silicon particles. Incidentally, the description relating to the irradiating atmosphere of the first present invention can be referred to with respect to specific non-oxidizing atmospheres.

The film thickness of a semiconductor silicon film obtained in this manner can be 50 nm or more, 100 nm or more, or 200 nm or more; and 2000 nm or less, 1000 nm or less, 500 nm or less, or 300 nm or less.

<<Semiconductor Device Production Method>>

The method of the present invention for producing a semiconductor device such as a field effect transistor (FET) or solar cell comprises producing a semiconductor laminate by the method of the present invention. The method of the present invention for producing a field effect transistor, for example, can further comprise producing a gate insulator, producing source and drain electrodes, and the like. In addition, the method of the present invention for producing a solar cell, for example, can comprise producing at least one of an N-type and P-type semiconductor by the method of the present invention, forming a collector electrode, and the like.

<<Semiconductor Laminate and Semiconductor Device of Present Invention>>

The semiconductor laminate of the present invention has a substrate and a semiconductor silicon film laminated on the surface thereof, the semiconductor silicon film is produced from a plurality of mutually sintered silicon particles, and the surface of the substrate has high affinity for molten silicon.

This semiconductor laminate has a highly continuous semiconductor silicon film, and preferable semiconductor properties can be provided as a result thereof.

This semiconductor laminate can be produced by the method of the present invention for producing a semiconductor laminate.

The semiconductor device of the present invention has the semiconductor laminate of the present invention. The semiconductor device of the present invention is, for example, a field effect transistor or solar cell.

Incidentally, in relation to the semiconductor laminate and semiconductor device of the present invention, the description relating to the method of the present invention for producing a semiconductor laminate can be referred to with respect to the substrate, silicon particles, material having high affinity for molten silicon, and the like.

Sixth Present Invention

<<Semiconductor Laminate Production Method>>

The method of the present invention for producing a semiconductor laminate having a substrate and a semiconductor silicon film laminated thereon comprises the following steps:

(a) applying a silicon particle dispersion containing a dispersion medium and silicon particles dispersed therein onto a substrate to form a silicon particle dispersion film;

(b) drying the silicon particle dispersion film to form a green semiconductor silicon film; and (c) irradiating the green semiconductor silicon film with light to sinter the silicon particles in the green semiconductor silicon film and thereby form a semiconductor silicon film.

<<Step (a) of Semiconductor Laminate Production Method>>

In step (a) of the method of the present invention, a silicon particle dispersion film is formed by applying a silicon particle dispersion containing a dispersion medium and silicon particles dispersed therein on a substrate.

(Dispersion Medium)

There are no particular limitations on the dispersion medium of the silicon particle dispersion, provided it does not impair the object or effects of the present invention. Thus, for example, an organic solvent that does not react with the silicon particles can be used. The dispersion medium is preferably a dehydrated solvent in order to inhibit oxidation of the particles used in the present invention. Incidentally, the description of the first present invention can be referred to with respect to the specific dispersion medium.

(Silicon Particles)

There are no particular limitations on the silicon particles of the silicon particle dispersion, provided they do not impair the object and effects of the present invention. The silicon particles as indicated in Patent Document 6, for example, can be used. More specifically, examples of these silicon particles include silicon particles obtained by laser pyrolysis, and particularly silicon particles obtained by laser pyrolysis using a $CO_2$ laser.

These silicon particles can be silicon particles composed of a polycrystalline or single crystal core, and an amorphous outer layer. In this case, semiconductor properties attributable to the polycrystalline or single crystal core, and sintering ease attributable to the amorphous outer layer can be utilized in combination.

In addition, the mean primary particle diameter of the silicon particles is preferably 100 nm or less. Thus, the silicon particles can be 1 nm or more, or 5 nm or more; and 100 nm or less, 50 nm or less, or 30 nm or less. The mean primary particle diameter is preferably 100 nm or less in order to sinter the silicon particles with light.

The silicon particle dispersion used in the method of the present invention may also contain a dopant such as phosphorous or boron and known additives in addition to the dispersion medium and silicon particles.

(Substrate)

There are no particular limitations on the substrate used in the method of the present invention, provided it does not impair the object and effects of the present invention. However, since a semiconductor silicon film can be formed on the substrate at a relatively low temperature in the method of the present invention, a substrate having relatively low heat resistance, such as a substrate having a polymer material, can be used. A substrate composed of a polymer material provided with an electrically conductive film on the surface thereof in particular can be used as a substrate having a polymer material. In addition, the electrically conductive film can be a film of a metal or metal oxide, and particularly a film of a transparent, electrically conductive oxide such as indium zinc oxide (IZO) or indium tin oxide (ITO).

Since the production method of the present invention can be carried out with a low-temperature process, a polymer material having a glass transition temperature of 300° C. or less, 250° C. or less, 200° C. or less, 100° C. or less, or 50° C. or less can be used as a polymer material for the substrate.

Thus, for example, a polymer material containing at least one type selected from the group consisting of polyimide, polyether sulfone, polycarbonate, polyethylene terephthalate and polyethylene naphthalate can be used as the polymer material. In addition, among these, a polymer material containing at least one type selected from the group consisting of polycarbonate, polyethylene terephthalate and polyethylene naphthalate, and particularly ones containing 50% by weight or more of polycarbonate, is preferable, since these polymers are versatile and inexpensive.

(Application)

There are no particular limitations on the method used to apply the silicon particle dispersion, provided it allows the silicon particle dispersion to be applied uniformly at a desired thickness. The application can be carried out by, for example, inkjet printing, spin coating and the like.

In addition, this application can be carried out so that the thickness of the green semiconductor silicon film obtained when the silicon particle dispersion film is dried is 50 nm or more, 100 nm or more, or 200 nm or more; and 2000 nm or less, 1000 nm or less, 500 nm or less, or 300 nm or less. More specifically, in the case of obtaining a field effect transistor (FET), for example, application can be carried out so that the thickness of the green semiconductor silicon film is 50 nm or more, or 100 nm or more; and 500 nm or less, or 300 nm or less. In addition, in the case of obtaining a solar cell, application can be carried out so that the thickness of the green semiconductor silicon film is 100 nm or more, or 200 nm or more; and 2000 nm or less, 1000 nm or less, 500 nm or less, or 300 nm or less.

<<Step (b) of Semiconductor Laminate Production Method>>

In step (b) of the method of the present invention, a green semiconductor silicon film is formed by drying the silicon particle dispersion film.

(Drying)

There are no particular limitations on this drying, provided a method used can substantially remove dispersion medium from the silicon particle dispersion film. The drying can be carried out by, for example, arranging a substrate having the silicon particle dispersion film on a hot plate.

The drying temperature can be selected so as to not allow deformation, deterioration and the like of the substrate, and can be selected so as to be, for example, 50° C. or higher, 70° C. or higher, or 90° C. or higher; and 100° C. or lower, 150° C. or lower, 200° C. or lower, or 250° C. or lower.

<<Step (c) of Semiconductor Laminate Production Method>>

In step (c) of the method of the present invention, a semiconductor silicon film is formed by irradiating the green semiconductor silicon film with light to sinter silicon particles in the green semiconductor silicon film.

(Radiated Light)

Any light can be used as irradiated light, provided it can achieve sintering of the silicon particles in the green semiconductor silicon film. For example, laser light can be used.

The description relating to the first present invention can be referred to with respect to the wavelength of light, the number of light irradiation times, irradiated energy, and the irradiation duration in the case of using light irradiation, particularly pulsed light irradiation.

Incidentally, the number of pulsed light irradiation times, the irradiated energy, and the irradiation duration are preferably selected in order to achieve sintering of the silicon particles while inhibiting deterioration of a polymer material by heat, particularly in the case where the substrate has a polymer material.

(Radiating Atmosphere)

Light irradiation for sintering the silicon particles is preferably carried out in a non-oxidizing atmosphere in order to prevent oxidation of the silicon particles. Incidentally, the description relating to the irradiating atmosphere of the first present invention can be referred to with respect to specific non-oxidizing atmospheres.

<<Additional Step of Semiconductor Laminate Production Method (Second Semiconductor Silicon Film)>>

In addition, the method of the present invention for producing a semiconductor laminate can further comprise the following steps (a') to (c'):

(a') applying a second silicon particle dispersion containing a second dispersion medium and second silicon particles dispersed therein onto the semiconductor silicon film obtained in step (c) to form a second silicon particle dispersion film;

(b') drying the second silicon particle dispersion film to form a second green semiconductor silicon film; and (c') irradiating the second green semiconductor silicon film with light to sinter the second silicon particles in the second green semiconductor silicon film and thereby form a semiconductor silicon film.

In the method of the present invention further comprising steps (a') to (c') in this manner, a semiconductor silicon film having even more superior semiconductor properties can be obtained. Although the present invention is not limited by the principle thereof, it is believe that silicon particles in the second silicon particle dispersion applied and dried in steps (a') and (b') fill voids in the semiconductor silicon film obtained by steps (a) to (c), and then the second silicon particles is sintered in step (c') to become a portion of the semiconductor silicon film, thereby allowing the obtaining of a dense semiconductor silicon film.

Incidentally, the descriptions relating to steps (a) to (c) can be referred to with respect to the details of steps (a') to (c') and materials mentioned therein.

<<Additional Step of Semiconductor Laminate Production Method (Dopant Injection Film)>>

In addition, the method of the present invention for producing a semiconductor laminate can be further comprised of the following steps (a") to (c"):

(a") applying a third silicon particle dispersion containing a third dispersion medium and third silicon particles dispersed therein onto a selected region of the semiconductor silicon film obtained in step (c) or (c') to form a third silicon particle dispersion film, wherein the third silicon particles are doped with a p-type or n-type dopant;

(b") drying the third silicon particle dispersion film to form a green dopant injection film; and (c") irradiating the green dopant injection film with light to sinter the third silicon particles in the green dopant injection film and thereby form a dopant injection film, and to dope the selected region of the semiconductor silicon film with the p-type or n-type dopant.

In the method of the present invention further comprising steps (a") to (c") in this manner, a diffused region can be formed in a selected region without using a photolithography step.

More specifically, the description relating to the first present invention can be referred to with respect to the configurations of a selective emitter-type solar cell and back contact-type solar cell obtained using the method of the present invention.

In the case of fabricating a selective emitter-type solar cell by the method of the present invention, a selective emitter-type solar cell can be fabricated, for example, as shown in FIGS. 3 to 6 in relation to the first present invention.

Figure 70:
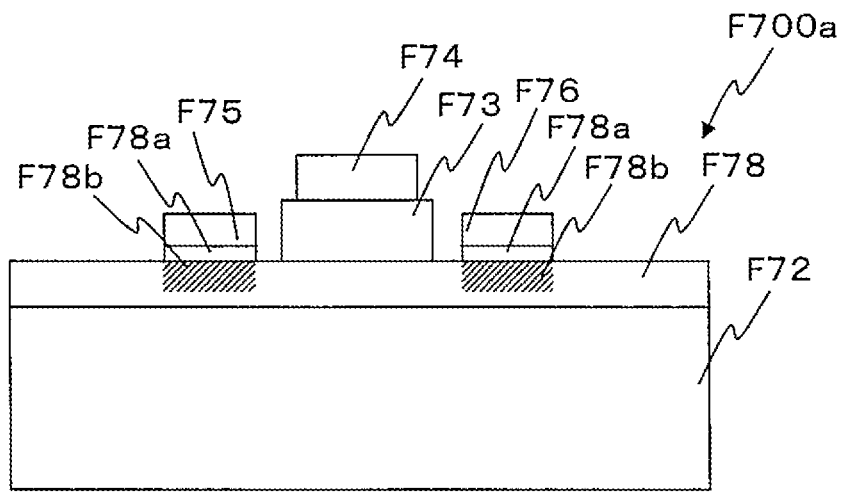
FIG. 70 is a drawing for explaining the field effect transistor of the present invention.
Figure 71:
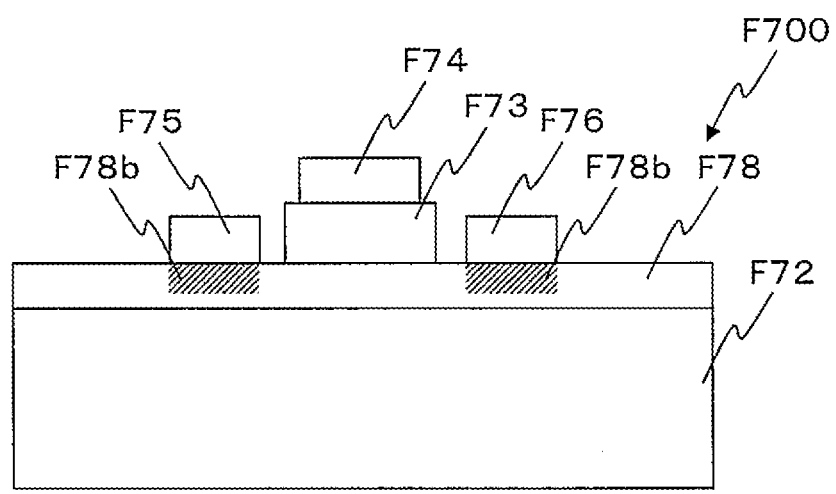
FIG. 71 is a drawing for explaining a field effect transistor of the prior art.

In addition, in a field effect transistor obtained using the method of the present invention, for example, as shown in FIG. 70, the field effect transistor has a substrate (F72), a semiconductor silicon film as a semiconductor layer (F78), a gate insulating film (F73), a gate electrode (F74), a source electrode (F75) and a drain electrode (F76). The semiconductor layer (F78) has doped regions (F78b) doped with an n-type or p-type dopant at those locations where the source and drain electrodes contact semiconductor layer. The dopant concentrations of the doped regions (F78b) are enhanced with a dopant derived from dopant injection films (F78a).

In the case of fabricating the field effect transistor shown in FIG. 70 using the method of the present invention, specific regions can be doped with an n-type or p-type dopant, and a green dopant injection film can be sintered to provide the dopant injections films (F78a) coalesced with the semiconductor layer by applying a dispersion containing particles doped with a dopant to specific regions of the semiconductor layer (F78), drying the layer to form a green dopant injection film, and irradiating this green dopant injection film with light.

Incidentally, in the method of the present invention, together with forming dopant injection films using silicon particles doped with a p-type or n-type dopant, other types of dopant injection films can also be formed using other silicon particles doped with different types of dopants.

The dopant may be a p-type dopant or n-type dopant, and can be selected, for example, from the group consisting of boron (B), aluminum (Al), gallium (Ga), indium (In), titanium (Ti), phosphorous (P), arsenic (As), antimony (Sb) and combinations thereof.

The doping degree of the third silicon particles can be determined dependent on the desired dopant concentrations in the dopant injection film and semiconductor layer or substrate composed of an intrinsic semiconductor element. More specifically, the third silicon particles can contain dopant at, for example, $1\times10^{19}$ atoms/cm$^3$ or more, $1\times10^{20}$ atoms/cm$^3$ or more, $5\times10^{20}$ atoms/cm$^3$ or more, or $1\times10^{21}$ atoms/cm$^3$ or more.

Incidentally, the descriptions relating to steps (a) to (c) can be respectively referred to with respect to the details of steps (a") to (c") and materials mentioned therein.

<<Semiconductor Laminate Production Method (Semiconductor Silicon Film)>>

The carrier mobility of the semiconductor silicon film of the semiconductor laminate produced by the method of the present invention is, for example, 0.1 cm$^2$/V·s or more, 0.5 cm$^2$/V·s or more, 1.0 cm$^2$/V·s or more, 2.0 cm$^2$/V·s or more, 5.0 cm$^2$/V·s or more, or 10.0 cm$^2$/V·s or more. In addition, the on/off ratio of this semiconductor silicon film is, for example, $10^2$ or more, $10^3$ or more, or $10^4$ or more.

<<Semiconductor Device Production Method>>

The method of the present invention for producing a semiconductor device such as a field effect transistor (FET) or solar cell comprises producing a semiconductor laminate by the method of the present invention. The method of the present invention for producing a field effect transistor, for example, can further comprise producing a gate insulator, producing source and drain electrodes, and the like. In addition, the method of the present invention for producing a solar cell, for example, can comprise producing at least one of an N-type and P-type semiconductor by the method of the present invention, forming a collector electrode, and the like.

<<Semiconductor Laminate and Semiconductor Device of Present Invention>>

The semiconductor laminate of the present invention has a substrate having a polymer material, and a semiconductor silicon film laminated thereon. In this semiconductor laminate, the semiconductor silicon film is made of a plurality of mutually connected silicon particles, and the carrier mobility of the semiconductor silicon film is 1.0 cm$^2$/V·s or more.

This semiconductor laminate can provide beneficial semiconductor properties attributable to the semiconductor silicon film, and can have flexibility, light weight and/or low cost as a result of using a substrate having a polymer material as the substrate.

This semiconductor laminate can be produced by the method of the present invention for producing a semiconductor laminate.

The semiconductor device of the present invention has the semiconductor laminate of the present invention. The semiconductor device of the present invention is, for example, a field effect transistor or solar cell.

Incidentally, in relation to the semiconductor laminate and semiconductor device of the present invention, the descriptions relating to the method of the present invention for producing a semiconductor laminate can be referred to with respect to the substrate, silicon particles, carrier mobility, on/off ratio and the like.

EXAMPLES

First Present Invention

Example A1

Fabrication of Boron (B)-Doped Silicon Particles

Silicon particles were fabricated by laser pyrolysis (LP) using a carbon dioxide ($CO_2$) laser and using monosilane ($SiH_4$) gas as the raw material. At this time, $B_2H_6$ gas was introduced together with the $SiH_4$ gas to obtain boron-doped silicon particles.

The doping concentration of the resulting boron-doped silicon particles was $1 \times 10^{21}$ atoms/$cm^3$. In addition, the mean primary particle diameter of the resulting boron-doped silicon particles was about 5.5 nm (maximum particle diameter: 15 nm, minimum particle diameter: 2 nm), and the value of variance was 6 nm. In addition, the degree of crystallization of the resulting boron-doped silicon particles was 5%.

(Preparation of Dispersion)

Boron-doped silicon particles obtained in the above manner were ultrasonically dispersed in isopropyl alcohol (IPA) to obtain a silicon particle dispersion having a solid fraction concentration of 2% by weight.

(Preparation of Substrate)

A phosphorous-doped silicon substrate (thickness: 280 μm, specific resistance: 1 Ωcm to 5 Ωcm) was ultrasonically washed for 5 minutes each in acetone and isopropyl alcohol, followed by removing the oxide film for 10 minutes in a 5% hydrogen fluoride solution and removing the particles with a cleaning solution (Frontier Cleaner, Kanto Chemical Co. Inc.) to prepare a cleaned substrate.

(Coating)

Mending tape was affixed to the substrate over a portion other than a rectangular portion measuring 5 mm×15 mm in the center of the substrate, and thereby define the 5 mm×15 mm portion for deposition of silicon particles. Several drops of the silicon particle dispersion were dropped onto the substrate, followed by spin coating for 5 seconds at 500 rpm and for 10 seconds at 4000 rpm to apply the silicon particle dispersion on the substrate.

(Drying)

Isopropyl alcohol as the dispersion medium of the silicon particle dispersion was dried and removed by locating the substrate coated with the silicon particle dispersion on a hot plate at 70° C., to form a green silicon particle film containing silicon particles (film thickness: 300 nm).

(Light Irradiation)

Next, the green silicon particle film was irradiated with a $YVO_4$ laser (wavelength: 355 nm) using a laser light irradiation apparatus (trade name: Osprey 355-2-0, Quantronix Inc.) to melt and sinter the silicon particles in the green silicon particle film, form a dopant injection layer, and obtain a laminate of the substrate and the dopant injection layer.

The irradiated $YVO_4$ laser had a 73 μm-diameter circular cross section, and the silicon particles were melted and sintered in an argon atmosphere by scanning the laser over the substrate. Laser irradiation conditions were laser energy of 250 mJ/($cm^2$·shot), number of shots of 20, and pulse duration per shot of 30 nanoseconds.

(Evaluation—SEM Analysis)

The observation results of the surface of the fabricated laminate by a field emission scanning electron microscope (FE-SEM) (Model 55200, Hitachi High-Technologies Corp.) are shown in FIG. 9. It can be understood from the observation results that the dopant injection layer is coalesced with the substrate.

(Evaluation—TEM Analysis)

Figure 10:
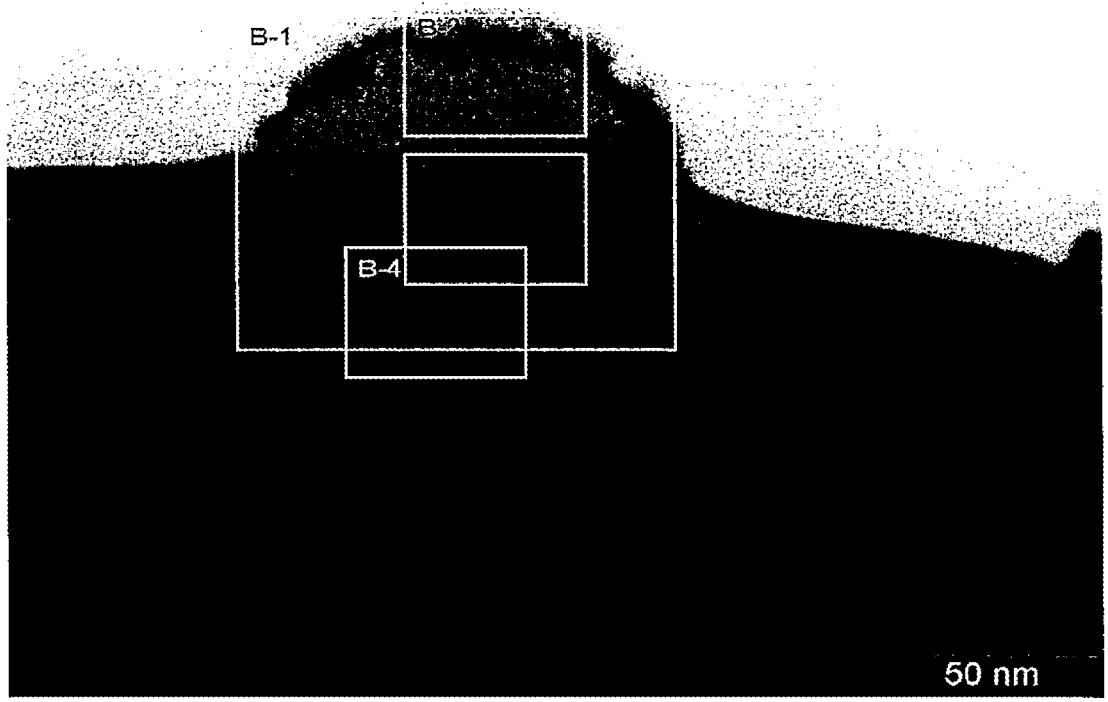
FIG. 10 is TEM (transmission electron microscope) micrograph of a laminate of Example A1.
Figure 11:
FIG. 11 is an enlarged TEM micrograph of a region indicated by B-1 in FIG. 10.
Figure 12:
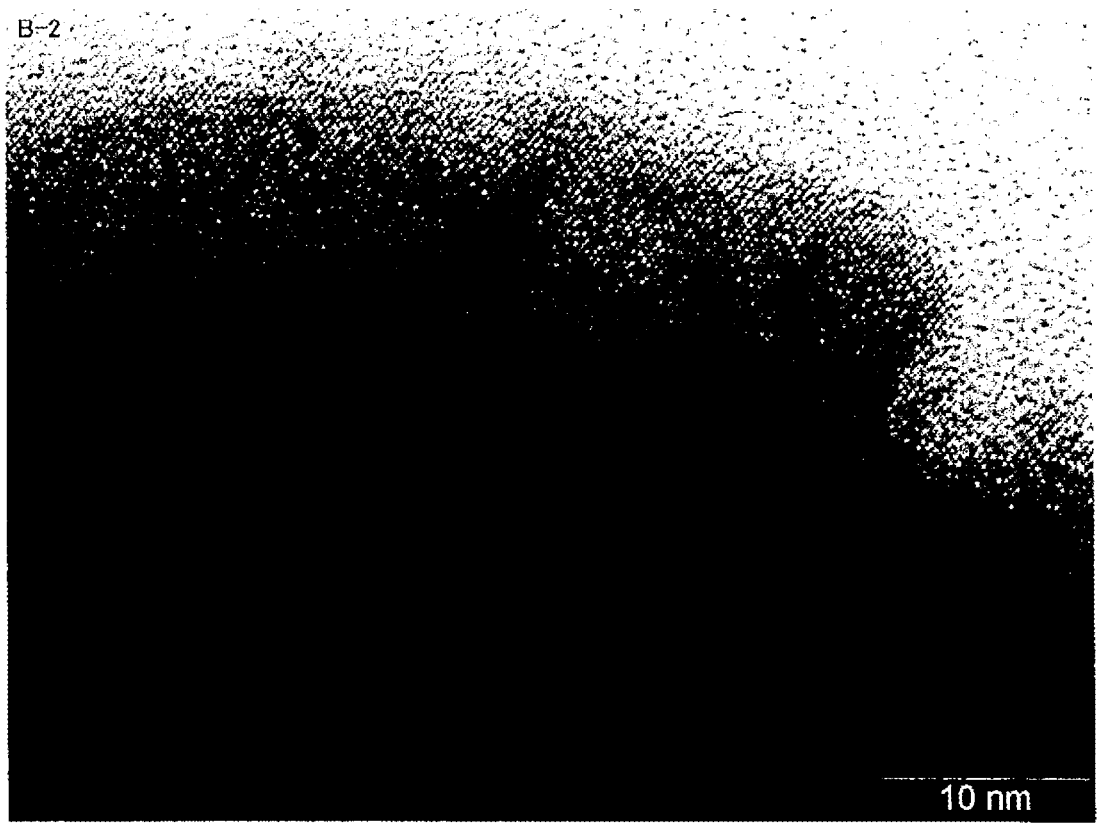
FIG. 12 is an enlarged TEM micrograph of a region indicated by B-2 in FIG. 10.
Figure 13:
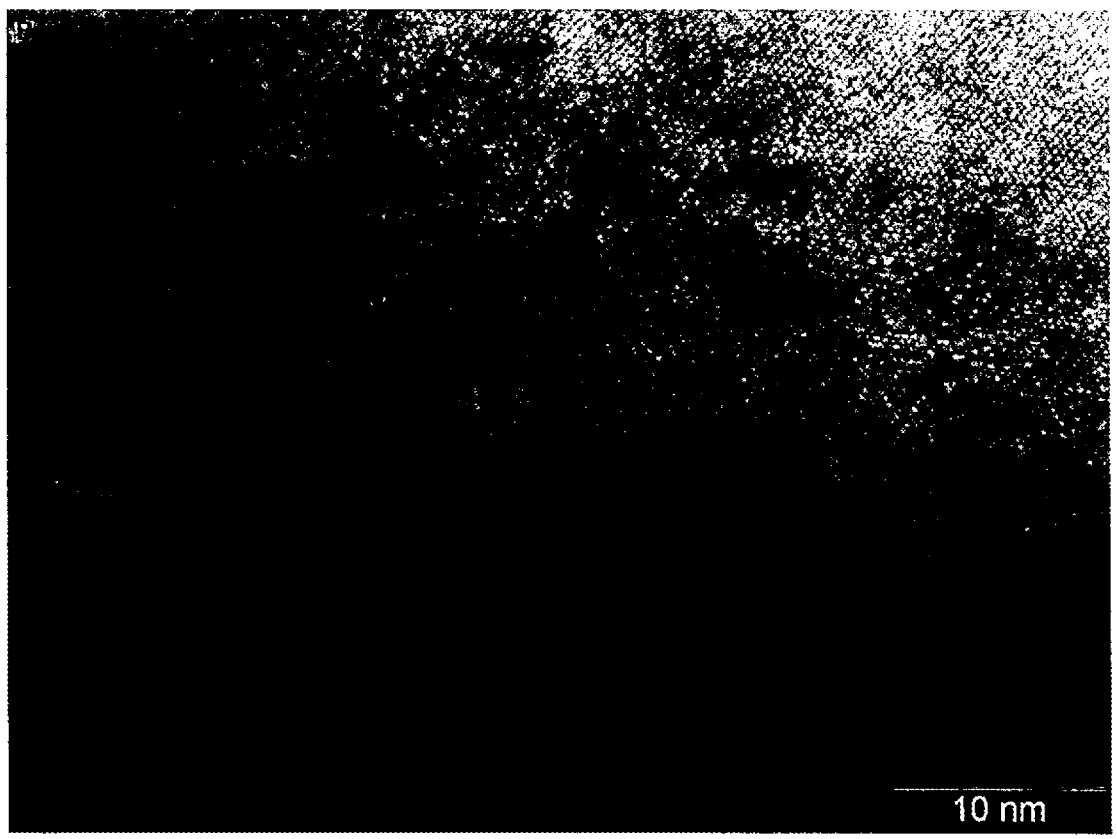
FIG. 13 is an enlarged TEM micrograph of a region indicated by B-3 in FIG. 10.
Figure 14:
FIG. 14 is an enlarged TEM micrograph of a region indicated by B-4 in FIG. 10.

The observation results of the surface of the fabricated laminate with a transmission electron microscope (TEM) (JEM2010, JEOL Ltd.) are shown in FIG. 10. In addition, locations indicated by B1 to B4 in FIG. 10 are shown enlarged in FIGS. 11 to 14. It can be understood from these observation results that the dopant injection layer is coalesced with the substrate, and the crystal orientation of the dopant injection layer is the same as the crystal orientation of the silicon substrate.

(Evaluation—Electron Diffraction Analysis)

Figure 15:
FIG. 15 is an FE-SEM micrograph of a laminate of Example A1.
Figure 16:
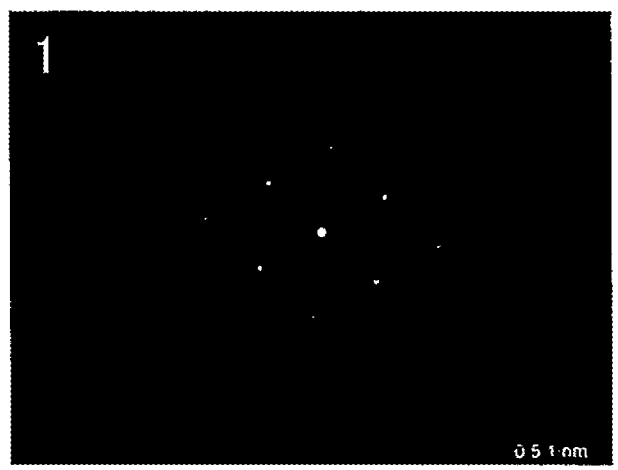
FIG. 16 indicates the results of electron diffraction analysis of a region indicated by reference symbol 1 in FIG. 15.
Figure 17:
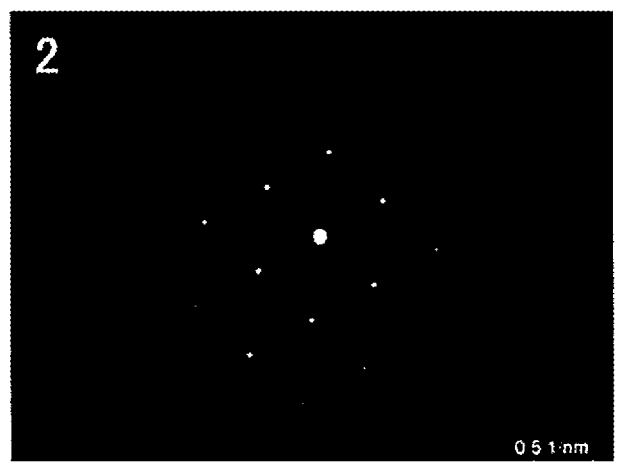
FIG. 17 indicates the results of electron diffraction analysis of a region indicated by reference symbol 2 in FIG. 15.
Figure 18:
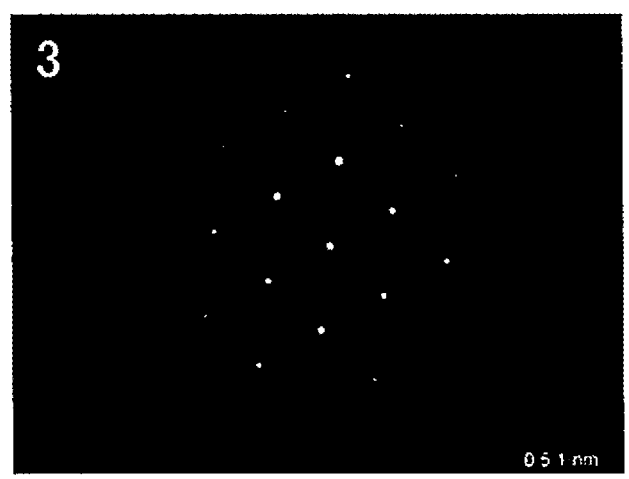
FIG. 18 indicates the results of electron diffraction analysis of a region indicated by reference symbol 3 in FIG. 15.
Figure 19:
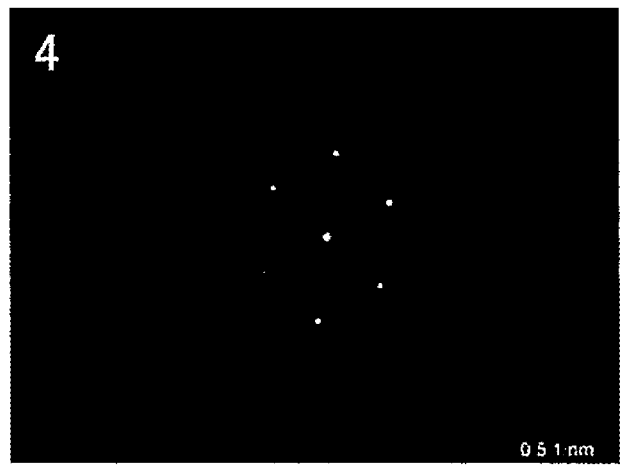
FIG. 19 indicates the results of electron diffraction analysis of a region indicated by reference symbol 4 in FIG. 15.
Figure 20:
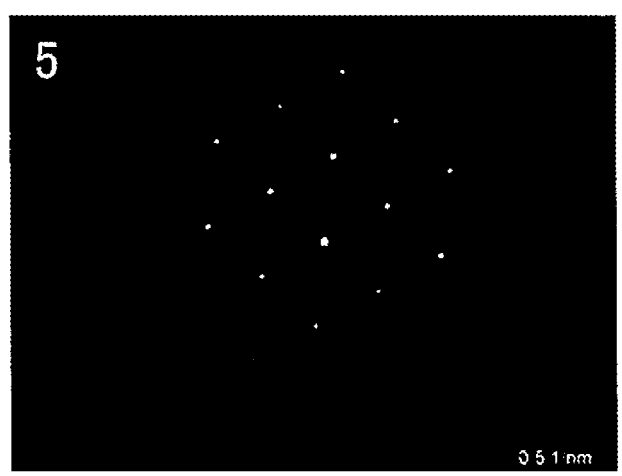
FIG. 20 indicates the results of electron diffraction analysis of a region indicated by reference symbol 5 in FIG. 15.
Figure 21:
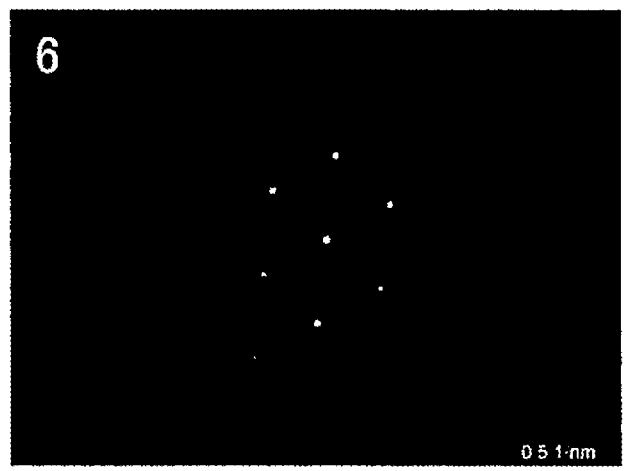
FIG. 21 indicates the results of electron diffraction analysis of a region indicated by reference symbol 6 in FIG. 15.
Figure 22:
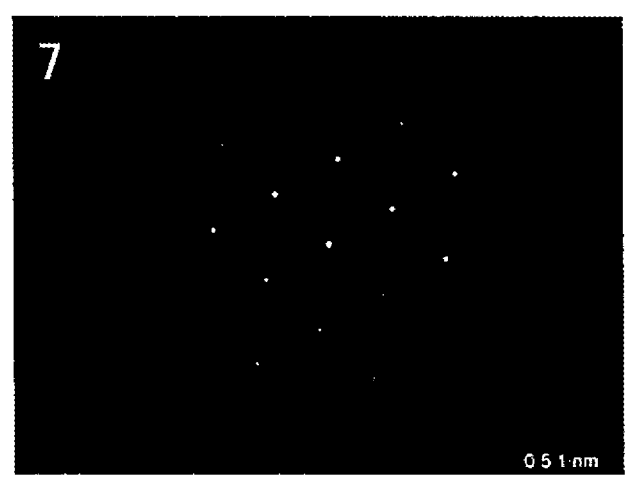
FIG. 22 indicates the results of electron diffraction analysis of a region indicated by reference symbol 7 in FIG. 15.

The observation results of the surface of the fabricated laminate by electron diffraction analysis (feature provided with the JEM2010, JEOL Ltd.) are shown in FIGS. 16 to 22. FIGS. 16 to 22 respectively show the results of electron diffraction analysis for the locations indicated by reference symbols 1 to 7 in the FE-SEM lateral cross-section micrograph shown in FIG. 15. It can be understood from these observation results that the dopant injection layer is coalesced with the substrate, and the crystal orientation of the dopant injection layer is the same as the crystal orientation of the silicon substrate.

(Evaluation—Dynamic SIMS Measurement)

Figure 23:
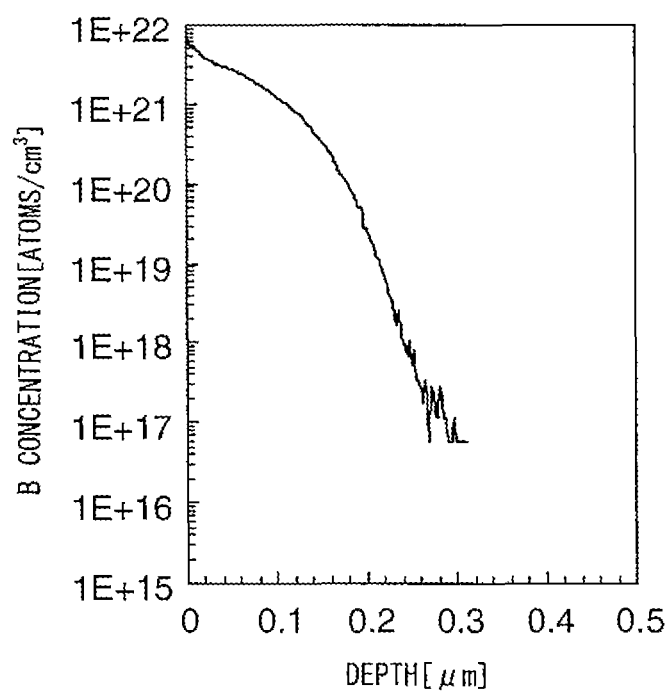
FIG. 23 indicates the results of Dynamic SIMS (secondary ion mass spectrometry) of a laminate of Example A1.

Dynamic secondary ion mass spectrometry (SIMS) was carried out on the fabricated solar cell using the Cameca IMS-7f. Measuring conditions were $O_2^+$ for the primary ion species, primary acceleration voltage of 3.0 kV, and detection region diameter of 30 μm. The results of dynamic SIMS are shown in FIG. 23. It can be understood from the observation results that the substrate was doped by the dopant injection layer with a p-type or n-type dopant derived from the dopant injection layer.

More specifically, the dopant concentration was about $1 \times 10^{21}$ atoms/$cm^3$ or more at a depth of 0.1 μm from the surface of the dopant injection layer, and within a range of $1 \times 10^{19}$ atoms/$cm^3$ to $1 \times 10^{20}$ atoms/$cm^3$ at a depth of 0.3 μm, and particularly at a depth of 0.2 μm, from the surface of the dopant injection layer.

(Evaluation—SCM Measurement)

Measurement of the fabricated laminate with a scanning capacitance microscope (SCM) was carried out using a scanning capacitance microscope (Nanoscope IV, Nihon Veeco K.K.). Measuring conditions were a probe curvature radius of 20 nm to 40 nm, measuring range of 2 μm×2 μm, and scanning rate of 1.0 Hz. The SCM results are shown in FIG. 24. It was confirmed from these observation results that the substrate was doped with the dopant, a p layer was formed in the doped region, and that a depletion layer was formed at the p-n junction interface between an n layer region of the substrate portion and the p layer formed by doping. Accordingly, boron was determined to have been injected from the dopant injection layer by irradiating with laser light.

(Evaluation—Carrier Entrapment)

Figure 25:
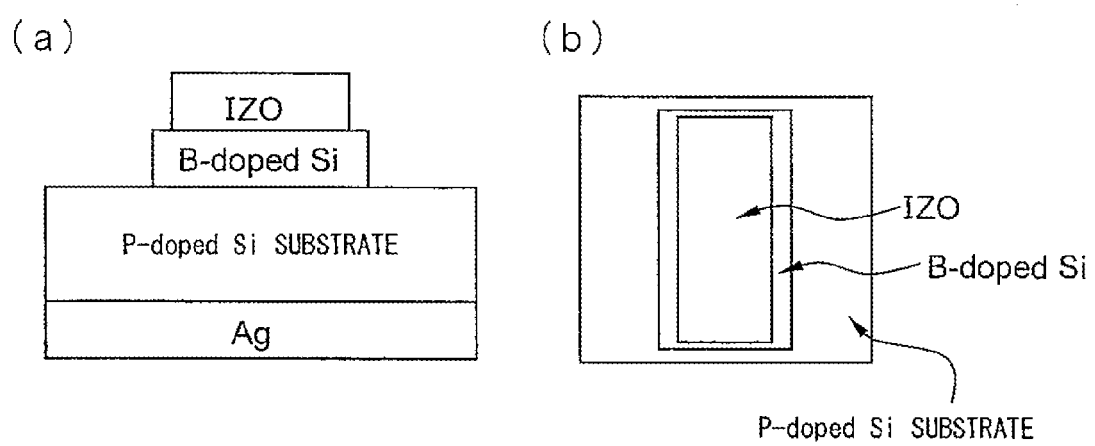
FIG. 25 indicates the configuration of a solar cell fabricated in Example A1 relating to evaluation of carrier entrapment, wherein (a) is a front view and (b) is an overhead view.

The solar cell shown in FIG. 25 was fabricated by forming an IZO thin film (200 nm), on the side coated with a silicon particle dispersion, using a sputtering apparatus; and further forming an Ag electrode, on the back side, using a vapor deposition apparatus.

Figure 26:
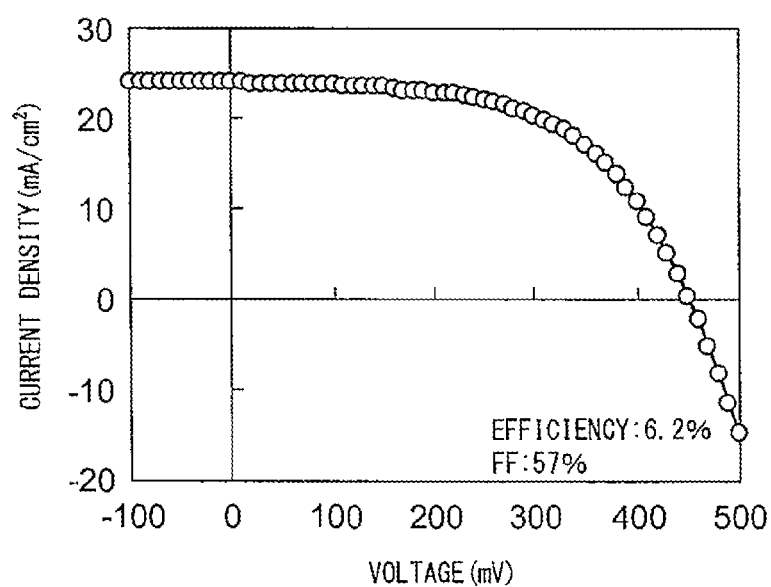
FIG. 26 indicates the results of evaluating I-V (current-voltage) properties of a solar cell fabricated in Example A1.

The I-V (current-voltage) properties of the fabricated solar cell were evaluated using a solar simulator (HAL-320, Asahi Spectra Co., Ltd.). Changes in current flowing between electrodes were investigated by applying a variable voltage of 100 mV to 500 mV between IZO electrodes. The results of evaluating the I-V (current-voltage) properties of this solar cell are shown in Table A1 and FIG. 26. It can be understood from these observation results that the dopant injection layer was coalesced with the substrate, and that the carrier was not significantly trapped at the interface between the dopant injection layer and substrate.

Example A2

Fabrication of Phosphorous (P)-Doped Silicon Particles

Silicon particles were fabricated by laser pyrolysis (LP) using a carbon dioxide ($CO_2$) laser and using monosilane ($SiH_4$) gas as the raw material. At this time, $PH_3$ gas was introduced together with the $SiH_4$ gas to obtain phosphorous-doped silicon particles.

The doping concentration of the resulting phosphorous-doped silicon particles was $1 \times 10^{21}$ atoms/cm$^3$. In addition, the mean primary particle diameter of the resulting phosphorous-doped silicon particles was about 8.0 nm (maximum particle diameter: 16 nm, minimum particle diameter: 4 nm), and the value of variance was 4.3 nm. In addition, the degree of crystallization of the resulting phosphorous-doped silicon particles was 12%.

(Preparation of Dispersion)

Phosphorous-doped silicon particles obtained in the above manner were ultrasonically dispersed in isopropyl alcohol (IPA) to obtain a silicon particle dispersion having a solid fraction concentration of 1% by weight.

(Preparation of Substrate)

A boron-doped silicon substrate (thickness: 280 μm, specific resistance: 1 Ωcm to 5 Ωcm) was ultrasonically washed for 5 minutes each in acetone and isopropyl alcohol, followed by removing the oxide film for 10 minutes in a 5% hydrogen fluoride solution and removing the particles with a cleaning solution (Frontier Cleaner, Kanto Chemical Co. Inc.) to prepare a cleaned substrate.

(Coating)

The silicon particle dispersion was coated onto the substrate in the same manner as Example A1.

(Drying)

The green silicon particle film was formed in the same manner as Example A1. However, the film thickness of the resulting green silicon particle film in this case was 100 nm.

(Light Irradiation)

Next, the green silicon particle film was irradiated with a $YVO_4$ laser (wavelength: 355 nm) using a laser light Irradiation apparatus (trade name: Osprey 355-2-0, Quantronix Inc.) to melt and sinter the silicon particles in the green silicon particle film, form a dopant injection layer, and obtain a laminate of the substrate and the dopant injection layer.

The irradiated $YVO_4$ laser had a 73 μm-diameter circular cross section, and the silicon particles were sintered in an argon atmosphere by scanning the laser over the substrate. Laser irradiation conditions were irradiated energy of 400 mJ/(cm$^2$·shot), number of shots of 20, and irradiation duration per shot of 30 nanoseconds.

(Evaluation—SEM Analysis)

The observation results of the surface of the fabricated laminate with an FE-SEM (Model 55200, Hitachi High-Technologies Corp.) are shown in FIG. 27. It can be understood from the observation results that the dopant injection layer is coalesced with the substrate.

(Evaluation—Dynamic SIMS Measurement)

Figure 28:
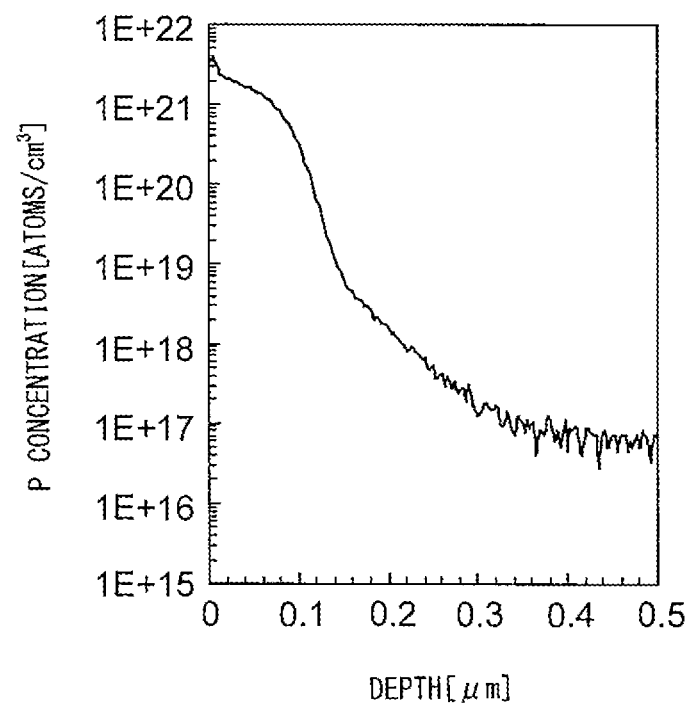
FIG. 28 indicates the results of Dynamic SIMS (secondary ion mass spectrometry) of a laminate of Example A2.

Dynamic secondary ion mass spectrometry (SIMS) measurement was carried out on the fabricated laminate using the Cameca IMS-7f. Measuring conditions were $O_2^+$ for the primary ion species, primary acceleration voltage of 10.0 kV, and detection region diameter of 60 μm. The results of dynamic SIMS are shown in FIG. 28. It can be understood from the observation results that the substrate was doped by the dopant injection layer with a p-type or n-type dopant derived from the dopant injection layer.

More specifically, the dopant concentration was within the range $1 \times 10^{20}$ atoms/cm$^3$ to $1 \times 10^{21}$ atoms/cm$^3$ at a depth of 0.1 μm from the surface of the dopant injection layer, and within a range of $1 \times 10^{18}$ atoms/cm$^3$ to $1 \times 10^{19}$ atoms/cm$^3$ at a depth of 0.3 μm, and particularly at a depth of 0.2 μm, from the surface of the dopant injection layer.

(Evaluation—SCM Measurement)

Measurement of the fabricated laminate with an SCM was carried out using a scanning capacitance microscope (Nanoscope IV, Nihon Veeco K.K.). Measuring conditions were a probe curvature radius of 20 nm to 40 nm, measuring range of 2 μm×2 μm, and scanning rate of 1.0 Hz. The SCM results are shown in FIG. 29. It was confirmed from these observation results that the substrate was doped with the dopant, that an n layer was formed in the doped region, and that a depletion layer was formed at the p-n junction interface between an n layer region of the substrate portion and an n layer formed by doping. Accordingly, phosphorous was determined to have been injected from the silicon particle dispersion by irradiating with laser light.

(Evaluation—Carrier Entrapment)

Figure 30:
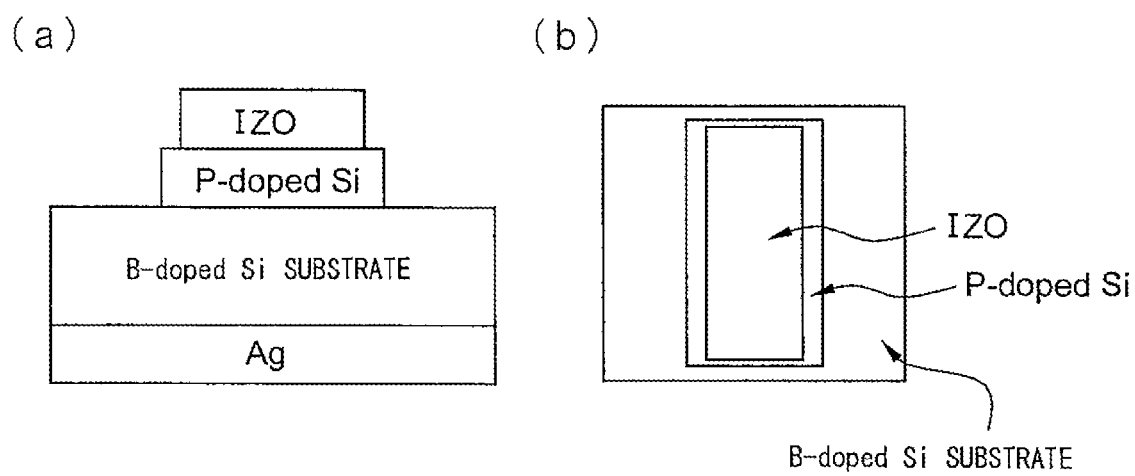
FIG. 30 indicates the configuration of solar cells fabricated in Example A2 and Comparative Example A1 relating to evaluation of carrier entrapment, wherein (a) is a front view and (b) is an overhead view.

The solar cell shown in FIG. 30 was fabricated by forming an IZO thin film (200 nm), on the side coated with a silicon particle dispersion, using a sputtering apparatus; and further forming an Ag electrode, on the back side, using a vapor deposition apparatus.

Figure 31:
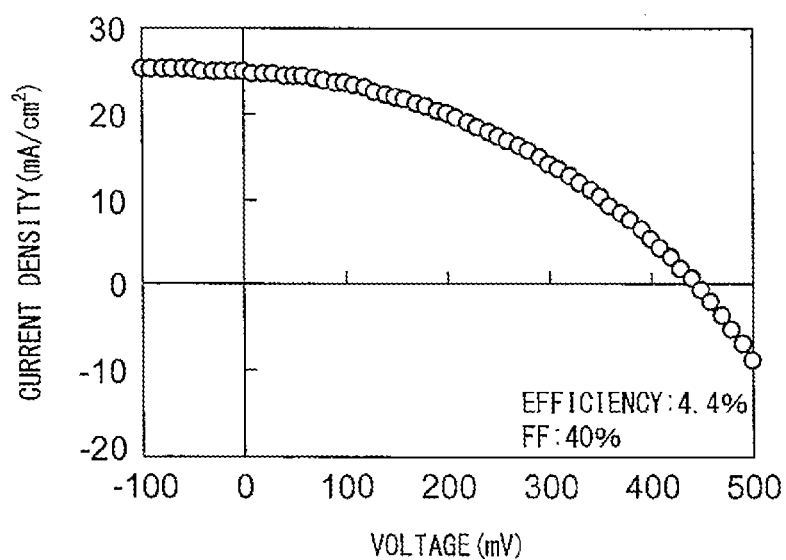
FIG. 31 indicates the results of evaluating I-V (current-voltage) properties of a solar cell fabricated in Example A2.

The I-V (current-voltage) properties of the fabricated solar cell were evaluated using a solar simulator (HAL-320, Asahi Spectra Co., Ltd.). Changes in current flowing between electrodes were investigated by applying a variable voltage of 100 mV to 500 mV between IZO electrodes. The results of evaluating the I-V (current-voltage) properties of this solar cell are shown in Table A1 and FIG. 31. It can be understood from these observation results that the dopant injection layer was coalesced with the substrate, and that the carrier was not significantly trapped at the interface between the dopant injection layer and substrate.

Comparative Example A1

Phosphorous (P)-Doped Silicon Particles

Phosphorous-doped silicon particles having a mean primary particle diameter of 20.0 nm (maximum particle diameter: 42 nm, minimum particle diameter: 7 nm) and particle size distribution variance of 35.5 nm were used. The degree of crystallization of the phosphorous-doped silicon particles was 49%.

(Preparation of Dispersion)

The phosphorous-doped silicon particles were ultrasonically dispersed in isopropyl alcohol (IPA) to obtain a silicon particle dispersion having a solid fraction concentration of 2% by weight.

(Preparation of Substrate)

A cleaned boron-doped silicon substrate was prepared in the same manner as Example A2.

(Application)

The silicon particle dispersion was coated onto the substrate in the same manner as Examples A1 and A2.

(Drying)

A green silicon particle film was formed in the same manner as Examples A1 and A2. However, the film thickness of the resulting green silicon particle film in this case was 300 nm.

(Light Irradiation)

Next, the green silicon particle film was irradiated with a $YVO_4$ laser (wavelength: 355 nm) using a laser light irradiation apparatus (trade name: Osprey 355-2-0, Quantronix Inc.) to melt and sinter the silicon particles in the green silicon particle film, form a dopant injection layer, and obtain a laminate of the substrate and the dopant injection layer.

The irradiated $YVO_4$ laser had a 73 μm-diameter circular cross section, and the silicon particles were sintered in an argon atmosphere by scanning the laser over the substrate. Laser irradiation conditions were irradiated energy of 250 mJ/(cm²·shot), number of shots of 30, and pulse duration per shot of 30 nanoseconds.

(Evaluation—SEM Analysis)

The observation results of the surface of the fabricated laminate with an FE-SEM (Model 55200, Hitachi High-Technologies Corp.) are shown in FIG. 32. It can be understood from the observation results that silicon particles of the dopant injection layer maintained their shape, and that the dopant injection layer was not coalesced with the substrate.

(Evaluation—Carrier Entrapment)

The solar cell shown in FIG. 30 was fabricated by forming an IZO thin film (200 nm), on the side coated with a silicon particle dispersion, using a sputtering apparatus; and further forming an Ag electrode, on the back side, using a vapor deposition apparatus.

Figure 33:
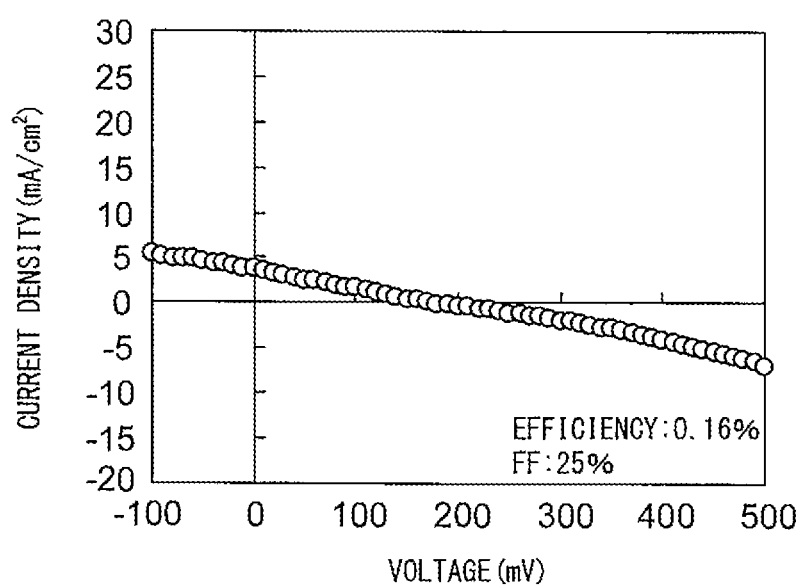
FIG. 33 indicates the results of evaluating I-V (current-voltage) properties of a solar cell fabricated in Comparative Example A1.

The I-V (current-voltage) properties of the fabricated solar cell were evaluated using a solar simulator (HAL-320, Asahi Spectra Co., Ltd.). Changes in current flowing between electrodes were investigated by applying a variable voltage of 100 mV to 500 mV between IZO electrodes. The results of evaluating the I-V (current-voltage) properties of this solar cell are shown in Table A1 and FIG. 33.

TABLE A1

| | Substrate | Si film thickness before irradiating with light (nm) | Laser Irradiated energy (mJ/cm²) | Conversion efficiency (%) | Short circuit current density (mA/cm²) | Open circuit voltage (mV) |
|---|---|---|---|---|---|---|
| Ex. A1 | P-doped Si | 300 | 250 | 6.17 | 24 | 451 |
| Ex. A2 | B-doped Si | 100 | 400 | 4.36 | 24.8 | 444 |
| Comp. Ex. A1 | B-doped Si | 300 | 250 | 0.16 | 3.68 | 178 |

Example A3

Fabrication of Phosphorous (P)-Doped Silicon Particles

Silicon particles were fabricated by laser pyrolysis (LP) using a carbon dioxide ($CO_2$) laser and using monosilane ($SiH_4$) gas as the raw material. At this time, $PH_3$ gas was introduced together with the $SiH_4$ gas to obtain phosphorous-doped silicon particles.

The doping concentration of the resulting phosphorous-doped silicon particles was $1 \times 10^{21}$ atoms/cm³. In addition, the mean primary particle diameter of the resulting phosphorous-doped silicon particles was about 7.0 nm.

(Preparation of Dispersion)

Phosphorous-doped silicon particles obtained in the above manner were ultrasonically dispersed in isopropyl alcohol (IPA) to obtain a silicon particle dispersion having a solid fraction concentration of 2% by weight.

(Preparation of Substrate)

A phosphorous (P)-doped silicon substrate (thickness: 280 specific resistance: 5 Ωcm or less) was ultrasonically washed for 5 minutes each in acetone and isopropyl alcohol, followed by removing the particles with a cleaning solution (Frontier Cleaner, Kanto Chemical Co. Inc.) and subsequently removing the oxide film for 10 minutes in a 5% hydrogen fluoride solution to prepare a cleaned substrate.

(Coating)

The silicon particle dispersion was coated on the substrate by dropping several drops of the silicon particle dispersion onto the substrate, followed by spin coating for 5 seconds at 500 rpm and for 10 seconds at 4000 rpm.

(Drying)

A green silicon particle film was formed in the same manner as Example A1. However, the film thickness of the resulting green silicon particle film in this case was 200 nm.

(Light Irradiation)

Next, the green silicon particle film was irradiated with a $YVO_4$ laser (wavelength: 355 nm) in an argon atmosphere using a laser light irradiation apparatus (trade name: Osprey 355-2-0, Quantronix Inc.) to sinter the green silicon particle film, form a dopant injection layer, and obtain a laminate of the substrate and the dopant injection layer.

Coating, drying and light irradiation were carried out in the same manner on the back side of the substrate to form a dopant injection layer on the back side of the substrate.

The irradiated $YVO_4$ laser had a 100 μm-diameter circular cross section, and the silicon particles were melted and sintered in an argon atmosphere by scanning the laser over the substrate. Laser irradiation conditions were irradiated energy of 500 mJ/($cm^2$·shot), number of shots of 20, and pulse duration of 30 nanoseconds/shot.

(Evaluation—Lifetime Measurement)

The lifetime of the fabricated laminate was observed with a lifetime tester (WT-2000, Semilab Semiconductor Physics Laboratory Co., Ltd.).

According to this measurement, the lifetime observed in the silicon substrate having dopant injection layers deposited on both sides was 107 μsec, while the lifetime observed in the untreated silicon substrate after washing was 9 μsec. It can be understood from these measurement results that lifetime is improved by forming a dopant injection layer on the surface of the silicon substrate using a silicon particle dispersion.

(Evaluation—Dynamic SIMS Analysis)

Dynamic secondary ion mass spectrometry (SIMS) was carried out on the silicon substrate having dopant injection layers using the Cameca IMS-7f. Measuring conditions were $O_2^+$ for the primary ion species, primary acceleration voltage of 3.0 kV, and detection region diameter of 30 μm.

Figure 35:
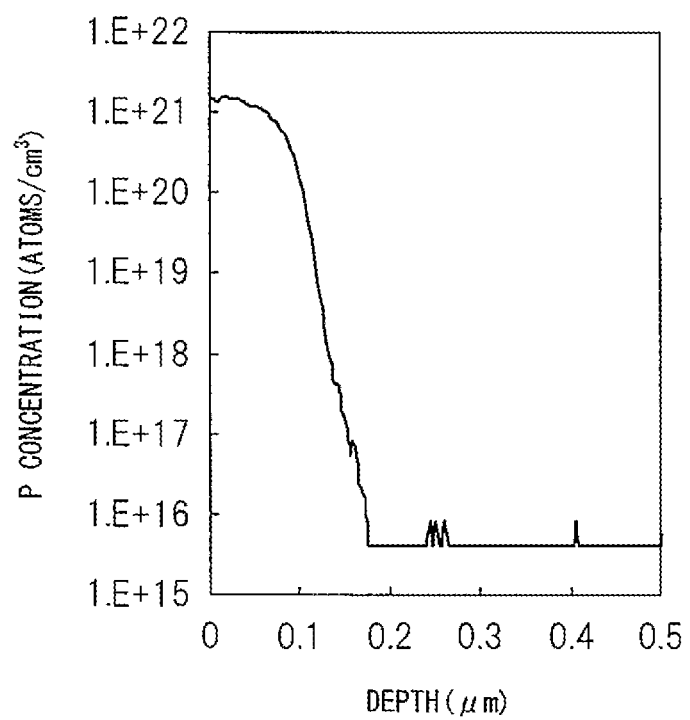
FIG. 35 indicates the results of Dynamic SIMS (secondary ion mass spectrometry) of a laminate of Example A3.

The results of dynamic SIMS are shown in FIG. 35. It can be understood from the observation results that a high concentration dopant injection layer was formed on the surface of the silicon substrate. More specifically, the dopant concentration was $1 \times 10^{20}$ atoms/$cm^3$ or more at a depth of 0.1 μm from the surface of the dopant injection layer, and $1 \times 10^{16}$ atoms/$cm^3$ or less at a depth of 0.3 μm, and particularly at a depth of 0.2 μm, from the surface of the dopant injection layer.

(Evaluation—SEM Analysis)

The observation results of the surface of the fabricated laminate by a field emission scanning electron microscope (FE-SEM) (Model 55200, Hitachi High-Technologies Corp.) are shown in FIG. 36. It can be understood from the observation results that the dopant injection layer is coalesced with the substrate.

(Evaluation—TEM Analysis)

Figure 37:
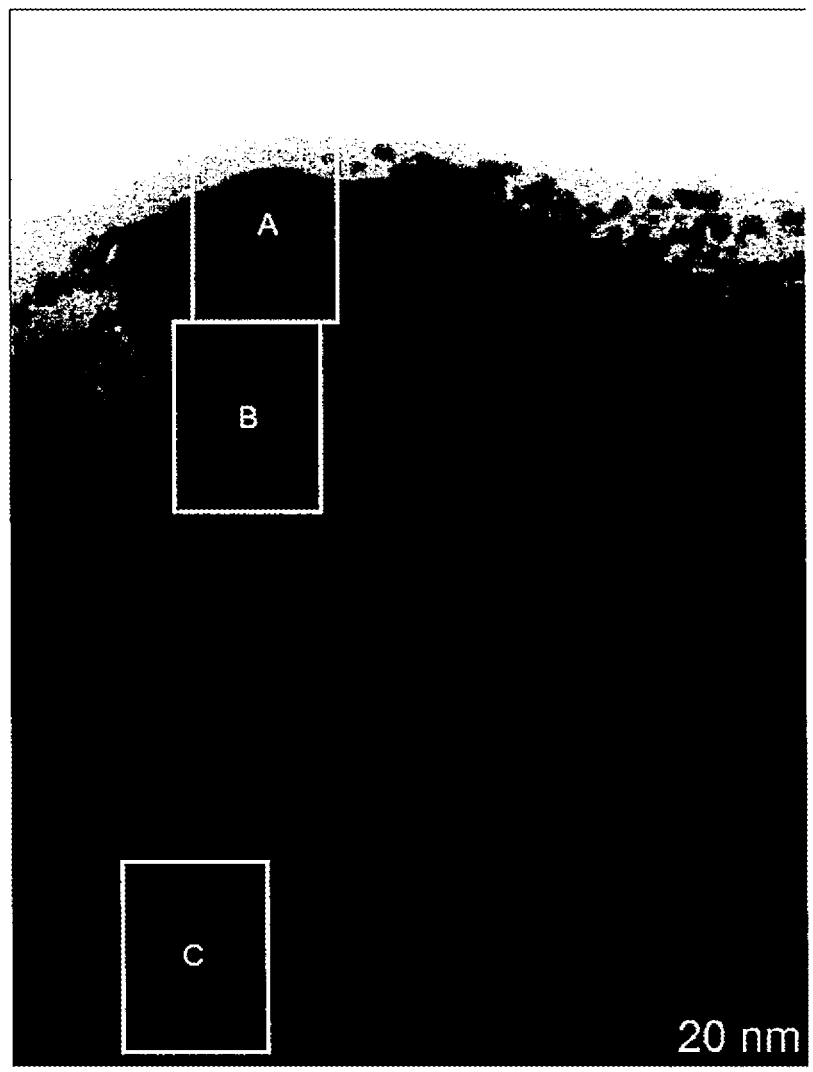
FIG. 37 is an enlarged TEM (transmission electron microscope) micrograph of a laminate of Example A3.
Figure 38:
FIG. 38 is an enlarged TEM micrograph of a region indicated by A in FIG. 37.
Figure 39:
FIG. 39 is an enlarged TEM micrograph of a region indicated by B in FIG. 37.
Figure 40:
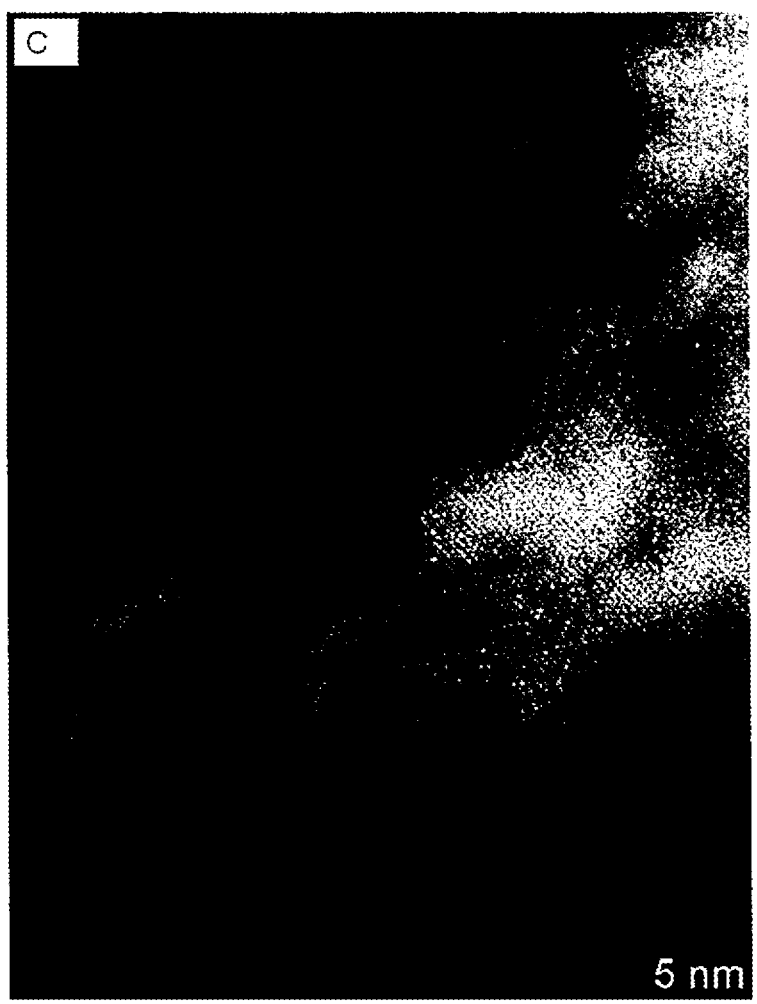
FIG. 40 is an enlarged TEM micrograph of a region indicated by C in FIG. 37.
Figure 41:
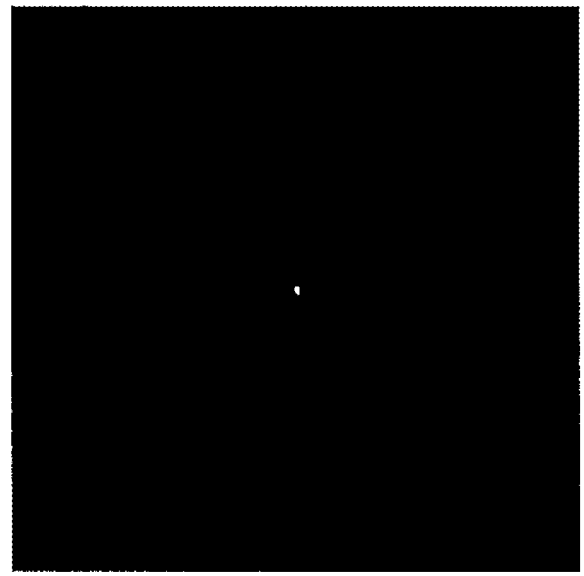
FIG. 41 indicates the results of electron diffraction analysis of a region indicated by A in FIG. 37.

The observation results of the surface of the fabricated laminate with a transmission electron microscope (TEM) (JEM2010, JEOL Ltd.) are shown in FIG. 37. In addition, locations indicated by A-1 to A-4 in FIG. 37 are shown enlarged in FIGS. 38 to 41. It can be understood from these observation results that the dopant injection layer is coalesced with the substrate, and the crystal orientation of the dopant injection layer is the same as the crystal orientation of the silicon substrate.

(Evaluation—Electron Diffraction Analysis)

Figure 42:
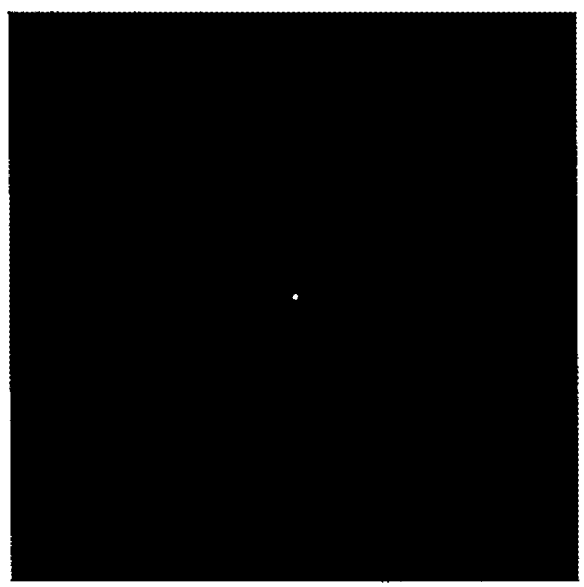
FIG. 42 indicates the results of electron diffraction analysis of a region indicated by B in FIG. 37.
Figure 43:
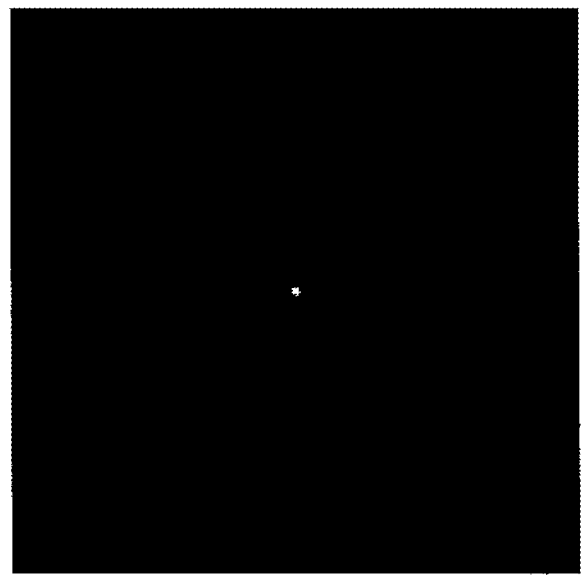
FIG. 43 indicates the results of electron diffraction analysis of a region indicated by C in FIG. 37.
Figure 44:
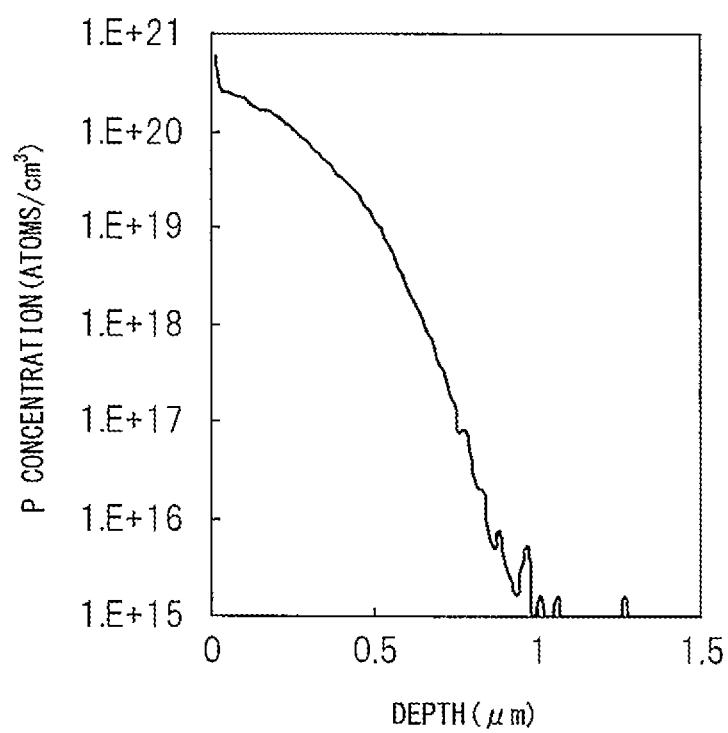
FIG. 44 indicates the results of Dynamic SIMS (secondary ion mass spectrometry) of a laminate of Comparative Example A2.

The observation results of the surface of the fabricated laminate by electron diffraction analysis (feature provided with the JEM2010, JEOL Ltd.) are shown in FIGS. 43 and 44. FIGS. 43 and 44 respectively show the results of electron diffraction analysis for the locations indicated by reference symbols 1 and 2 in the FE-SEM lateral cross-section micrograph shown in FIG. 42. It can be understood from these observation results that the dopant injection layer is coalesced with the substrate, and the crystal orientation of the dopant injection layer is the same as the crystal orientation of the silicon substrate.

Comparative Example A2

A silicon substrate having a dopant injection layer was fabricated in the same manner as Example A1, except for carrying out heat treatment for 20 minutes at 1000° C. with a lamp heating apparatus (MILA-5000, Ulvac-Riko Inc.) after irradiating with light.

(Evaluation—Lifetime Measurement)

The lifetime of the fabricated laminate was observed with a lifetime tester (WT-2000, Semilab Semiconductor Physics Laboratory Co., Ltd.).

According to this measurement, the lifetime observed in the silicon substrate having dopant injection layers deposited on both sides was 1.1 μsec, while the lifetime observed in the untreated silicon substrate after washing was 9 μsec. It can be understood from these measurement results that lifetime decreases as diffusion of the dopant from the dopant injection layer progresses due to heat treatment.

(Evaluation—Dynamic SIMS Analysis)

Dynamic secondary ion mass spectrometry (SIMS) was carried out on the silicon substrate having dopant injection layers using the Cameca IMS-7f. Measuring conditions were $O_2^+$ for the primary ion species, primary acceleration voltage of 3.0 kV, and detection region diameter of 30 μm.

The results of dynamic SIMS are shown in FIG. 44. It can be understood from the observation results that diffusion of dopant from the dopant injection layers progressed due to heat treatment in comparison with Example A1. More specifically, the dopant concentration was within the range of $1 \times 10^{20}$ atoms/$cm^3$ to $1 \times 10^{21}$ atoms/$cm^3$ at both a depth of 0.1 μm and 0.2 μm from the surface of the dopant injection layer.

Second Present Invention

Example B1

Preparation of Silicon Particle Dispersion

Phosphorous (P)-doped silicon particles were fabricated by laser pyrolysis (LP) using a carbon dioxide ($CO_2$) laser and using $SiH_4$ gas and $PH_3$ gas as the raw materials. The mean primary particle diameter of the resulting phosphorous-doped silicon particles was about 7 nm, the minimum particle diameter was 4 nm, the variance of particle size distribution was 3 $nm^2$, and the doping concentration was $1 \times 10^{21}$ atoms/$cm^3$. The phosphorous-doped silicon particles were ultrasonically dispersed in isopropyl alcohol (IPA, boiling point: about 82° C.) to obtain a phosphorous-doped silicon particle dispersion having a solid fraction concentration of 2% by weight.

(Preparation of Substrate)

A boron-doped silicon substrate (thickness: 280 μm, specific resistance: 5 Ωcm or less) was ultrasonically washed for 5 minutes each in acetone and isopropyl alcohol, followed by removing the oxide film for 10 minutes in a 5% hydrogen fluoride solution and removing the particles with a cleaning solution (Frontier Cleaner, Kanto Chemical Co. Inc.) to prepare a cleaned substrate.

(Coating)

Several drops of the phosphorous-doped silicon particle dispersion were dropped onto the substrate, followed by spin coating for 5 seconds at 500 rpm and for 10 seconds at 4000 rpm to apply the silicon particle dispersion on the substrate.

(Drying)

Isopropyl alcohol as the dispersion medium of the silicon particle dispersion was dried and removed by locating the substrate coated with the phosphorous-doped silicon particle dispersion on a hot plate at 70° C., to form a dried silicon particle film containing silicon particles (film thickness: 200 nm).

(Baking of Dried Silicon Thin Film)

The dried silicon thin film was heat-treated for 1 hour at 1 atmosphere and 600° C. in an argon atmosphere to remove desorbing gas and form a green silicon thin film.

(Light Irradiation)

Next, the green silicon particle film was irradiated with a YVO$_4$ laser (wavelength: 355 nm) in an argon atmosphere using a laser light irradiation apparatus (trade name: Osprey 355-2-0, Quantronix Inc.) to sinter the silicon particles in the green silicon particle film and obtain a semiconductor silicon film.

The irradiated YVO$_4$ laser had a 73 μm-diameter circular cross section, and the silicon particles were sintered by scanning the laser over the substrate. Laser irradiation conditions were irradiated energy of 500 mJ/(cm$^2$·shot), number of shots of 20, and irradiation duration of 30 nanoseconds/shot.

(Evaluation 1—Analysis of Desorbing Gas)

The dried silicon particle thin film, namely the silicon particle film prior to removal of desorbing gas by heat treatment, was analyzed by thermal desorption spectroscopy (TDS). More specifically, the dried silicon particle thin film was heated from 50° C. to 800° C. at the rate of 10° C./min in an inert gas (helium gas) atmosphere, and the desorbing gas was analyzed by gas chromatography-mass spectrometry (GC-MS). The pressure at the time of analysis was 1 atmosphere.

The amount of desorbing gas was calculated by preparing a calibration curve. Incidentally, a calibration curve for silicon compounds was prepared using octamethyl cyclotetrasiloxane, and calibration curves (standard curves) for other compounds were prepared using toluene.

Figure 47:
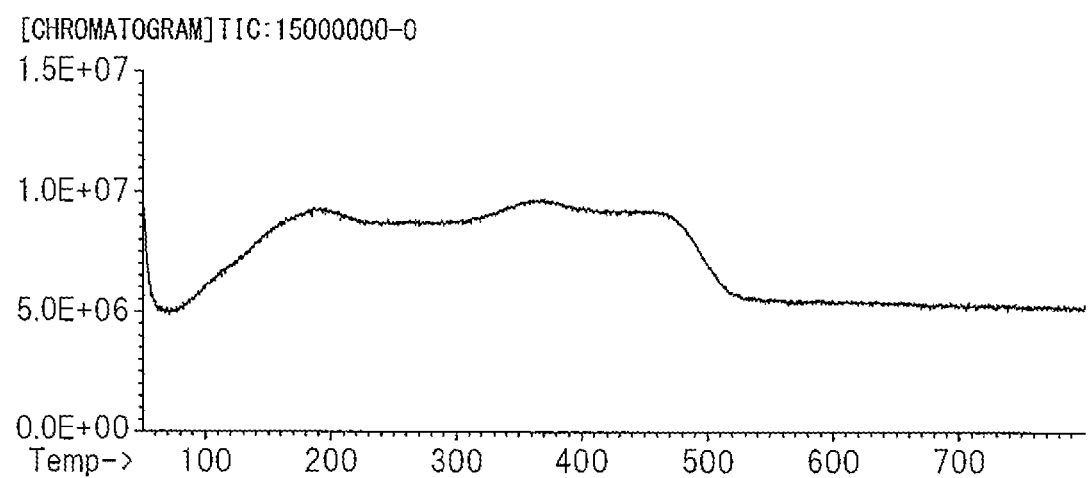
FIG. 47 indicates the results of TDS (thermal desorption spectroscopy) of a dried silicon particle film.

The results of thermal desorption spectroscopy are shown in FIG. 47. Although desorbing gas is observed at a temperature of up to about 50° C. in FIG. 47, desorbing gas is substantially not observed at higher temperatures. Incidentally, the reason for measured values in FIG. 47 at temperatures above 520° C. not being zero but rather remaining constant at about 5×10$^6$ is due to the effects of background values, and indicates that desorbing gas from the sample is substantially not observed.

In addition, approximate classification of the gas desorbed by thermal desorption analysis for each desorption temperature yielded the results shown in the following Table B1.

TABLE B1

| Types of Desorbing gases | | | |
|---|---|---|---|
| Desorption Temp. (° C.) | Component | Amount of gas (ppm by weight) | Origin |
| 190 | Water | 939 | Adsorbed water |
| 200 | Silanol | 575 | Silicon particles |
| 250 | Isopropyl alcohol | 689 | Solvent (isopropyl alcohol) |
| 360 | Acetone | 120 | Solvent (isopropyl alcohol) |
| 470 | Propene | 2,464 | Solvent (isopropyl alcohol) |

It can be understood from Table B1 that desorbing gas derived from isopropyl alcohol as a solvent desorbs at a temperature range of about 250° C. to about 470° C. Incidentally, the "amount of gas" in Table B1 refers to the weight ratio of desorbing gas to the weight of the silicon particle film.

Incidentally, the Model PY-2020iD Double-Shot Pyrolyzer (Frontier Laboratories Ltd.) was used as the pyrolysis oven, and the HP5973 (Agilent Technologies Inc.) was used as the gas chromatography-mass spectrometry (GC-MS) apparatus.

(Evaluation 2—Solar Cell Performance)

Figure 48:
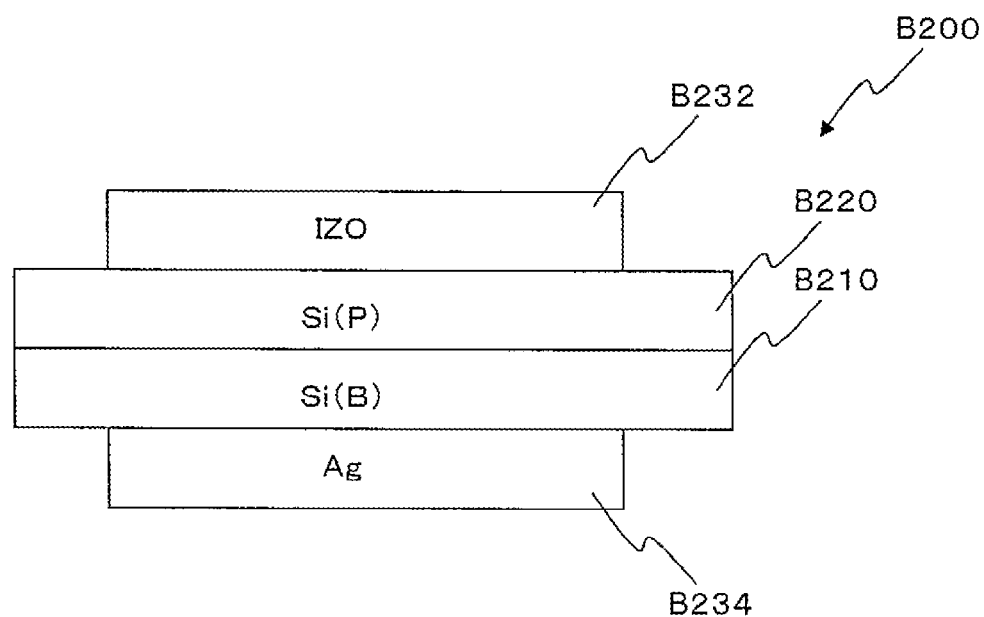
FIG. 48 indicates the configurations of solar cells fabricated in Example B1 and Comparative Example B1.

An indium zinc oxide (IZO) thin film (200 nm) as a transparent electrode was formed, on the semiconductor silicon film fabricated by irradiating with light, using a sputtering apparatus; and a silver (Ag) thin film (200 nm) was formed, on the substrate side, using a vapor deposition apparatus to fabricate the solar cell shown in FIG. 48.

In this solar cell (B200), as shown in FIG. 48, a phosphorous (P)-doped semiconductor silicon film (B220) is laminated on a boron (B)-doped silicon substrate (B210). In addition, in this solar cell (B200), an indium zinc oxide (IZO) thin film (B232) as a transparent electrode is laminated on the side of the phosphorous (P)-doped semiconductor silicon film (B220), while a silver (Ag) thin film (B234) as an electrode is laminated on the boron (B)-doped silicon substrate (B210).

Figure 49:
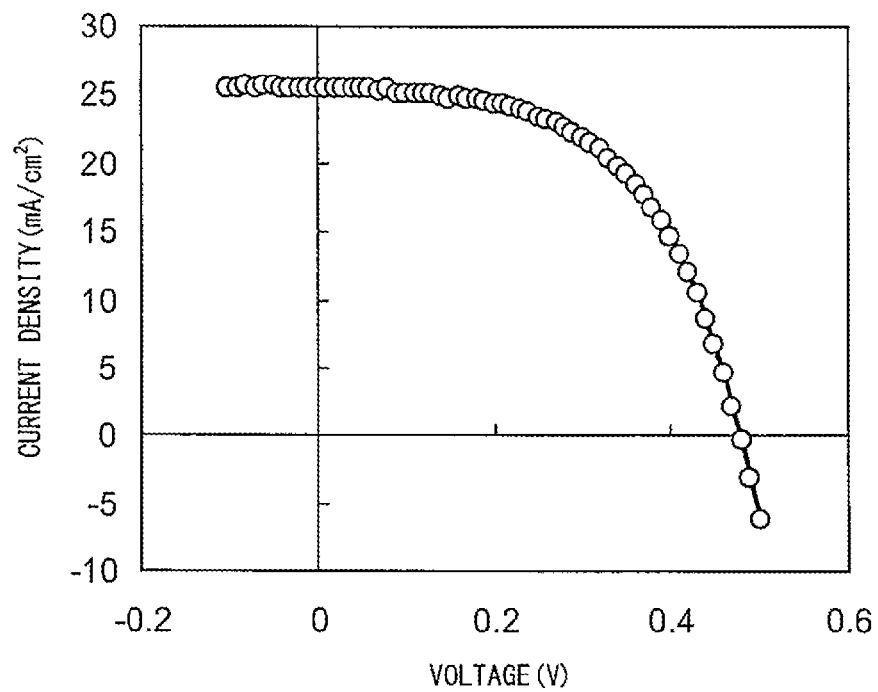
FIG. 49 indicates the I-V (current-voltage) properties of a solar cell fabricated in Example B1.

The I-V (current-voltage) properties of the fabricated solar cell were evaluated using a solar simulator (HAL-320, Asahi Spectra Co., Ltd.). Changes in current flowing between electrodes were investigated by applying a variable voltage of 100 mV to 500 mV between the electrodes. The results of evaluating the I-V (current-voltage) properties of this solar cell are shown in Table B2 and FIG. 49.

Comparative Example B1

Figure 50:
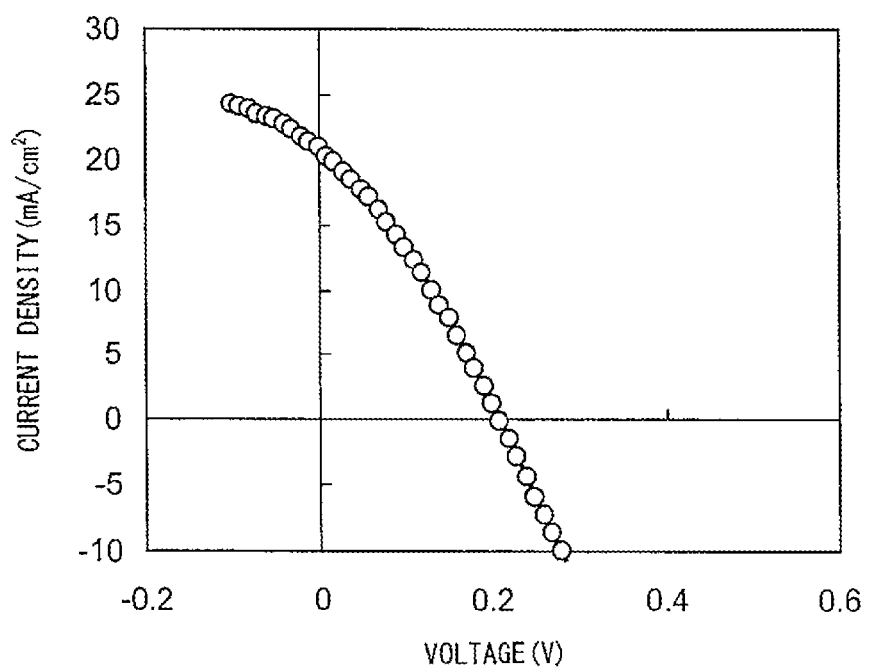
FIG. 50 indicates the I-V (current-voltage) properties of a solar cell fabricated in Comparative Example B1.

A solar cell was fabricated in the same manner as Example B1, except for not carrying out heat treatment on the green silicon thin film. The results of evaluating the I-V properties of this solar cell are shown in Table B2 and FIG. 50.

TABLE B2

| | Production Conditions | | | | Evaluation Results | | |
|---|---|---|---|---|---|---|---|
| | Substrate | Green silicon thin film thickness (nm) | Heat treatment | Laser energy (mJ/cm$^2$) | Conversion efficiency (%) | Short circuit current density (mA/cm$^2$) | Open circuit voltage (mV) |
| Ex. B1 | Boron-doped silicon substrate | 200 | Yes (600° C.) | 500 | 6.73 | 25.5 | 479 |
| Comp. Ex. B1 | | | No | | 1.35 | 20.8 | 209 |

When comparing the solar cell of Example B1 with the solar cell of Comparative Example B1, the solar cell of Example B1 clearly demonstrated superior properties as a solar cell.

Third Present Invention

Example C1

Preparation of Silicon Particle Dispersion

Phosphorous (P)-doped silicon particles were fabricated by laser pyrolysis (LP) using a carbon dioxide ($CO_2$) laser and using $SiH_4$ gas and $PH_3$ gas as the raw materials. The mean primary particle diameter of the resulting phosphorous-doped silicon particles was about 15 nm, the variance of particle size distribution was 38 $nm^2$, and the doping concentration was $1 \times 10^{21}$ $atoms/cm^3$. The phosphorous-doped silicon particles were ultrasonically dispersed in isopropyl alcohol (IPA) to obtain a phosphorous-doped silicon particle dispersion having a solid fraction concentration of 3% by weight.

(Preparation of Substrate)

A boron-doped silicon substrate (thickness: 280 μm, specific resistance: 3 Ωcm or less) was ultrasonically washed for 5 minutes each in acetone and isopropyl alcohol, followed by removing the oxide film for 10 minutes in a 5% hydrogen fluoride solution and removing the particles with a cleaning solution (Frontier Cleaner, Kanto Chemical Co. Inc.) to prepare a cleaned substrate.

(Coating)

Several drops of the phosphorous-doped silicon particle dispersion were dropped onto the substrate, followed by spin coating for 5 seconds at 500 rpm and for 10 seconds at 4000 rpm to apply the silicon particle dispersion on the substrate.

(Drying)

Isopropyl alcohol as the dispersion medium of the silicon particle dispersion was dried and removed by locating the substrate coated with the phosphorous-doped silicon particle dispersion on a hot plate at 70° C., to form a green silicon particle film containing silicon particles (film thickness: 300 nm).

(Light Irradiation)

Next, the green silicon particle film was irradiated with a $YVO_4$ laser (wavelength: 355 nm) in an argon atmosphere using a laser light irradiation apparatus (trade name: Osprey 355-2-0, Quantronix Inc.) to sinter the silicon particles in the green silicon particle film and obtain a first semiconductor silicon film.

The irradiated $YVO_4$ laser had a 73 μm-diameter circular cross section, and the silicon particles were sintered by scanning the laser over the substrate. Laser irradiation conditions were irradiated energy of 200 $mJ/(cm^2 \cdot shot)$, number of shots of 30, and pulse duration of 30 nanoseconds/shot.

(Second Coating, Drying and Light Irradiation)

On the first semiconductor silicon film obtained in the above manner, the phosphorous-doped silicon particle dispersion was again applied and dried, and then irradiated with light to obtain a second semiconductor silicon film.

(Evaluation 1—Surface Form Observation)

The surface form of the fabricated second semiconductor silicon film was observed with a field emission scanning electron microscope (FE-SEM) (Model 55200, Hitachi High-Technologies Corp.). The results of surface form observation are shown in FIG. 52. FIG. 52 shows that the semiconductor silicon film was composed of a plurality of elongated silicon particles mutually adjacent in the direction of the short axis.

In addition, FIG. 52 shows that a substantial portion of the elongated silicon particles had a short axis diameter of 240 nm or more, and that a substantial portion of the elongated silicon particles had an aspect ratio of more than 1.1.

(Evaluation 2—Solar Cell Performance)

Figure 53:
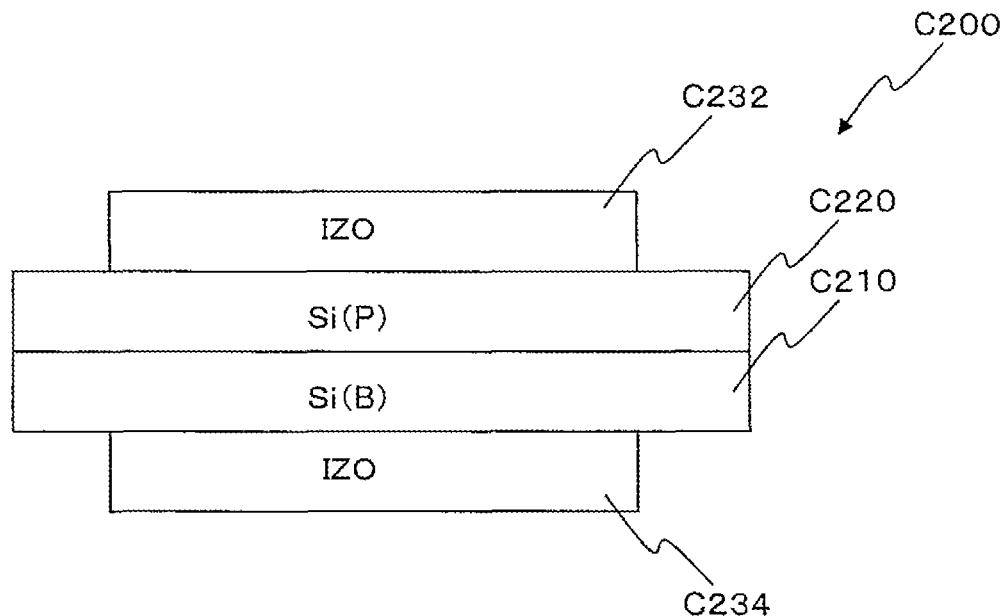
FIG. 53 indicates the configuration of a solar cell fabricated in Example C1.

The solar cell shown in FIG. 53 was fabricated by forming an indium zinc oxide (IZO) thin film (200 nm) as a transparent electrode on both sides of a substrate having the fabricated second semiconductor silicon film.

In this solar cell (C200), as shown in FIG. 53, a phosphorous (P)-doped semiconductor silicon film (C220) is laminated on a boron (B)-doped silicon substrate (C210), and indium zinc oxide (IZO) thin films (C232 and C234) as transparent electrodes are laminated on both sides thereof.

Figure 54:
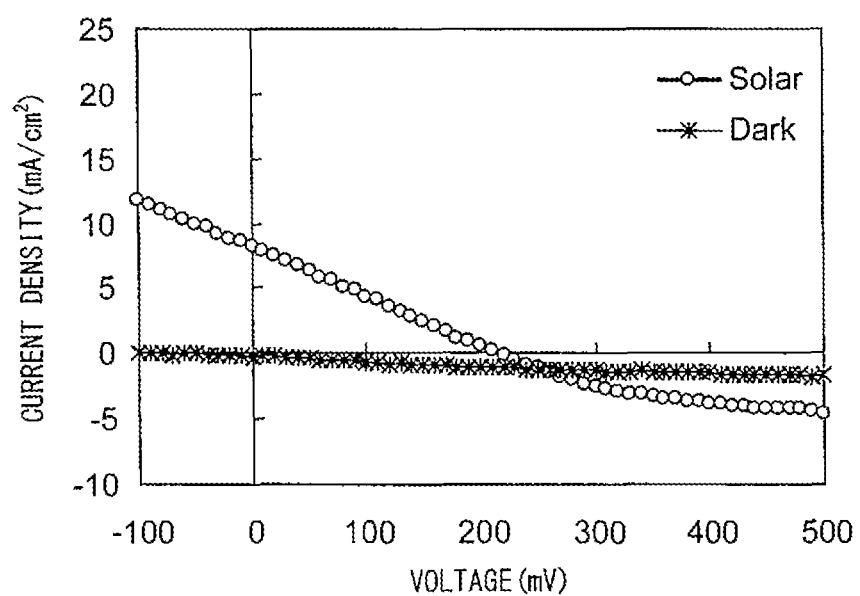
FIG. 54 indicates the I-V (current-voltage) properties of a solar cell fabricated in Example C1.

The I-V (current-voltage) properties of the fabricated solar cell were evaluated using a solar simulator (HAL-320, Asahi Spectra Co., Ltd.). Changes in current flowing between electrodes were investigated by applying a variable voltage of 100 mV to 500 mV between the electrodes. The results of evaluating the I-V (current-voltage) properties of this solar cell are shown in FIG. 54.

Reference Example C1

Fabrication of First Semiconductor Silicon Film

Only a first semiconductor silicon film was obtained substantially in the same manner as Example C1, except for using silicon particles having a variance of particle size distribution of 52 $nm^2$. Namely, coating, drying and light irradiation of the silicon particle dispersion were only carried out once.

(Evaluation—Surface Form Observation)

The surface form of the fabricated first semiconductor silicon film was observed in the same manner as Example C1. The results of surface form observation are shown in FIG. 55. FIG. 55 shows that the semiconductor silicon film was composed of a plurality of sintered silicon particles.

Reference Example C2

Fabrication of First Semiconductor Silicon Film

Only a first semiconductor silicon film was obtained substantially in the same manner as Example C1, except for using silicon particles having a variance of particle size distribution of 3 $nm^2$. Namely, coating, drying and light irradiation of the silicon particle dispersion were only carried out once.

(Evaluation—Surface Form Observation)

Figure 56:
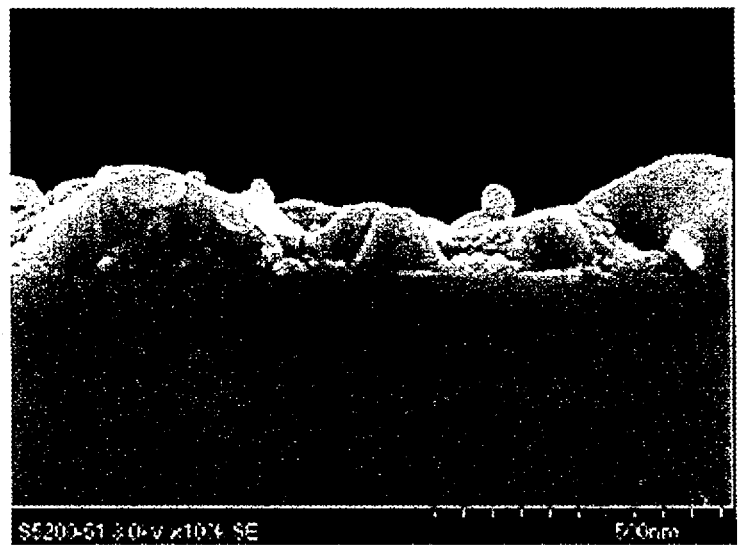

The surface form of the fabricated first semiconductor silicon film was observed in the same manner as Example C1. The results of surface form observation are shown in FIG. 56. FIG. 56 shows that the semiconductor silicon film had a relatively flat surface.

Incidentally, based on a comparison between Reference Example C1 that used silicon particles having a variance of particle size distribution of 52 $nm^2$, and Reference Example C2 using silicon particles having a variance of particle size distribution of 3 $nm^2$, it is observed that individual sintered silicon particles grow more in the longitudinal direction in Reference Example C1 using silicon particles having a relatively large variance. It is understood that these sintered silicon particles growing more in the longitudinal direction can be preferable as a first semiconductor silicon film in the method of the present invention to obtain a semiconductor silicon film in which a plurality of elongated silicon particles are mutually adjacent in the direction of the short axis.

Fourth Invention

Example D1

Preparation of Silicon Particle Dispersion

Phosphorous (P)-doped silicon particles were fabricated by laser pyrolysis (LP) using a carbon dioxide ($CO_2$) laser and using $SiH_4$ gas and $PH_3$ gas as the raw materials. The mean primary particle diameter of the resulting phosphorous-doped silicon particles was about 7 nm. The phosphorous-doped silicon particles were ultrasonically dispersed in isopropyl alcohol (IPA) to obtain a phosphorous-doped silicon particle dispersion having a solid fraction concentration of 2% by weight.

(Preparation of Substrate)

A boron-doped silicon substrate (thickness: 280 μm, specific resistance: 5 Ωcm or less) was ultrasonically washed for 5 minutes each in acetone and isopropyl alcohol, followed by removing the particles with a cleaning solution (Frontier Cleaner, Kanto Chemical Co. Inc.) and removing the oxide film for 10 minutes in a 5% hydrogen fluoride solution to prepare a cleaned substrate.

(Formation of Amorphous Silicon Layer)

On the substrate after cleaning, an amorphous silicon layer was formed using a sputtering apparatus. Sputtering conditions were pressure of $4 \times 10^{-3}$ torr, condenser of 300 pf, Ar flow rate of 100 sccm, electrical power of 300 W, and sputtering time of 20 minutes (thickness: 150 nm).

(Formation of Silicon Particle Layer)

Several drops of the phosphorous-doped silicon particle dispersion were dropped onto the substrate having the amorphous silicon layer thereon, followed by spin coating for 5 seconds at 500 rpm and for 10 seconds at 4000 rpm to apply the silicon particle dispersion on the amorphous silicon layer.

Isopropyl alcohol as the dispersion medium of the silicon particle dispersion was dried and removed by locating the substrate coated with the phosphorous-doped silicon particle dispersion on a hot plate at 70° C., to form a green laminate having a silicon particle layer (thickness: 200 nm) on the amorphous silicon layer.

(Light Irradiation)

Next, the green laminate was fired by irradiating with a $YVO_4$ laser (wavelength: 355 nm) in an argon atmosphere using a laser light irradiation apparatus (trade name: Osprey 355-2-0, Quantronix Inc.) to obtain a semiconductor laminate having a composite silicon layer.

The irradiated $YVO_4$ laser had a 100 μm-diameter circular cross section, and the green laminate was treated to obtain the composite silicon film by scanning the laser over the substrate. Laser irradiation conditions were irradiated energy of 500 mJ/($cm^2$·shot), number of shots of 20, and irradiation duration of 30 nanoseconds/shot.

(Evaluation—Surface form observation)

The surface form of the fabricated composite silicon layer was observed with a field emission scanning electron microscope (FE-SEM) (Model 55200, Hitachi High-Technologies Corp.). The results of surface form observation are shown in FIG. 58. FIG. 58 shows that the composite silicon layer had a flat surface. More specifically, the height of protrusions of this composite silicon layer, namely the height of protrusions based on the flat portion thereof, was about 50 nm.

Comparative Example D1

A semiconductor laminate was obtained substantially in the same manner as Example D1, except for not forming an amorphous silicon layer, or in other words, only using a silicon particle layer.

(Evaluation—Surface Form Observation)

The surface form of the fabricated silicon layer derived from silicon particles was observed in the same manner as Example D1. The results of surface form observation are shown in FIG. 59. FIG. 59 shows that this silicon layer was not flat, in comparison with Example D1 shown in FIG. 58. More specifically, the height of protrusions of this silicon layer, namely the height of protrusions based on the flat portion thereof, was 100 nm or more. Note that, since this silicon layer did not have any well-defined flat portions, it was difficult to evaluate protrusion height.

Fifth Present Invention

Example E1

Preparation of Silicon Particle Dispersion

Silicon particles were fabricated by laser pyrolysis (LP) using a carbon dioxide ($CO_2$) laser and using $SiH_4$ gas as the raw material. The mean primary particle diameter of the resulting silicon particles was about 7 nm. The silicon particles were ultrasonically dispersed in isopropyl alcohol (IPA) to obtain a silicon particle dispersion having a solid fraction concentration of 3% by weight.

(Preparation of Substrate)

A phosphorous-doped silicon substrate (Optstar Ltd., specific resistance: 0.005 Ωcm or less) was ultrasonically washed for 5 minutes each in acetone and isopropyl alcohol. Subsequently, a silicon nitride film having a film thickness of 500 nm was deposited on the surface of the substrate by chemical vapor deposition (CVD).

(Coating of Silicon Particle Dispersion)

Several drops of the silicon particle dispersion were dropped onto the substrate, followed by spin coating for 5 seconds at 500 rpm and for 10 seconds at 4000 rpm to apply the silicon particle dispersion on the substrate.

(Drying of Silicon Particle Dispersion)

Isopropyl alcohol as the dispersion medium of the silicon particle dispersion was dried and removed by locating the substrate coated with the silicon particle dispersion on a hot plate at 70° C., to form a green silicon particle film (film thickness: 300 nm) containing silicon particles (mean primary particle diameter: about 7 nm).

(Light Irradiation)

Next, the green silicon particle film was irradiated with a $YVO_4$ laser (wavelength: 355 nm) using a laser light irradiation apparatus (trade name: Osprey 355-2-0, Quantronix Inc.) to sinter the silicon particles in the green silicon particle film and obtain a semiconductor silicon film. Laser irradiation conditions were irradiated energy of 200 mJ/($cm^2$·shot), number of shots of 20, and irradiation duration per shot of 30 nanoseconds.

Figure 60:
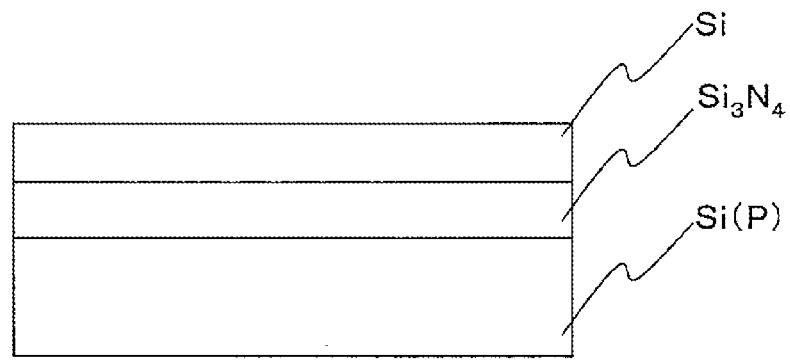
FIG. 60 indicates a semiconductor laminate produced in Examples E1 and E2.

The structure of the resulting laminate is shown in FIG. 60. FIG. 60 shows that a silicon nitride film ($Si_3N_4$) and semiconductor silicon film (Si) are laminated on a phosphorous (P)-doped silicon substrate (Si(P)) in that order.

(Evaluation)

The surface of the fabricated semiconductor silicon film was observed with a field emission scanning electron microscope (FE-SEM) (Model 55200, Hitachi High-Technologies Corp.). The results are shown in FIG. 62(a).

Example E2

A semiconductor silicon film was fabricated in the same manner as Example E1, except for changing the substrate to a silicon carbide single crystal substrate (Opstar Ltd., substrate thickness: 500 μm, specific resistance: 0.01 Ωcm to 0.03 Ωcm) and changing the laser irradiated energy to 300 mJ/(cm²·shot).

The surface of the semiconductor silicon film was observed with an FE-SEM in the same manner as Example E1. The results are shown in FIG. 62(b).

Example E3

Figure 61:
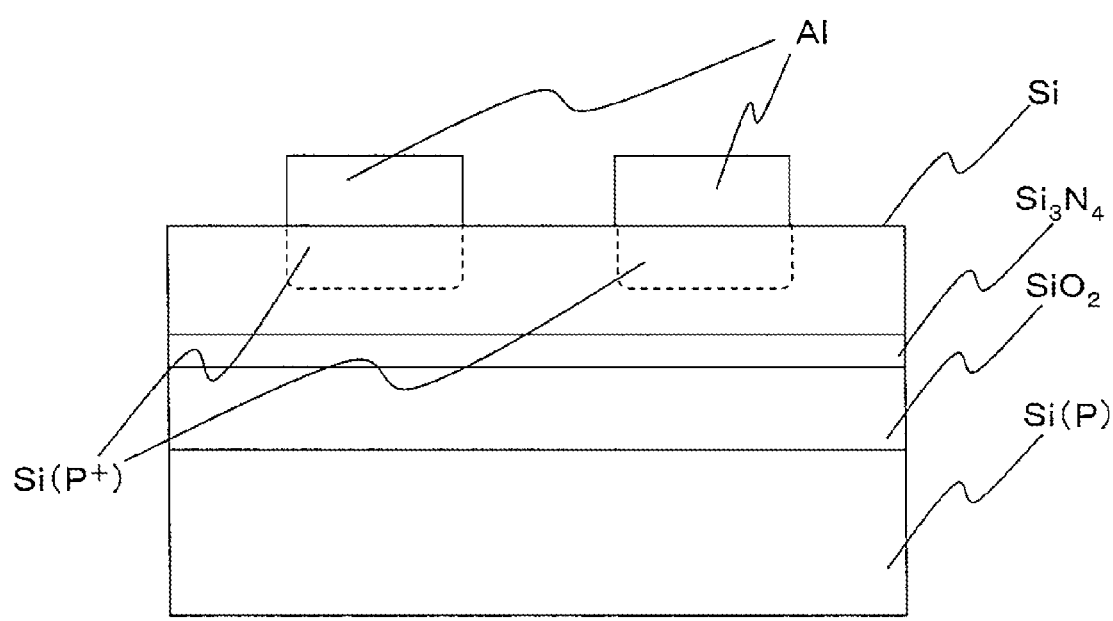
FIG. 61 indicates a field effect transistor (FET) having a bottom-gate top-contact structure produced in Example E3.

A field effect transistor (FET) having a bottom-gate top-contact structure as shown in FIG. 61 was produced, and the electrical properties thereof were evaluated.

(Preparation of Silicon Particle Dispersion)

A silicon particle dispersion was obtained in the same manner as that of Example E1.

(Preparation of Substrate)

A phosphorous (P)-doped silicon substrate (Optstar Ltd., specific resistance: 0.005 Ωcm or less) having a thermally oxidized silicon film (SiO$_2$) (thickness: 1000 nm) was ultrasonically washed for 5 minutes each in acetone, isopropyl alcohol and an acid-based cleaning solution (trade name: Frontier Cleaner, Kanto Chemical Co., Ltd.). Subsequently, a silicon nitride film having a film thickness of 60 nm was deposited on the surface of the substrate by chemical vapor deposition (CVD).

(Coating and Drying of Silicon Particle Dispersion)

The silicon particle dispersion was applied and dried by the same methods as those of Example E1, except for making the film thickness of the green silicon film to be 250 nm.

(Light Irradiation)

Next, light was irradiated in the same manner as that of Example E1 in order to sinter the green silicon film.

(Formation of Highly Phosphorous-Doped Silicon Layer by P Ion Injection)

A highly phosphorous-doped silicon layer was formed by injecting P ions into the semiconductor silicon film at room temperature in a commercially available ion injection apparatus at an acceleration energy of 20 KeV, phosphorous (P) dose of $4.0 \times 10^{15}$ atoms/cm², injection time of 5620 sec, and rotating speed of 0.6 rps. Subsequently, activation annealing treatment was carried out for 3 minutes in a nitrogen atmosphere at 1000° C. in a heating oven.

(Al Electrode Formation by Electron Beam Vapor Deposition)

Subsequently, aluminum source and drain electrodes were formed on the highly phosphorous-doped silicon layer in a commercially available electron beam vapor deposition apparatus. The film thickness of the aluminum source and drain electrodes was 100 nm.

The structure of the resulting field effect transistor (FET) is shown in FIG. 61. FIG. 61 shows that a silicon nitride film (Si$_3$N$_4$), a semiconductor silicon film (Si), and aluminum source and drain electrodes (Al) are laminated on a phosphorous (P)-doped silicon substrate (Si(P)) having a thermally oxidized silicon film (SiO$_2$) in that order, and that the semiconductor silicon film (Si) form a highly phosphorous (P)-doped silicon region (Si(P$^+$)) under the source and drain electrodes (Al).

(Evaluation)

Electrical properties of the fabricated FET were evaluated using a semiconductor property evaluation apparatus (Keithley Instruments Inc., trade name: Model 2636A 2-ch System Source Meter). Responsiveness to gate voltage of a current flowing between the source and drain electrodes (drain current) was investigated by applying a variable voltage of −50 V to 50 V to the phosphorous (P)-doped silicon substrate as a gate, while applying a constant voltage of about 20 V to 50 V between the aluminum source and drain electrodes. This measurement was carried out five times. As a result, carrier mobility (average value) was confirmed to be $5.5 \times 10^{-2}$ cm²/Vs.

Figure 63:
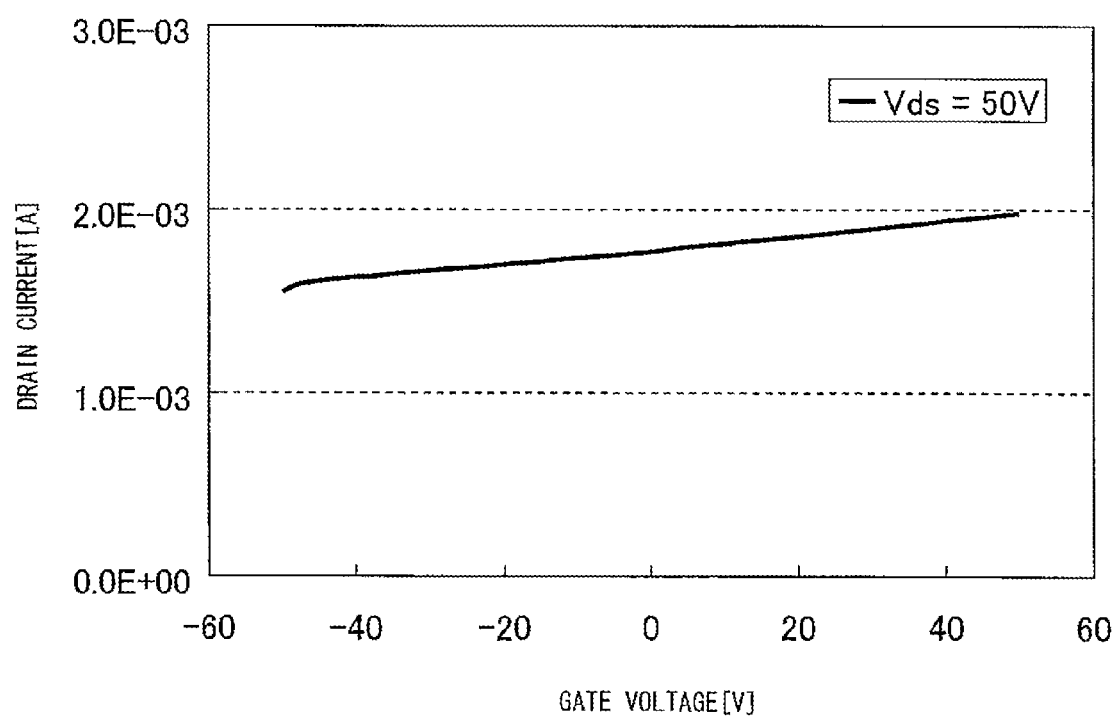
FIG. 63 indicates the transmission properties (gate voltage, drain current) of a field effect transistor (FET) produced in Example E3.
Figure 64:
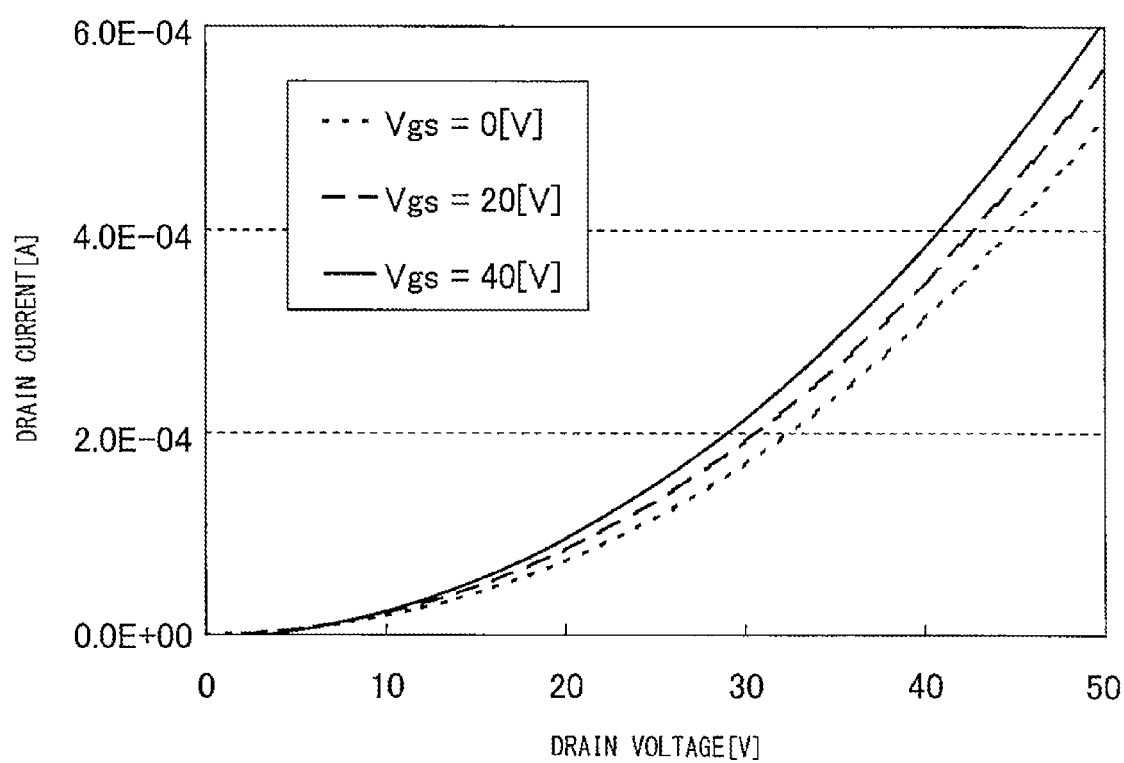
FIG. 64 indicates output properties (drain voltage, drain current) of a field effect transistor (FET) produced in Example E3.

The transmission properties of this FET are shown in FIG. 63, while output properties are shown in FIG. 64.

Comparative Example E1

A semiconductor silicon film was fabricated in the same manner as Example E1, except for using a phosphorous (P)-doped silicon substrate having a thermally oxidized silicon film (SiO$_2$) (Opstar Ltd., specific resistance: 0.005 Ωcm or less) as a substrate, not using a silicon nitride film (Si$_3$N$_4$), and changing the irradiated energy from 200 mJ/(cm²·shot) to 160 mJ/(cm²·shot).

The surface of the semiconductor silicon film was observed with an FE-SEM in the same manner as Example E1. The results are shown in FIG. 62(c). When compared with FIGS. 62(a) and (b) regarding Examples E1 and E2, even though the irradiated energy is lower in Comparative Example E1 shown in FIG. 62(c), aggregation of silicon particles proceeds causing an increase in particle size, and this can be understood to cause the semiconductor silicon film to become discontinuous.

Sixth Present Invention

In the following, Examples F1 to F5 provides an explanation of the production of field effect transistors (FET) having a bottom-gate bottom-contact structure shown in FIG. 67, and Examples F6 to F8 provides an explanation of the production of field effect transistors (FET) having a bottom-gate bottom-contact structure shown in FIG. 68.

Example F1

Preparation of Silicon Particle Dispersion

Silicon particles were fabricated by laser pyrolysis (LP) using a carbon dioxide (CO$_2$) laser and using SiH$_4$ gas as the raw material. The mean primary particle diameter of the resulting silicon particles was about 20 nm. The silicon particles were ultrasonically dispersed in isopropyl alcohol (IPA) to obtain a silicon particle dispersion having a solid fraction concentration of 3% by weight.

(Preparation of Substrate)

A phosphorous-doped silicon substrate having an SiO$_2$ film (thickness: 1000 nm) (Optstar Ltd., specific resistance: 0.005 Ωcm or less) was ultrasonically washed for 5 minutes each in acetone and isopropyl alcohol, and subjected to ultraviolet (UV)-ozone cleaning for 30 minutes to prepare a cleaned substrate.

Subsequently, silver was vacuum-deposited on the substrate using a resistance heating-type vacuum deposition apparatus to form source and drain electrodes for an FET (channel length: 50 μm, channel width: 1.5 mm).

(Coating of Silicon Particle Dispersion)

Several drops of the silicon particle dispersion were dropped onto the substrate, followed by spin coating for 5 seconds at 500 rpm and for 10 seconds at 4000 rpm to apply the silicon particle dispersion on the substrate.

(Drying of Silicon Particle Dispersion)

Isopropyl alcohol as the dispersion medium of the silicon particle dispersion was dried and removed by locating the substrate coated with the silicon particle dispersion on a hot plate at 70° C., to form a green silicon particle film (film thickness: 300 nm) containing silicon particles (mean primary particle diameter: about 20 nm).

(Light Irradiation)

Next, the green silicon particle film was irradiated with a YVO$_4$ laser (wavelength: 355 nm) using a laser light irradiation apparatus (trade name: Osprey 355-2-0, Quantronix Inc.) to sinter the silicon particles in the green silicon particle film and fabricate the FET shown in FIG. 67.

Next, the green silicon particle film was irradiated with a YVO$_4$ laser (wavelength: 355 nm) using a laser light irradiation apparatus (trade name: Osprey 355-2-0, Quantronix Inc.) to sinter the silicon particles in the green silicon particle film and fabricate the FET shown in FIG. 67.

(Evaluation)

Electrical properties of the fabricated FET were evaluated using a semiconductor property evaluation apparatus (Keithley Instruments Inc., trade name: Model 2636A 2-ch System Source Meter). Responsiveness to gate voltage of a current flowing between the source and drain electrodes (drain current) was investigated by applying a variable voltage of −50 V to 50 V to the phosphorous (P)-doped silicon substrate as a gate, while applying a constant voltage of about 10 V to 50 V between the silver source and drain electrodes. The results of the electrical property evaluation of this FET are shown in Table F1.

Example F2

An FET shown in FIG. 67 was fabricated in the same manner as Example F1, except for changing the solid fraction concentration of the silicon particle dispersion to 1% by weight, changing the thickness of the green silicon film to 100 nm as a result thereof, and irradiating light in the manner described below. The results of the electrical property evaluation of this FET are shown in Table F1.

(Light Irradiation)

The YVO$_4$ laser used in this example (wavelength: 355 nm) had an 72 μm-width oval cross section and length of 130 μm, and the silicon particles were sintered in an argon atmosphere by scanning the laser over the substrate. Laser irradiation conditions were irradiated energy irradiated energy of 75 mJ/(cm$^2$·shot), number of shots of 33, and pulse duration per shot of 30 nanoseconds.

Example F3

Figure 67:
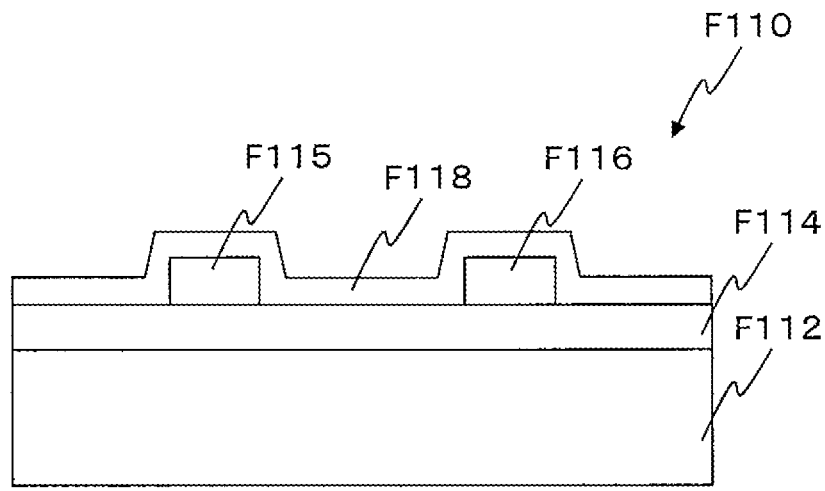
FIG. 67 indicates a field effect transistor (FET) having a bottom-gate bottom-contact structure produced in Examples F1 to F5.

An FET shown in FIG. 67 was fabricated in the same manner as Example F2, except for changing the irradiated energy irradiated energy during light irradiation to 105 mJ/(cm$^2$·shot). The results of the electrical property evaluation of this FET are shown in Table F1.

Example F4

An FET shown in FIG. 67 was fabricated in the same manner as Example F2, except for changing the irradiated energy during light irradiation to 104 mJ/(cm$^2$·shot), and further treating the semiconductor silicon film after light irradiation in the manner indicated below. The results of the electrical property evaluation of this FET are shown in Table F1.

(Additional Treatment of Semiconductor Silicon Film After Light Irradiation)

Several drops of a silicon particle dispersion having a solid fraction concentration of 1% by weight were dropped onto the semiconductor silicon film after light irradiation, followed by spin coating for 5 seconds at 500 rpm and for 10 seconds at 4000 rpm to apply the silicon particle dispersion thereon. Subsequently, the silicon particle dispersion was dried with a hot plate at 70° C. followed by again irradiating with light at a irradiated energy of 104 mJ/(cm$^2$·shot).

Example F5

An FET shown in FIG. 67 was fabricated in the same manner as Example F2, except for changing the light irradiation atmosphere to a nitrogen (N$_2$) atmosphere having a hydrogen (H$_2$) content of about 2%, and changing the irradiated energy to 104 mJ/(cm$^2$·shot). The results of the electrical property evaluation of this FET are shown in Table F1.

Example F6

Preparation of Silicon Particle Dispersion

A silicon particle dispersion was obtained in the same manner as Example F1, except for changing the solid fraction concentration to 1% by weight.

(Preparation of Substrate)

A heat-resistant polycarbonate substrate having an indium zinc oxide (IZO) electrode (Teijin Ltd., SS120-B30, glass transition temperature: 215° C.) was subjected to ultraviolet (UV)-ozone cleaning for 30 minutes to prepare a cleaned substrate.

Subsequently, a methyl silsesquioxane (MSQ) film serving as a gate insulating film of an FET was fabricated on the substrate. More specifically, several drops of a solution having a solid fraction concentration of 30% by weight, which was obtained by dissolving MSQ in propylene glycol monomethyl ether acetate (PGMEA) (Honeywell Inc., trade name: PTS R-6), were dropped onto a polycarbonate substrate having an IZO electrode, followed by spin coating for 20 seconds at 3200 rpm, and subsequently heating and drying for 5 minutes in an oven at 80° C. and for 30 minutes in air at 180° C. to obtain an MSQ film. The film thickness of the MSQ film was 800 nm.

Subsequently, silver was vacuum-deposited on the substrate in the same manner as Example F1 to form source and drain electrodes for the FET.

(Drying and Coating of Silicon Particle Dispersion)

The silicon particle dispersion was coated onto the substrate and dried in the same manner as Example F1. However, in this example, the film thickness of the resulting green silicon particle film was 100 nm.

(Light Irradiation)

Figure 68:
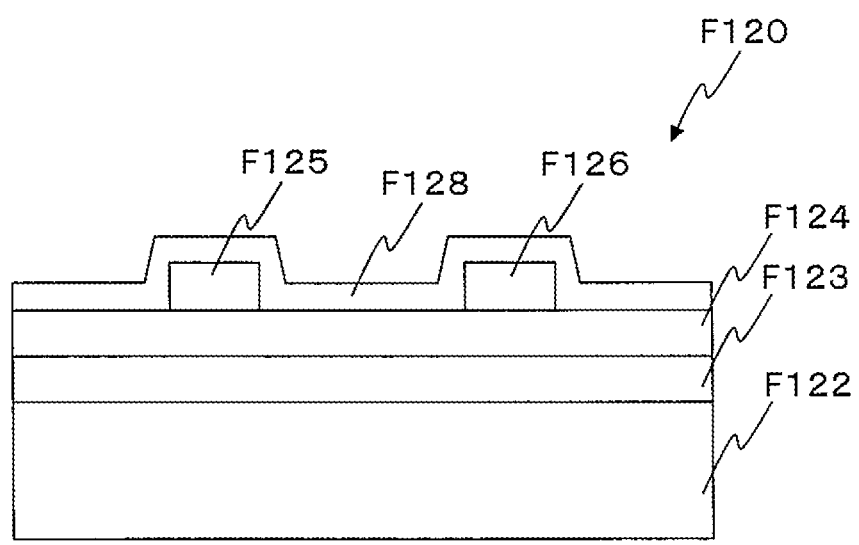
FIG. 68 indicates a field effect transistor (FET) having a bottom-gate bottom-contact structure produced in Examples F6 to F8.

Next, light was irradiated in the same manner as Example F1 to fabricate the FET shown in FIG. 68.

However, the YVO$_4$ laser used here had a 72 μm-width oval cross-section and length of 130 μm, and the silicon particles were sintered in an argon atmosphere by scanning the laser over the substrate. Laser irradiation conditions were irradiated energy of 75 mJ/(cm²·shot), number of shots of 33, and irradiation duration per shot of 30 nanoseconds.

(Evaluation)

The results of the electrical property evaluation of this FET are shown in Table F1.

Example F7

An FET shown in FIG. 68 was fabricated in the same manner as Example F6, except for changing the irradiated energy during light irradiation to 89 mJ/(cm²·shot). The results of the electrical property evaluation of this FET are shown in Table F1.

Example F8

An FET shown in FIG. 68 was fabricated in the same manner as Example F6, except for changing the irradiated energy during light irradiation to 104 mJ/(cm²·shot). The results of the electrical property evaluation of this FET are shown in Table F1.

Example F9

Preparation of Silicon Particle Dispersion

A silicon particle dispersion was prepared in the same manner as Example F1, except for changing the mean primary particle diameter of the silicon particles to about 7 nm, and changing the solid fraction concentration of the silicon particle dispersion to 2.7% by weight.

(Preparation of Substrate)

A substrate obtained by laminating an MSQ film (film thickness: 800 nm) onto a polycarbonate substrate having an IZO electrode in the same manner as Example F6 was used as the substrate.

(Drying and Coating of Silicon Particle Dispersion)

The silicon particle dispersion was coated onto the substrate and dried in the same manner as Example F1. The film thickness of the resulting green silicon particle film was 300 nm.

(Light Irradiation)

A semiconductor silicon layer was obtained by irradiating with a YVO₄ laser in the same manner as Example F1, except for changing the irradiated energy to 140 mJ/(cm²·shot), and number of shots of 20.

(Formation of Phosphorous-Doped Silicon Layer)

Several drops of a dispersion of silicon particles doped with phosphorous (P) having a solid fraction concentration of 2.6% by weight were dropped onto the resulting semiconductor silicon film, followed by coating and drying in the same manner as Example F1 to obtain a green silicon particle film composed of phosphorous-doped silicon particles. The thickness of the resulting green silicon particle film was 250 nm.

Subsequently, regions on which source and drain electrodes would be located were irradiated with light under conditions of irradiated energy of 120 mJ/(cm²·shot), and number of shots of 20.

Subsequently, silver was vacuum-deposited in the regions irradiated with light using a resistance heating-type vacuum deposition apparatus to form source and drain electrodes (channel length: 120 μm, channel width: 1.5 mm).

The phosphorous-doped silicon layer obtained in this manner was beneficial for contacting the source and drain electrodes to the semiconductor silicon layer of a thin film transistor.

Figure 69:
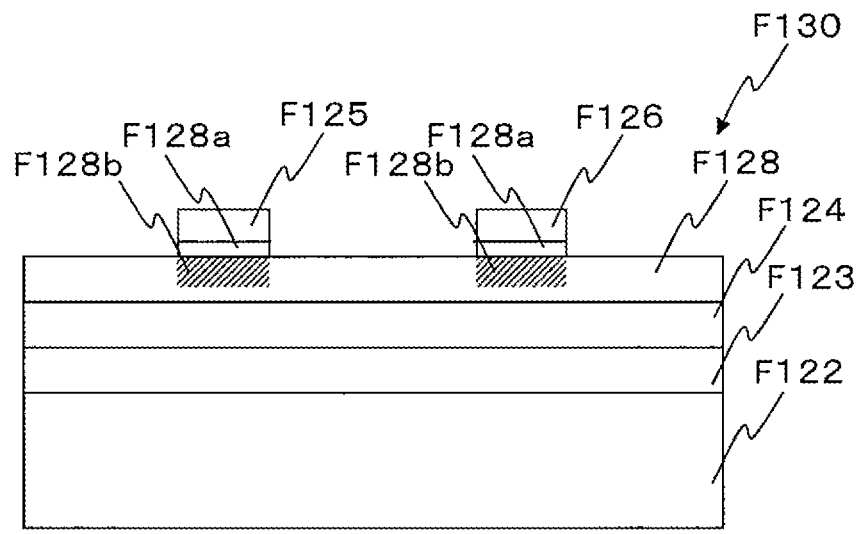
FIG. 69 indicates a field effect transistor (FET) having a bottom-gate top-contact structure produced in Example E9.

The resulting FET is shown in FIG. 69. The results of the electrical property evaluation of this FET are shown in Table F1.

TABLE F1

| | Substrate | Si film thickness before light irradiation (nm) | Light Irradiation Conditions | | | | No. of times ink coated (times) | Mobility (cm²/V · s) | On/Off Ratio |
| | | | Irradiated energy (mJ/cm²) | No. of shots (times) | Pulse duration (nsec/shot) | Radiating atmosphere | | | |
|---|---|---|---|---|---|---|---|---|---|
| Ex. F1 | P-doped Si with SiO₂ | 300 | 125 | 18 | 30 | Ar | 1 | 2 | 10³ |
| Ex. F2 | P-doped Si with SiO₂ | 100 | 75 | 33 | 30 | Ar | 1 | 5 | 10³ |
| Ex. F3 | P-doped Si with SiO₂ | 100 | 105 | 33 | 30 | Ar | 1 | 6 | 10² |
| Ex. F4 | P-doped Si with SiO₂ | 100 | 104 | 33 | 30 | Ar | 2 | 14 | 10⁴ |
| Ex. F5 | P-doped Si with SiO₂ | 100 | 104 | 33 | 30 | N₂:H₂ = 98:2 | 1 | 4 | 10² |
| Ex. F6 | PC with IZO electrode (Tg(PC): 215° C.) | 100 | 75 | 33 | 30 | Ar | 1 | 0.2 | 10² |
| Ex. F7 | PC with IZO electrode (Tg(PC): 215° C.) | 100 | 89 | 33 | 30 | Ar | 1 | 6 | 10² |
| Ex. F8 | PC with IZO electrode (Tg(PC): 215° C.) | 100 | 104 | 33 | 30 | Ar | 1 | 4 | 10² |
| Ex. F9 | PC with IZO electrode (Tg(PC): 215° C.) | 300 | 140 (1st) 120 (2nd) | 20 | 30 | N₂:H₂ = 96.5:3.5 | 2 | 3.6 × 10⁻³ | 10² |

BRIEF DESCRIPTION OF REFERENCE SYMBOLS

10 Semiconductor substrate
12,12a n-type semiconductor layer
22 Light receiving side electrode
24 Protective layer
32 Back side electrode
34 Protective layer
52 Dopant injection layer
52a Green dopant injection layer
62 Dopant injection layer
500a Selective emitter-type solar cell of present invention
600a Back contact-type solar cell of present invention
B10 Silicon particles
B15 Dispersion medium
B15a Desorbing gas
B100 Substrate B110 Silicon particle dispersion film
B120 Dried silicon particle film
B130 Green silicon particle film
B140 Semiconductor silicon film of present invention
B145 Semiconductor silicon film
B150 Light
200 Light
B210 Boron (B)-doped silicon substrate
B220 Phosphorous (P)-doped semiconductor silicon film
B232 Indium zinc oxide (IZO) thin film (transparent electrode)
B234 Silver (Ag) thin film (electrode)
C10 First silicon particles
C12 Sintered silicon particles
C15 First dispersion medium
C20 Silicon particles
C22 Elongated silicon particles
C25 Second dispersion medium
C100 Substrate
C110 First silicon particle dispersion film
C120 First green semiconductor silicon film
C130 First semiconductor silicon film
C140 Second silicon particle dispersion film
C150 Second green semiconductor silicon film
C160 Semiconductor silicon film of present invention
C200 Light
D310 Substrate
D320 Amorphous silicon layer
D320a Silicon layer derived from amorphous silicon (flat portion)
D320b Silicon layer derived from amorphous silicon (protrusions)
D330 Silicon particle layer
D330a,D330b,D330c Silicon layer derived from silicon particles
E10 Silicon particles
E10a Molten silicon particles
E100 Substrate
E100a Substrate surface (high affinity for molten silicon)
E100b Substrate surface (low affinity for molten silicon)
E120 Green silicon particle film
E130a Silicon film (present invention)
E130b Silicon film (prior art)
E200 Laser light
F110,F120,F130 Semiconductor laminate
F112 Phosphorous (P)-doped silicon substrate
F114 Silicon oxide (SiO$_2$) gate insulating film
F115,F116,F125,F126 Silver (Ag) source electrode and drain electrode
F118,F128 Semiconductor silicon film
F122 Polycarbonate (PC) substrate
F123 Indium zinc oxide (IZO) gate electrode
F124 Methyl silsesquioxane (MSQ) gate insulating film
F128 Semiconductor silicon film
F128a Dopant injection film
F128b Doped region of semiconductor silicon film
F72 Substrate
F73 Gate insulating film
F74 Gate electrode
F75 Source electrode
F76 Drain electrode
F78 Semiconductor layer
F78a Dopant injection film
F78b Doped region
F700 Field effect transistor of prior art
F700a Field effect transistor of present invention

The invention claimed is:

1. A semiconductor device, comprising:
a first dopant injection layer formed by sintering first particles is arranged at a first location of a semiconductor layer or substrate composed of a semiconductor element;
wherein the first particles are essentially composed of the same semiconductor element as the semiconductor layer or substrate and are doped with a p-type or n-type dopant;
wherein the first dopant injection layer is coalesced with the semiconductor layer or substrate;
wherein the crystal orientation of the first dopant injection layer is the same as the crystal orientation of the semiconductor layer or substrate;
wherein an electrode is formed on the dopant injection layer; and
wherein a dopant concentration at a depth of 0.1 μm from a surface of the first dopant injection layer is $1 \times 10^{20}$ atoms/cm$^3$ or more, and a dopant concentration at a depth of 0.3 μm from the surface of the first dopant injection layer is 1/10 or less of the dopant concentration at the depth of 0.1 μm from the surface of the first dopant injection layer.

2. The semiconductor device according to claim 1, further comprising:
a second dopant injection layer formed by sintering second particles is arranged at a second location of the semiconductor layer or substrate;
wherein the second particles are essentially composed of the same semiconductor element as the semiconductor layer or substrate and are doped with a dopant of a type that differs from the dopant of the first particles;
wherein the second dopant injection layer is coalesced with the semiconductor layer or substrate; and
wherein the crystal orientation of the second dopant injection layer is the same as the crystal orientation of the semiconductor layer or substrate; and a dopant concentration at a depth of 0.1 μm from a surface of the second dopant injection layer is $1 \times 10^{20}$ atoms/cm$^3$ or more, and a dopant concentration at a depth of 0.3 μm from the surface of the second dopant injection layer is 1/10 or less of the dopant concentration at the depth of 0.1 μm from the surface of the second dopant injection layer.

3. The semiconductor device according to claim 1, wherein the semiconductor element is silicon, germanium or a combination thereof.

4. The semiconductor device claim 1, which is a solar cell or thin film transistor.

5. The semiconductor device according to claim 1, wherein the dopant concentration at the depth of 0.1 μm from the surface of the first dopant injection layer is $5 \times 10^{20}$ atoms/cm$^3$ or more.

6. A production method of the semiconductor device according to claim 1,
wherein the method comprises the following steps (a) to (c):
(a) applying a first dispersion containing the first particles to the first location of the semiconductor layer or substrate,
(b) drying the applied first dispersion to obtain a first green dopant injection layer; and
(c) irradiating the first green dopant injection layer with light to dope the first location of the semiconductor layer or substrate with the p-type or n-type dopant, and at the same time, to sinter the first green dopant injection layer and thereby obtain the first dopant injection layer coalesced with the semiconductor layer or substrate.

7. The method according to claim 6,
wherein the method further comprises the following steps (a') to (c'); and
wherein the crystal orientation of a second dopant injection layer is the same as the crystal orientation of the semiconductor layer or substrate; and a dopant concentration at a depth of 0.1 μm from a surface of the second dopant injection layer is $1\times10^{20}$ atoms/cm$^3$ or more, and a dopant concentration at a depth of 0.3 μm from the surface of the second dopant injection layer is 1/10 or less of the dopant concentration at the depth of 0.1 μm from the surface of the second dopant injection layer:
(a') applying a second dispersion containing second particles to a second location of the semiconductor layer or substrate at the same time as step (a), between step (a) and step (b), or between step (b) and step (c), wherein the second particles are essentially composed of the same semiconductor element as the semiconductor layer or substrate and are doped with a dopant of a type that differs from the dopant of the first particles;
(b') drying the applied second dispersion to obtain a second green dopant injection layer at the same time as step (b) or separately from step (b); and
(c') irradiating the second green dopant injection layer with light at the same time as step (c) or separately from step (c) to dope the second location of the semiconductor layer or substrate with a p-type or n-type dopant, and at the same time, to sinter the second green dopant layer and thereby obtain a second dopant injection layer coalesced with the semiconductor layer or substrate.

8. The method according to claim 6,
wherein the method further comprises the following steps (a") to (c") after step (c); and
wherein the crystal orientation of a second dopant injection layer is the same as the crystal orientation of the semiconductor layer or substrate; and a dopant concentration at a depth of 0.1 μm from a surface of the second dopant injection layer is $1\times10^{20}$ atoms/cm$^3$ or more, and a dopant concentration at a depth of 0.3 μm from the surface of the second dopant injection layer is 1/10 or less of the dopant concentration at the depth of 0.1 μm from the surface of the second dopant injection layer:
(a") applying a second dispersion containing second particles to a second location of the semiconductor layer or substrate, wherein the second particles are essentially composed of the same semiconductor element as the semiconductor layer or substrate and are doped with a dopant of a type that differs from the dopant of the first particles;
(b") drying the applied second dispersion to obtain a second green dopant injection layer, and
(c") irradiating the second green dopant injection layer with light to dope the second location of the semiconductor layer or substrate with a p-type or n-type dopant, and at the same time, to sinter the second green dopant layer and thereby obtain a second dopant injection layer coalesced with the semiconductor layer or substrate.

9. The method according to claim 6, wherein the semiconductor element is silicon, germanium or a combination thereof.

10. The method according to claim 6, wherein applying the first dispersion is carried out by printing or spin coating process.

11. The method according to claim 6, wherein the degree of crystallization of the first particles is 40% or less.

12. The method according to claim 6, wherein the mean primary particle diameter of the first particles is 30 nm or less.

13. The method according to claim 6, wherein the particles have a dopant concentration of $1\times10^2$ atoms/cm$^3$ or more.

14. The method according to claim 6, further comprising forming an electrode on the first dopant injection layer.

15. The method according to claim 6, wherein the semiconductor device is a solar cell or thin film transistor.

16. The semiconductor device according to claim 1, further comprising:
a second dopant injection layer formed by sintering second particles is arranged at a second location of the semiconductor layer or substrate;
wherein the second particles are essentially composed of the same semiconductor element as the semiconductor layer or substrate and are doped with a dopant of a type that differs from the dopant of the first particles;
wherein the second dopant injection layer is coalesced with the semiconductor layer or substrate; and
wherein the crystal orientation of the second dopant injection layer is the same as the crystal orientation of the semiconductor layer or substrate; or a dopant concentration at a depth of 0.1 μm from a surface of the second dopant injection layer is $1\times10^{20}$ atoms/cm$^3$ or more, and a dopant concentration at a depth of 0.3 μm from the surface of the second dopant injection layer is 1/10 or less of the dopant concentration at the depth of 0.1 μm from the surface of the second dopant injection layer.

17. The method according to claim 6,
wherein the method further comprises the following steps (a') to (c'); and
wherein the crystal orientation of a second dopant injection layer is the same as the crystal orientation of the semiconductor layer or substrate; or a dopant concentration at a depth of 0.1 μm from a surface of the second dopant injection layer is $1\times10^{20}$ atoms/cm$^3$ or more, and a dopant concentration at a depth of 0.3 μm from the surface of the second dopant injection layer is 1/10 or less of the dopant concentration at the depth of 0.1 μm from the surface of the second dopant injection layer:
(a') applying a second dispersion containing second particles to a second location of the semiconductor layer or substrate at the same time as step (a), between step (a) and step (b), or between step (b) and step (c), wherein the second particles are essentially composed of the same semiconductor element as the semiconductor layer or substrate and are doped with a dopant of a type that differs from the dopant of the first particles;
(b') drying the applied second dispersion to obtain a second green dopant injection layer at the same time as step (b) or separately from step (b); and
(c') irradiating the second green dopant injection layer with light at the same time as step (c) or separately from step (c) to dope the second location of the semiconductor layer or substrate with a p-type or n-type dopant, and at the same time, to sinter the second green dopant layer and thereby obtain a second dopant injection layer coalesced with the semiconductor layer or substrate.

18. The method according to claim 6,
wherein the method further comprises the following steps (a") to (c") after step (c); and
wherein the crystal orientation of a second dopant injection layer is the same as the crystal orientation of the semiconductor layer or substrate; or a dopant concentration at a depth of 0.1 μm from a surface of the second dopant injection layer is $1\times10^{20}$ atoms/cm$^3$ or more, and a dopant concentration at a depth of 0.3 μm from the surface of the second dopant injection layer is $\frac{1}{10}$ or less of the dopant concentration at the depth of 0.1 μm from the surface of the second dopant injection layer:
(a") applying a second dispersion containing second particles to a second location of the semiconductor layer or substrate, wherein the second particles are essentially composed of the same semiconductor element as the semiconductor layer or substrate and are doped with a dopant of a type that differs from the dopant of the first particles;
(b") drying the applied second dispersion to obtain a second green dopant injection layer, and
(c") irradiating the second green dopant injection layer with light to dope the second location of the semiconductor layer or substrate with a p-type or n-type dopant, and at the same time, to sinter the second green dopant layer and thereby obtain a second dopant injection layer coalesced with the semiconductor layer or substrate.

\* \* \* \* \*